United States Patent
Yamazaki et al.

(10) Patent No.: US 11,211,467 B2
(45) Date of Patent: Dec. 28, 2021

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Tomoki Hiramatsu, Koto (JP); Yusuke Nonaka, Atsugi (JP); Noritaka Ishihara, Koza (JP); Shota Sambonsuge, Matsudo (JP); Yasumasa Yamane, Atsugi (JP); Yuta Endo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/755,208

(22) PCT Filed: Oct. 29, 2018

(86) PCT No.: PCT/IB2018/058425
§ 371 (c)(1),
(2) Date: Apr. 10, 2020

(87) PCT Pub. No.: WO2019/092541
PCT Pub. Date: May 16, 2019

(65) Prior Publication Data
US 2020/0266281 A1 Aug. 20, 2020

(30) Foreign Application Priority Data
Nov. 9, 2017 (JP) .............................. JP2017-216669

(51) Int. Cl.
*H01L 29/51* (2006.01)
*H01L 21/8238* (2006.01)

(52) U.S. Cl.
CPC .... *H01L 29/517* (2013.01); *H01L 21/823857* (2013.01); *H01L 29/511* (2013.01)

(58) Field of Classification Search
CPC .......... H01L 29/517; H01L 21/823857; H01L 29/511
See application file for complete search history.

(56) References Cited

U.S. PATENT DOCUMENTS 8,547,771 B2   10/2013   Koyama
8,956,944 B2   2/2015    Imoto et al.
(Continued)

FOREIGN PATENT DOCUMENTS

JP   2012-257187 A   12/2012
JP   2014-056945 A   3/2014
(Continued)

OTHER PUBLICATIONS

International Search Report (Application No. PCT/IB2018/058425) dated Feb. 12, 2019.
(Continued)

*Primary Examiner* — Douglas W Owens
(74) *Attorney, Agent, or Firm* — Robinson Intellectual Property Law Office; Eric J. Robinson

(57) ABSTRACT

A highly reliable semiconductor device is provided. The semiconductor device includes a first insulator; a first oxide provided over the first insulator; a second oxide provided over the first oxide; a first conductor and a second conductor provided apart from each other over the second oxide; a third oxide provided over the second oxide, the first conductor, and the second conductor; a second insulating film provided over the third oxide; and a third conductor provided over the second oxide with the third oxide and the second insulating
(Continued)

film positioned therebetween. The third oxide contains a metal element and nitrogen, and the metal element is bonded to nitrogen.

7 Claims, 20 Drawing Sheets

(56) References Cited

U.S. PATENT DOCUMENTS

| | | | |
|---|---|---|---|
| 8,957,462 B2 | 2/2015 | Yamazaki et al. | |
| 8,999,773 B2 | 4/2015 | Hanaoka et al. | |
| 9,012,904 B2 | 4/2015 | Imoto et al. | |
| 9,153,436 B2 | 10/2015 | Yamazaki et al. | |
| 9,184,245 B2 | 11/2015 | Yamazaki | |
| 9,276,121 B2 | 3/2016 | Yamazaki | |
| 9,929,276 B2 | 3/2018 | Yamazaki | |
| 10,032,918 B2 | 7/2018 | Yamazaki et al. | |
| 10,096,715 B2 | 10/2018 | Yamazaki et al. | |
| 10,553,690 B2 | 2/2020 | Tanaka et al. | |
| 2004/0188762 A1* | 9/2004 | Shimamoto | H01L 21/28202 257/350 |
| 2011/0032376 A1* | 2/2011 | Takizawa | H01L 27/1463 348/222.1 |
| 2015/0317014 A1 | 11/2015 | Miyake et al. | |
| 2016/0380115 A1 | 12/2016 | Nakano et al. | |
| 2017/0040424 A1* | 2/2017 | Tanaka | H01L 28/60 |
| 2017/0170326 A1* | 6/2017 | Tsubuku | H01L 29/24 |
| 2017/0263651 A1* | 9/2017 | Tochibayashi | H01L 27/1225 |
| 2017/0309752 A1 | 10/2017 | Yamazaki et al. | |
| 2018/0033892 A1* | 2/2018 | Yamane | H01L 29/4908 |
| 2019/0131524 A1* | 5/2019 | Peng | H01L 27/228 |
| 2021/0167211 A1* | 6/2021 | Yamazaki | H01L 29/517 |

FOREIGN PATENT DOCUMENTS

| | | |
|---|---|---|
| JP | 2017-143239 A | 8/2017 |
| JP | 2017-168839 A | 9/2017 |
| JP | 2017-199901 A | 11/2017 |
| TW | 201724513 | 7/2017 |
| TW | 201738978 | 11/2017 |
| WO | WO-2015/151337 | 10/2015 |

OTHER PUBLICATIONS

Written Opinion (Application No. PCT/IB2018/058425) dated Feb. 12, 2019.

* cited by examiner

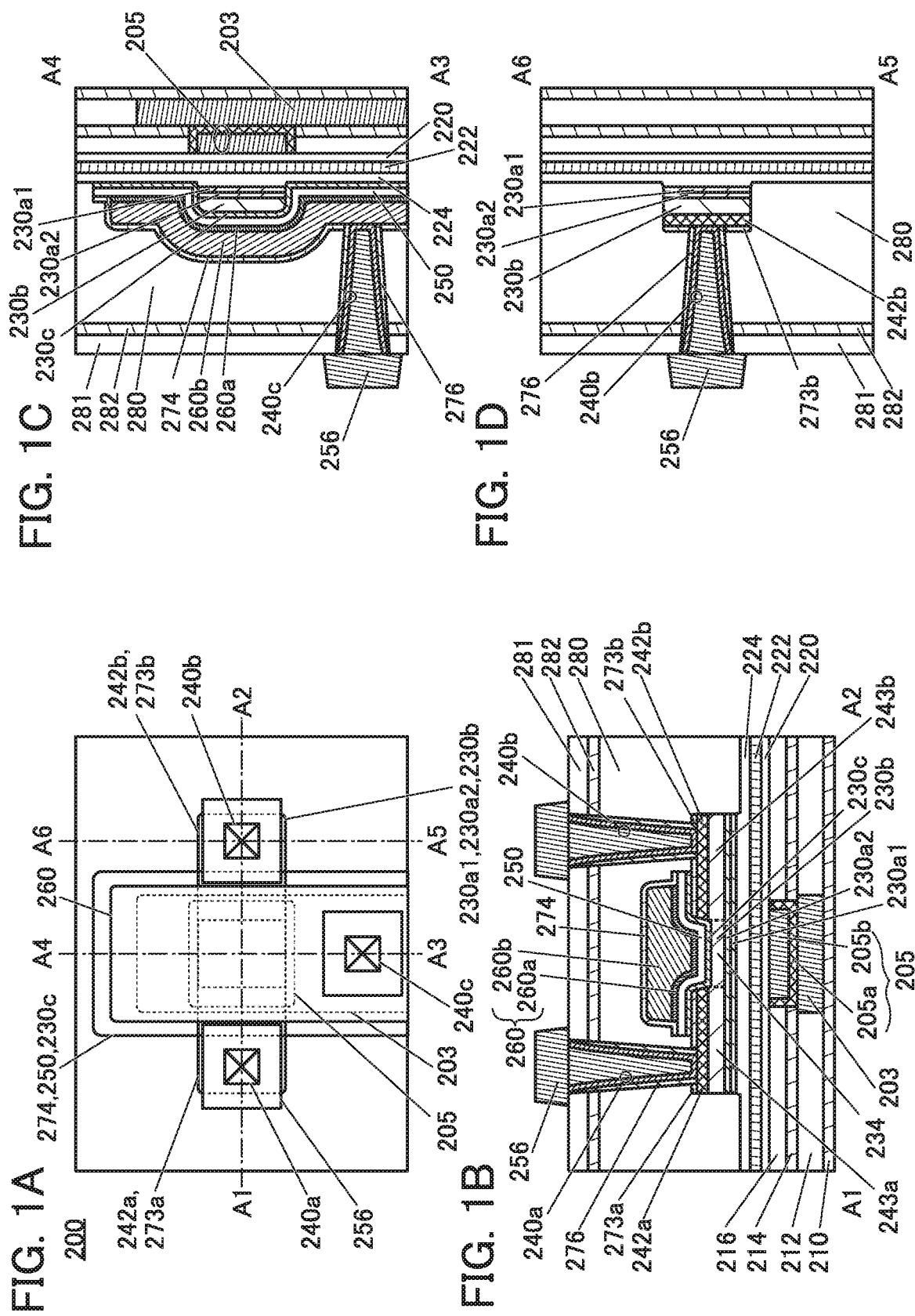

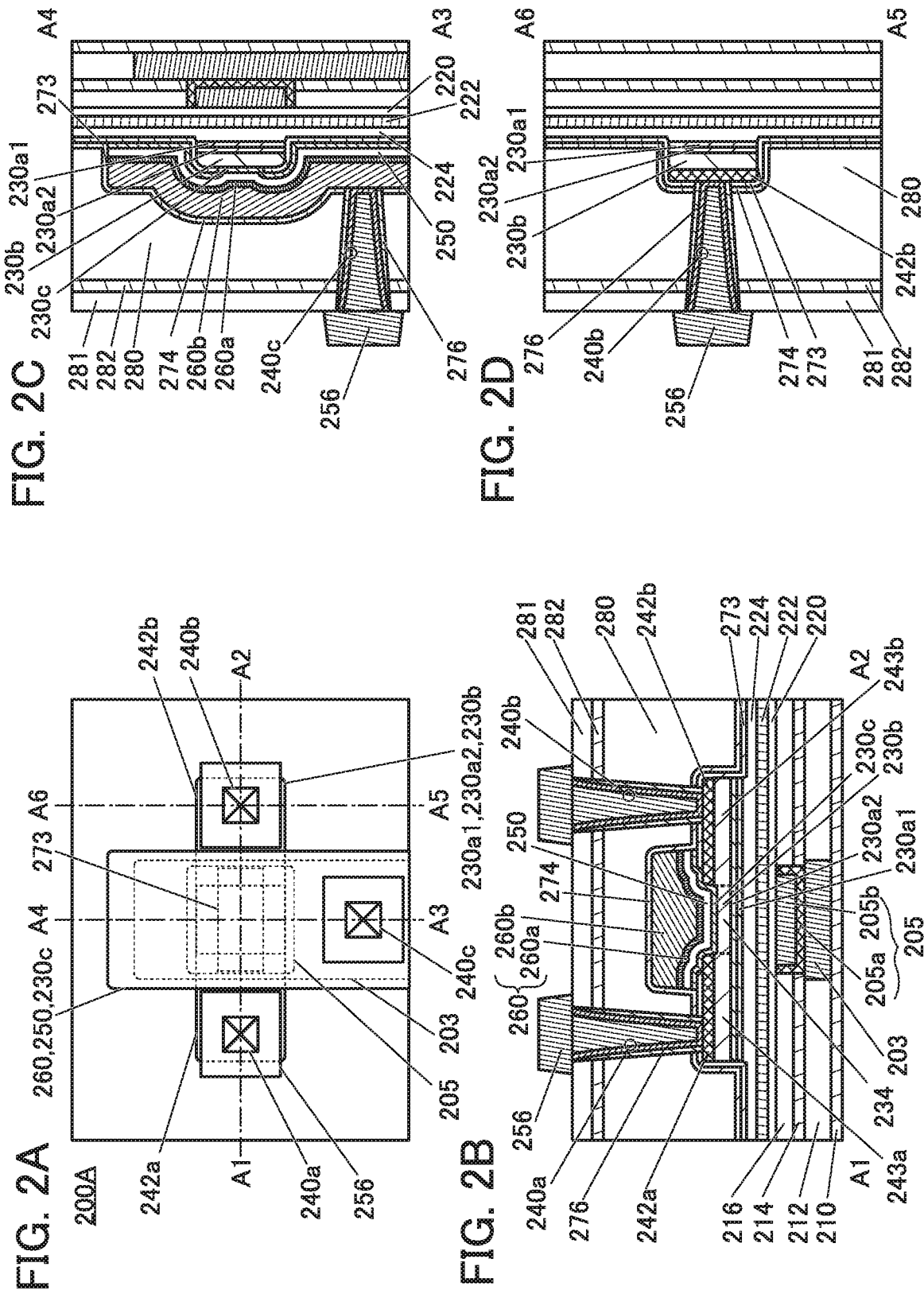

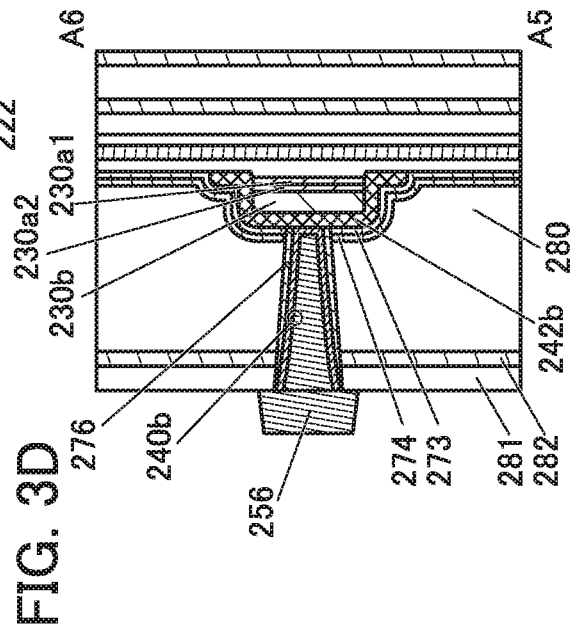
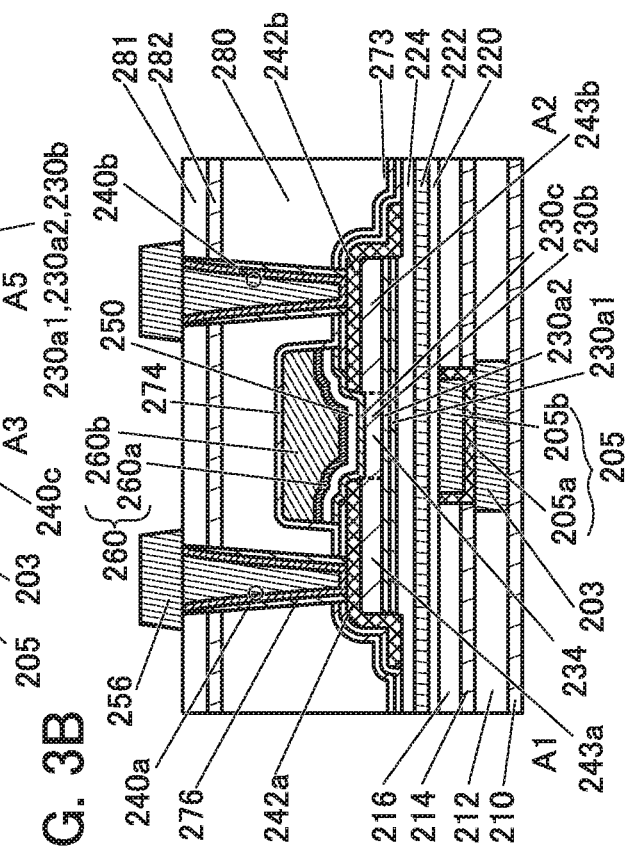

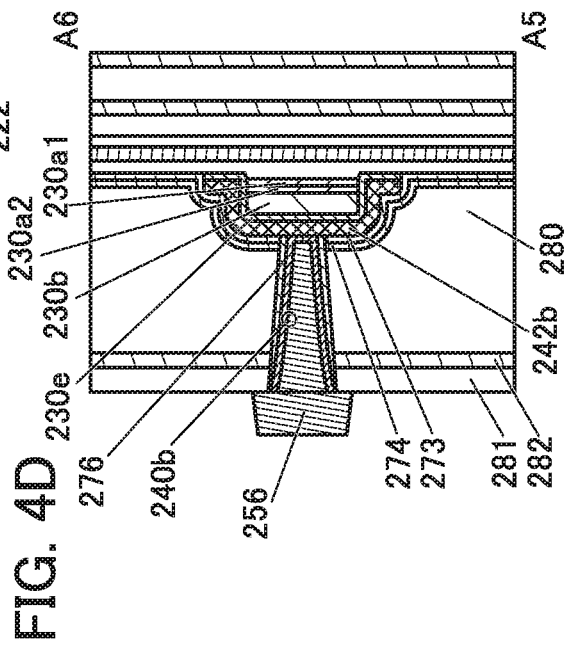
FIG. 4C
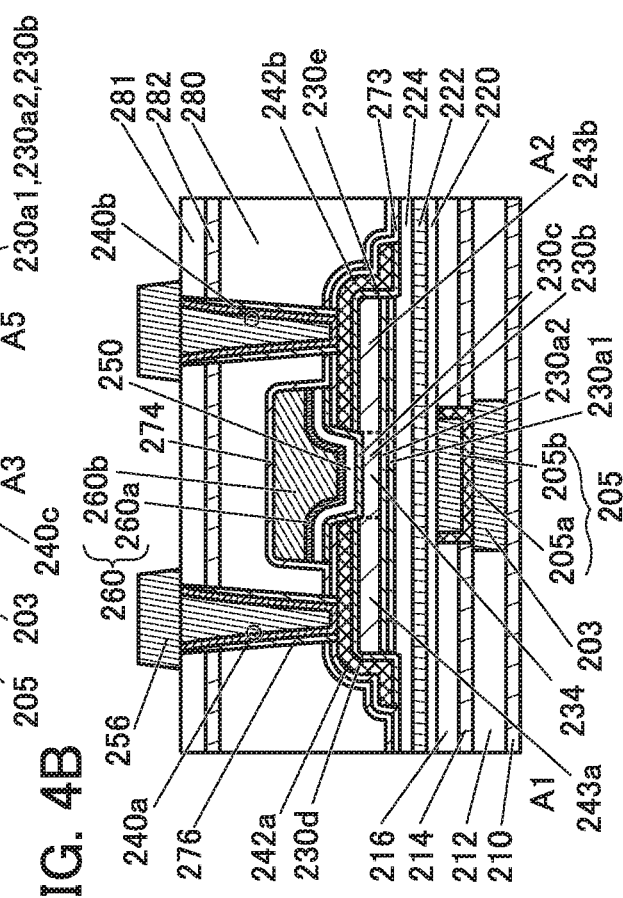
FIG. 4D
FIG. 4A
FIG. 4B

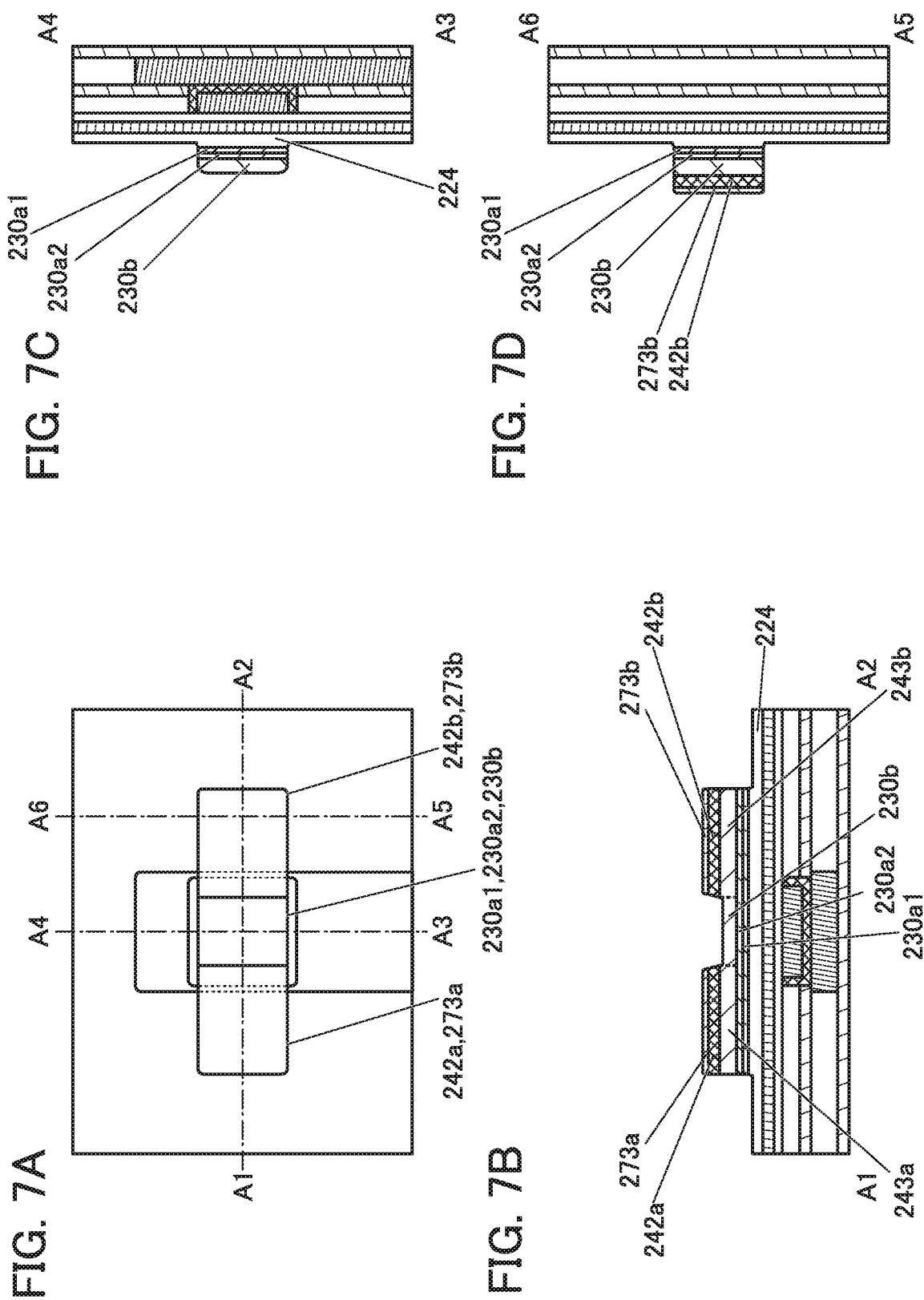

FIG. 15A
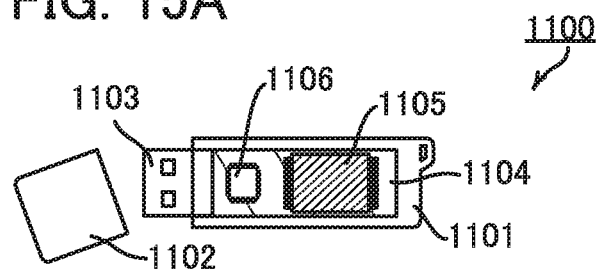
FIG. 15B  FIG. 15C
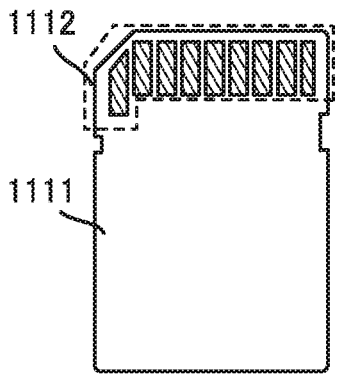 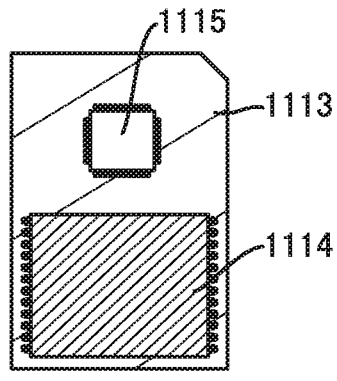
FIG. 15D  FIG. 15E
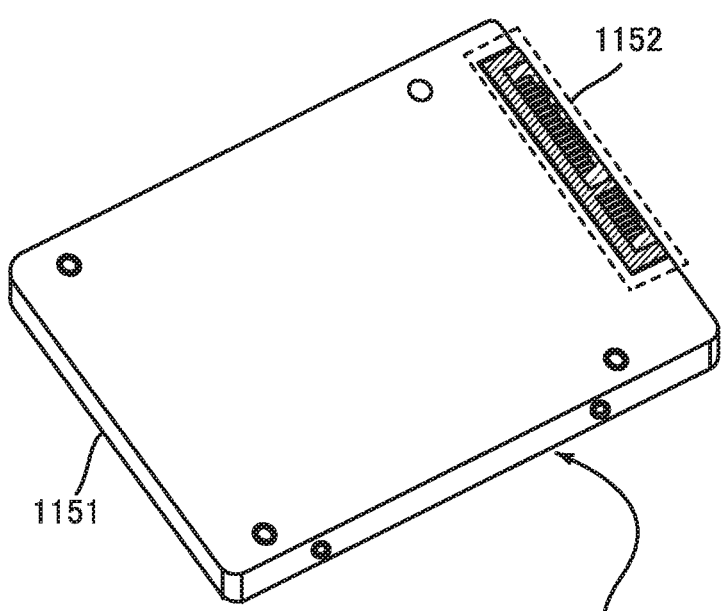 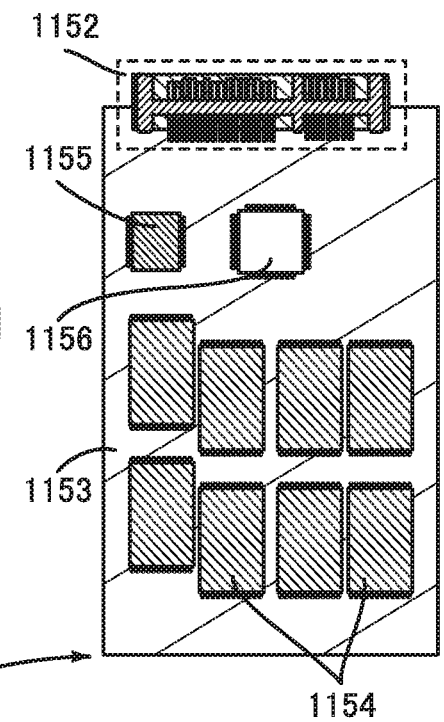

FIG. 16A
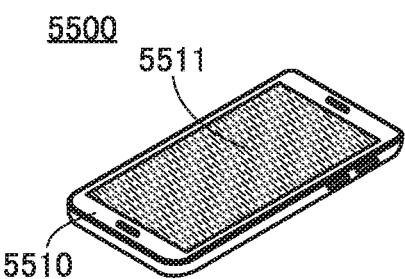
FIG. 16B
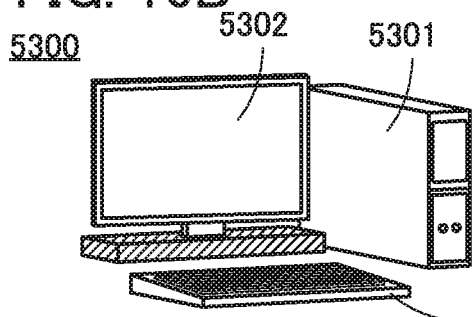
FIG. 16C
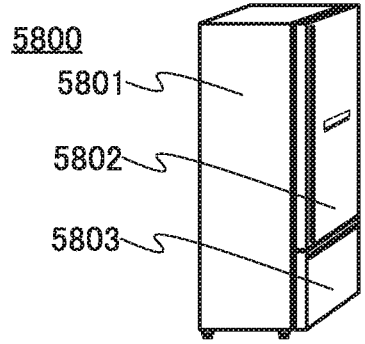
FIG. 16D
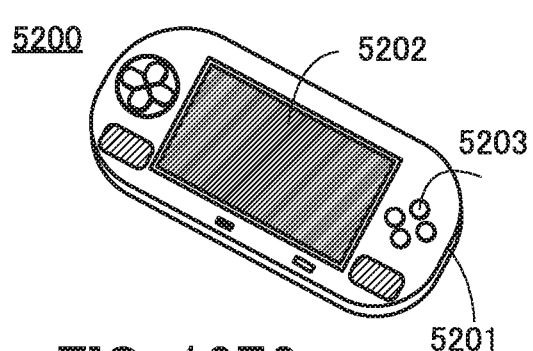
FIG. 16E1
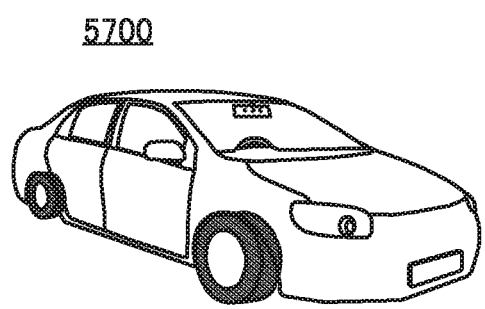
FIG. 16E2
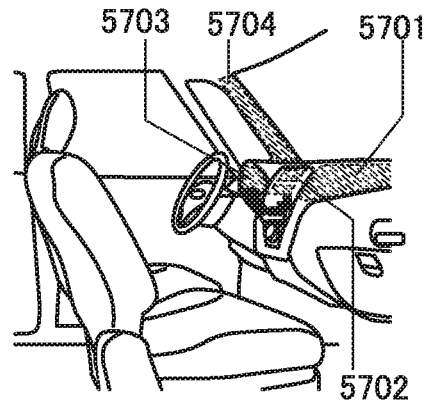
FIG. 16F
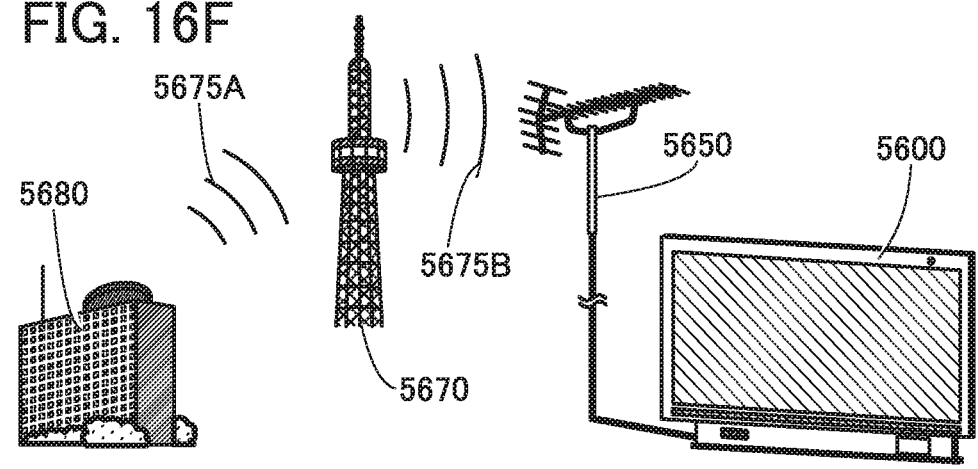

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

In recent years, semiconductor devices have been developed, and LSI, processors such as CPUs (Central Processing Units) and GPU (Graphics Processing Units), and memories have been developed. A processor is an aggregation of semiconductor elements, which includes a semiconductor integrated circuit (at least a transistor and a memory) separated from a semiconductor wafer and an electrode serving as a connection terminal.

A semiconductor circuit (IC chip) of LSI, processors such as CPUs and GPUs, memories, and the like is mounted on a circuit board, for example, a printed wiring board, to be used as one of components of a variety of electronic devices.

A technique of forming a transistor with use of a semiconductor thin film formed over a substrate having an insulating surface has been attracting attention. Such a transistor is widely used in electronic devices such as an integrated circuit (IC) and an image display device (also simply referred to as a display device). A silicon-based semiconductor material is widely known as a semiconductor thin film that can be used in the transistor; in addition, an oxide semiconductor has been attracting attention as another material.

It is known that a transistor using an oxide semiconductor has an extremely low leakage current in a non-conduction state. For example, a low-power-consumption CPU utilizing a feature of a low leakage current of the transistor using an oxide semiconductor is disclosed (see Patent Document 1).

In recent years, demand for an integrated circuit in which transistors and the like are integrated with high density has risen with reductions in size and weight of electronic devices. Furthermore, improvement in the productivity of a semiconductor device including an integrated circuit has been required.

REFERENCE

Patent Document

[Patent Document 1] Japanese Published Patent Application No. 2012-257187

SUMMARY OF THE INVENTION

Problems to be Solved by the Invention

An object of one embodiment of the present invention is to provide a semiconductor device with low power consumption. An object of one embodiment of the present invention is to provide a highly reliable semiconductor device. An object of one embodiment of the present invention is to provide a semiconductor device with favorable electrical characteristics. An object of one embodiment of the present invention is to provide a semiconductor device that can retain data for a long time.

An object of one embodiment of the present invention is to provide a semiconductor device capable of high-speed data writing. An object of one embodiment of the present invention is to provide a semiconductor device with high design flexibility. An object of one embodiment of the present invention is to provide a semiconductor device that can be miniaturized or highly integrated. An object of one embodiment of the present invention is to provide a novel semiconductor device. An object of one embodiment of the present invention is to provide a semiconductor device with high productivity.

Note that the description of these objects does not disturb the existence of other objects. One embodiment of the present invention does not necessarily achieve all of these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a semiconductor layer that includes a channel formation region, and a layer that is provided in contact with the semiconductor layer and holds a fixed charge. The threshold value of the semiconductor device is controlled by the layer that holds a fixed charge.

The semiconductor layer preferably contains an oxide.

One embodiment of the present invention is a semiconductor device including a first insulator; a first oxide provided over the first insulator; a second oxide provided over the first oxide; a first conductor and a second conductor provided apart from each other over the second oxide; a third oxide provided over the second oxide, the first conductor, and the second conductor; a second insulating film provided over the third oxide; and a third conductor provided over the second oxide with the third oxide and the second insulating film positioned therebetween. The third oxide contains a metal element and nitrogen, and the metal element is bonded to nitrogen.

In the above embodiment, the third oxide is preferably a layer that holds a fixed charge.

In the above embodiment, the percentage of the number of nitrogen atoms in the third oxide is preferably lower than 0.1 atomic %.

One embodiment of the present invention is a semiconductor device including a first insulator; a first oxide provided over the first insulator; a second oxide provided over the first oxide; a first conductor and a second conductor provided apart from each other over the second oxide; a third oxide provided over the second oxide, the first conductor, and the second conductor; a second insulating film provided over the third oxide; and a third conductor provided over the second oxide with the third oxide and the second insulating film positioned therebetween. The first oxide includes a first layer and a second layer, the second layer contains a metal element and nitrogen, and the metal element is bonded to nitrogen.

In the above embodiment, the second layer is preferably the layer that holds a fixed charge.

In the above embodiment, the percentage of the number of nitrogen atoms in the second layer is preferably lower than 0.1 atomic %.

In the above embodiment, it is preferable that the first layer have a higher oxygen concentration than the second layer and the second layer have a higher nitrogen concentration than the first layer.

In the above embodiment, the first oxide, the second oxide, and the third oxide preferably contain In, an element M (M is Al, Ga, Y, or Sn), and Zn.

In the above embodiment, the metal element is preferably one selected from In, an element M (M is Al, Ga, Y, or Sn), and Zn.

In the above embodiment, the first conductor and the second conductor preferably contain ruthenium.

Effect of the Invention

According to one embodiment of the present invention, a semiconductor device with low power consumption can be provided. According to one embodiment of the present invention, a highly reliable semiconductor device can be provided. According to one embodiment of the present invention, a semiconductor device with favorable electrical characteristics can be provided. According to one embodiment of the present invention, a semiconductor device that can retain data for a long time can be provided.

According to one embodiment of the present invention, a semiconductor device capable of high-speed data writing can be provided. According to one embodiment of the present invention, a semiconductor device with high design flexibility can be provided. According to one embodiment of the present invention, a semiconductor device that can be miniaturized or highly integrated can be provided. According to one embodiment of the present invention, a novel semiconductor device can be provided. According to one embodiment of the present invention, a semiconductor device with high productivity can be provided.

Note that the description of these effects does not disturb the existence of other effects. One embodiment of the present invention does not necessarily have all of these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIGS. 1A-1D A top view and cross-sectional views of a semiconductor device of one embodiment of the present invention.

FIGS. 2A-2D A top view and cross-sectional views of a semiconductor device of one embodiment of the present invention.

FIGS. 3A-3D A top view and cross-sectional views of a semiconductor device of one embodiment of the present invention.

FIGS. 4A-4D A top view and cross-sectional views of a semiconductor device of one embodiment of the present invention.

FIGS. 7A-7D A top view and cross-sectional views showing a method for manufacturing a semiconductor device of one embodiment of the present invention.

FIGS. 15A-15E Schematic views of memory devices of one embodiment of the present invention.

FIGS. 16A-16F Diagrams showing electronic devices of one embodiment of the present invention.

MODE FOR CARRYING OUT THE INVENTION

Figure 5A:
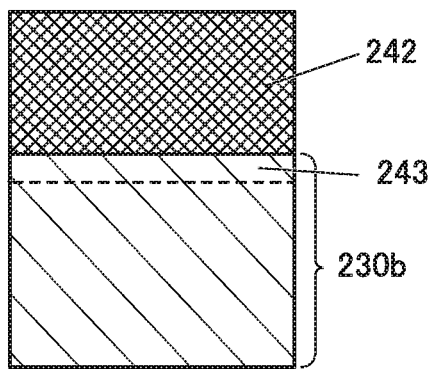
FIGS. 5A-5D Cross-sectional views of a semiconductor device of one embodiment of the present invention.

Hereinafter, embodiments will be described with reference to the drawings. Note that embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes, values, or the like shown in the drawings. For example, in the actual manufacturing process, a layer, a resist mask, or the like might be unintentionally reduced in size by treatment such as etching, which might not be reflected in the drawings for easy understanding. In the drawings, the same reference numerals are used for the same portions or portions having similar functions in different drawings, and repeated description thereof is omitted in some cases. Furthermore, the same hatch pattern is used for the portions having similar functions, and the portions are not especially denoted by reference numerals in some cases.

In particular, in a top view (also referred to as a "plan view"), a perspective view, or the like, the description of some components might be omitted for easy understanding of the invention. In addition, the description of some hidden lines and the like might be omitted.

In this specification and the like, the ordinal numbers such as first and second are used for convenience and do not denote the order of steps or the stacking order of layers. Therefore, for example, description can be made when "first" is replaced with "second", "third", or the like as appropriate. In addition, the ordinal numbers in this specification and the like are not necessarily the same as the ordinal numbers used to specify one embodiment of the present invention.

In this specification and the like, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

The atomic ratio of elements included in an oxide, a metal oxide, a compound, or the like described in this specification includes the vicinity of the atomic ratio in some cases, unless otherwise specified. Here, the vicinity of the atomic ratio includes 50% or more and 150% or less of the proportion of each atom. For example, in the case of the atomic ratio of [A]:[B]=2:1, the vicinity of [A] includes 1 or more and 3 or less, and the vicinity of [B] includes 0.5 or more and 1.5 or less. The vicinity of the atomic ratio also includes 80% or more and 120% or less of the proportion of each atom. For example, in the case of the atomic ratio of [A]:[B]=2:1, the vicinity of [A] includes 1.6 or more and 2.4 or less, and the vicinity of [B] includes 0.8 or more and 1.2 or less. The vicinity of the atomic ratio also includes 90% or more and 110% or less of the proportion of each atom. For example, in the case of the atomic ratio of [A]:[B]=2:1, the vicinity of [A] includes 1.8 or more and 2.2 or less, and the vicinity of [B] includes 0.9 or more and 1.1 or less.

Furthermore, functions of a source and a drain might be switched when a transistor of opposite polarity is employed or a direction of current is changed in circuit operation, for example. Therefore, the terms "source" and "drain" can sometimes be used interchangeably in this specification and the like.

Note that in this specification and the like, depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

Furthermore, in this specification, the simple term "channel width" refers to an apparent channel width in some cases. Alternatively, in this specification, the simple term "channel width" refers to an effective channel width in some cases. Note that the values of a channel length, a channel width, an effective channel width, an apparent channel width, and the like can be determined, for example, by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. In addition, in the case of an oxide semiconductor, oxygen vacancies are formed by entry of impurities, for example. Furthermore, when the semiconductor is silicon, examples of an impurity which changes characteristics of the semiconductor include oxygen, Group 1 elements except hydrogen, Group 2 elements, Group 13 elements, and Group 15 elements.

In this specification and the like, silicon oxynitride is a substance in which oxygen content is higher than nitrogen content in its composition. Moreover, silicon nitride oxide is a substance in which nitrogen content is higher than oxygen content in its composition.

In this specification and the like, "parallel" indicates a state where two straight lines are placed at an angle of greater than or equal to $-10°$ and less than or equal to $10°$. Thus, the case where the angle is greater than or equal to $-5°$ and less than or equal to $5°$ is also included. Furthermore, "substantially parallel" indicates a state where two straight lines are placed at an angle of greater than or equal to $-30°$ and less than or equal to 30°. Moreover, "perpendicular" indicates a state where two straight lines are placed at an angle of greater than or equal to 80° and less than or equal to 100°. Thus, the case where the angle is greater than or equal to 85° and less than or equal to 95° is also included. In addition, "substantially perpendicular" indicates a state where two straight lines are placed at an angle of greater than or equal to 60° and less than or equal to 120°.

Note that in this specification, a barrier film means a film having a function of inhibiting the passage of oxygen and impurities such as hydrogen, and the barrier film having conductivity is referred to as a conductive barrier film in some cases.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that current per micrometer of channel width flowing through a transistor when a potential is not applied to a gate or a ground potential is applied to the gate is $1 \times 10^{-20}$ A or lower at room temperature, $1 \times 10^{-18}$ A or lower at 85° C., or $1 \times 10^{-16}$ A or lower at 125° C.

Embodiment 1

An example of a semiconductor device including a transistor 200 of one embodiment of the present invention is described below.

<Structure Example of Semiconductor Device>

FIG. 1(A), FIG. 1(B), FIG. 1(C), and FIG. 1(D) are a top view and cross-sectional views of the transistor 200 of one embodiment of the present invention and the periphery of the transistor 200.

FIG. 1(A) is a top view of the semiconductor device including the transistor 200. FIG. 1(B), FIG. 1(C), and FIG. 1(D) are cross-sectional views of the semiconductor device. Here, FIG. 1(B) is a cross-sectional view of a portion indicated by the dashed-dotted line A1-A2 in FIG. 1(A), and is also a cross-sectional view in the channel length direction of the transistor 200. FIG. 1(C) is a cross-sectional view of a portion indicated by the dashed-dotted line A3-A4 in FIG. 1(A), and is also a cross-sectional view in the channel width direction of the transistor 200. FIG. 1(D) is a cross-sectional view of a portion indicated by the dashed-dotted line A5-A6 in FIG. 1(A), and is also a cross-sectional view in the channel width direction of the transistor 200. Note that for simplification of the drawing, some components are not illustrated in the top view in FIG. 1(A).

The semiconductor device of one embodiment of the present invention includes the transistor 200, and an insulator 210, an insulator 212, and an insulator 281 that function as interlayer films. The semiconductor device also includes a conductor 203 and a conductor 256 each functioning as a wiring and a conductor 240 (a conductor 240a, a conductor 240b, and a conductor 240c) functioning as a plug, which are electrically connected to the transistor 200.

The conductor 203 is formed in contact with an inner wall of an opening of the insulator 212. Here, the top surface of the conductor 203 and the top surface of the insulator 212 can be substantially level with each other. Although the transistor 200 has a structure in which the conductor 203 has a single-layer structure, the present invention is not limited thereto. The conductor 203 may have a stacked-layer structure of two or more layers, for example. In the case where a component has a stacked-layer structure, the layers may be distinguished by ordinal numbers corresponding to the formation order.

In the conductor 240, a first conductor of the conductor 240 is formed in contact with an inner wall of an opening of an insulator 273, an insulator 280, an insulator 282, and the insulator 281 and the inside of an opening of an insulator 274, the insulator 280, the insulator 282, and the insulator 281, and a second conductor of the conductor 240 is formed on the inner side. Here, the top surface of the conductor 240 and the top surface of the insulator 281 can be substantially level with each other. Although the transistor 200 has a structure in which the first conductor of the conductor 240 and the second conductor of the conductor 240 are stacked, the present invention is not limited thereto. The conductor 240 may be a single layer or have a stacked-layer structure of three or more layers, for example. When a component has a stacked-layer structure, the layers may be distinguished by ordinal numbers corresponding to the formation order. An insulating barrier or a conductive barrier that inhibits the passage of oxygen, impurities such as hydrogen and water, and the like is preferably provided between the conductor 240 and the inner wall of the opening of the insulator 280, the insulator 282, and the insulator 281. In this embodiment, an example in which an insulator 276 is provided as an insulating barrier is described. The insulator 276 is provided at least on parts of the side surface of the insulator 280 and the side surface of the insulator 282, and preferably inhibits diffusion of oxygen, impurities such as hydrogen and water, and the like contained in the insulator 280 into the conductor 240.

Although the transistor 200 has a structure in which the conductor 256 has a single-layer structure, the present invention is not limited thereto. The conductor 203 may have a stacked-layer structure of two or more layers, for example. When a component has a stacked-layer structure, the layers may be distinguished by ordinal numbers corresponding to the formation order.

[Transistor 200]

As shown in FIG. 1, the transistor 200 includes an insulator 222 provided over a substrate (not illustrated); an insulator 224 provided over the insulator 222; an oxide 230 (an oxide 230a1 and an oxide 230a2) and an oxide 230b that are provided over the insulator 224; a conductor 242a and a conductor 242b provided apart from each other over the oxide 230b; an insulator 273a and an insulator 273b provided over the conductor 242a and the conductor 242b, respectively; an oxide 230c provided over the oxide 230, the conductor 242a, the conductor 242b, the insulator 273a, and the insulator 273b; an insulator 250 provided over the oxide 230c; a conductor 260 which is provided over the insulator 250 and at least part of which overlaps with a region between the conductor 242a and the conductor 242b; the insulator 274 that is provided over the insulator 250 and covers the conductor 260; the insulator 280 provided over the insulator 274; and the insulator 282 provided over the insulator 280.

Here, it is preferable that the insulator 222, the insulator 273, and the insulator 274 have a function of inhibiting diffusion of oxygen (e.g., at least one of oxygen atoms, oxygen molecules, and the like) (or that the above oxygen be less likely to pass through these insulators). For example, the insulator 222, the insulator 273, and the insulator 274 preferably have a lower oxygen permeability than the insulator 224 or the insulator 280.

At least one of the oxide 230a1, the oxide 230a2, the oxide 230b, and the oxide 230c is preferably an oxide containing nitrogen. For example, one or both of the oxide 230a2 and the oxide 230c that are in contact with the oxide 230b are preferably the oxide containing nitrogen.

When the oxide containing nitrogen is used as the oxide 230a2, the oxide 230a1 is preferably an oxide that does not contain nitrogen, an oxide that contains a smaller amount of nitrogen than the oxide 230a2, or an oxide that contains a larger amount of oxygen than the oxide 230a2. The oxide 230a1 is preferably capable of supplying oxygen to the insulator 224 at the time of or after the formation of the oxide 230a1. For example, the formation of the oxide 230a1 in an oxygen-containing atmosphere makes it possible to supply oxygen to the insulator 224 or to form an oxide containing a large amount of oxygen at the time of the formation of the oxide 230a1. With the use of an oxide containing a large amount of oxygen as the oxide 230a1, oxygen can be released to the insulator 224 by heat treatment.

The transistor 200 has, in a region where a channel is formed (hereinafter, also referred to as a channel formation region) and its vicinity, a structure in which three layers of the oxide 230a, the oxide 230b, and the oxide 230c are stacked; however, the present invention is not limited thereto. For example, it is possible to employ a single layer of the oxide 230b, a two-layer structure of the oxide 230b and the oxide 230a, a two-layer structure of the oxide 230b and the oxide 230c, or a stacked-layer structure of four or more layers. Although an example in which the oxide 230a includes two layers of the oxide 230a1 and the oxide 230a2 is described, the present invention is not limited thereto. The oxide 230a may have a single-layer structure or a stacked-layer structure of three or more layers, for example. Furthermore, although the conductor 260 has a stacked-layer structure of two layers in the transistor 200, the present invention is not limited thereto. The conductor 260 may have a single-layer structure or a stacked-layer structure of three or more layers, for example.

The oxide containing nitrogen functions as a layer that holds a fixed charge. The oxide containing nitrogen is formed by substitution of part of oxygen contained in the oxide with nitrogen or entry of nitrogen into oxygen vacancies (sometimes referred to as Vo) in the oxide at the time of or after the formation of the oxide. The results of first-principles calculations indicate that this structure forms states in the mid gap and its vicinity. When the states are formed in the mid gap and its vicinity, a negative charge exists in the oxide containing nitrogen at the same time; thus, the charge is fixed in the oxide containing nitrogen. That is, the oxide containing nitrogen holds a negative fixed charge.

The threshold value of a transistor in which the oxide that holds a negative fixed charge and contains nitrogen is provided in contact with an oxide including a channel formation region shifts in the positive direction as compared with a transistor in which the oxide containing nitrogen is not provided. This is probably because the channel formation region is affected by the electric field caused by the fixed charge.

Note that entry of nitrogen (N) into oxygen vacancies (Vo) in the oxide is sometimes referred to as formation of VoN.

The number of negative fixed charges increases with an increase in VoN in the oxide containing nitrogen. That is, the fixed charge density increases with an increase in the VoN density in the oxide containing nitrogen. The fixed charge density in the oxide containing nitrogen is preferably higher than or equal to $2.0 \times 10^{-17}$ atoms/cm$^3$ and lower than or equal to $1.0 \times 10^{+19}$ atoms/cm$^3$, further preferably higher than or equal to $1.0 \times 10^{+18}$ atoms/cm$^3$ and lower than or equal to $1.0 \times 10^{+19}$ atoms/cm$^3$. The threshold value of the transistor shifts in the positive direction with an increase in the negative fixed charge density in the oxide containing nitrogen.

The threshold value of a transistor can also be controlled by application of a potential to a second gate functioning as a back gate. However, a potential applied to the second gate to control the threshold value of the transistor to be the desired value increases the power consumption of a semiconductor device or an electronic device that includes the transistor. As described in this embodiment, the oxide containing nitrogen is preferably provided in contact with the oxide including the channel formation region, in which case the absolute value of the potential applied to the second gate can be small. Alternatively, the case where a transistor with a desired threshold value can be obtained by provision of the oxide containing nitrogen in contact with the oxide including the channel formation region is preferable because the application of the potential to the second gate or the second gate itself is not necessary. Accordingly, a transistor, a semiconductor device, and an electronic device each with reduced power consumption can be obtained.

In the case where the application of the potential to the second gate might degrade a transistor, it is preferable that the oxide containing nitrogen be provided in contact with the oxide including the channel formation region and the potential applied to the second gate be lowered, in which case the degradation of the transistor can be reduced or the degree of the degradation can be lowered. Accordingly, a transistor, a semiconductor device, and an electronic device each have improved reliability can be obtained.

Here, the conductor 260 functions as a gate electrode of the transistor, and the conductor 242a and the conductor 242b function as a source electrode and a drain electrode. The conductor 260 preferably includes a region overlapping with the conductor 242a with the insulator 250 positioned therebetween and a region overlapping with the conductor 242b with the insulator 250 positioned therebetween. When the conductor 260 has such a shape, the conductor 260 can have a margin for alignment; thus, the conductor 260 can surely overlap with the region of the oxide 230 between the conductor 242a and the conductor 242b.

As shown in FIG. 1, the conductor 260 preferably includes a conductor 260a and a conductor 260b provided over the conductor 260a. In this specification, the conductor 242a and the conductor 242b are sometimes collectively referred to as a conductor 242.

The transistor 200 preferably further includes an insulator 214 provided over the substrate (not illustrated), an insulator 216 provided over the insulator 214, a conductor 205 provided to be embedded in the insulator 214 and the insulator 216, and an insulator 220 provided over the insulator 216 and the conductor 205. Furthermore, the insulator 222 is preferably provided over the insulator 220.

In the transistor 200, a metal oxide functioning as an oxide semiconductor (hereinafter, also referred to as an oxide semiconductor) is preferably used as the oxide 230 (the oxide 230a, the oxide 230b, and the oxide 230c) including a channel formation region.

The transistor 200 using an oxide semiconductor in a channel formation region has an extremely low leakage current in a non-conduction state; thus, a semiconductor device with low power consumption can be provided. An oxide semiconductor can be deposited by a sputtering method or the like and thus can be used for the transistor 200 included in a highly integrated semiconductor device.

For example, as the oxide 230, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. An In—Ga oxide or an In—Zn oxide may also be used as the oxide 230. A metal oxide containing nitrogen can also be used as the oxide 230. The use of the metal oxide containing nitrogen as part of the oxide 230 enables the threshold value of a transistor to be shifted in the positive direction, thereby inhibiting the transistor from having normally-on characteristics.

In the case where the oxide 230 contains nitrogen, the nitrogen concentration is preferably higher than or equal to $2.0 \times 10^{+17}$ atoms/cm$^3$ and lower than or equal to $1 \times 10^{22}$ atoms/cm$^3$, further preferably higher than or equal to $1 \times 10^{18}$ atoms/cm$^3$ and lower than or equal to $4 \times 10^{21}$ atoms/cm$^3$, still further preferably higher than or equal to $1 \times 10^{19}$ atoms/cm$^3$ and lower than or equal to $2 \times 10^{21}$ atoms/cm$^3$, yet still further preferably higher than or equal to $2 \times 10^{19}$ atoms/cm$^3$ and lower than $1 \times 10^{20}$ atoms/cm$^3$.

Alternatively, the percentage of the number of nitrogen atoms in the oxide 230 is preferably higher than or equal to 0.001 atomic % and lower than or equal to 10 atomic %, further preferably higher than or equal to 0.005 atomic % and lower than or equal to 5 atomic %, still further preferably higher than or equal to 0.01 atomic % and lower than or equal to 3 atomic %, yet still further preferably higher than or equal to 0.02 atomic % and lower than 0.1 atomic %. In this specification and the like, the percentage of the number of nitrogen atoms (atomic %) refers to the percentage of the number of nitrogen atoms in the total number of atoms of indium, the element M, zinc, oxygen, and nitrogen. In this specification and the like, the percentage of the number of nitrogen atoms is sometimes referred to as the nitrogen concentration.

The percentage of the number of nitrogen atoms (atomic %) can be calculated from the nitrogen concentration (atoms/cm$^3$) and the composition and the density (g/cm$^3$) of a metal oxide layer. The density of a metal oxide layer can be measured by X-ray reflectivity (XRR).

When the nitrogen concentration or the percentage of the number of nitrogen atoms in the oxide 230 is within any of the above ranges, the oxide 230 functions as the layer that holds a fixed charge, and a transistor having normally-off electrical characteristics and a high on-state current can be obtained. Accordingly, a transistor, a semiconductor device, and an electronic device each with reduced power consumption can be obtained.

In this specification and the like, for example, the expression "the nitrogen concentration of A is higher than that of B" means that the nitrogen concentration (atoms/cm$^3$) or the percentage of the number of nitrogen atoms (atomic %) of A is higher than that of B.

Here, when the oxide 230 contains impurities such as hydrogen, nitrogen, and a metal element, the carrier density may increase and the resistance may be lowered. Furthermore, when the oxygen concentration of the oxide 230 decreases, the carrier density may increase and the resistance may be lowered.

When the conductor 242 (the conductor 242a and the conductor 242b) that is provided on and in contact with the oxide 230 and functions as the source electrode and the drain electrode has a function of absorbing oxygen in the oxide 230 or has a function of supplying impurities such as hydrogen, nitrogen, and a metal element to the oxide 230, a low-resistance region is partly formed in the oxide 230 in some cases.

Here, as shown in FIG. 1(B), the conductor 242 is provided on and in contact with the oxide 230b, and a region 243 (a region 243a and a region 243b) is formed as a low-resistance region at and near the interface of the oxide 230b with the conductor 242. The region 243a functions as one of a source region and a drain region, and the region 243b functions as the other of the source region and the drain region. A region 234 functioning as a channel formation region is provided between the region 243a and the region 243b.

The region 243 functioning as the source region or the drain region has an increased carrier concentration and lowered resistance because it has a low oxygen concentration or contains impurities such as hydrogen, nitrogen, and a metal element. In other words, the region 243 has higher carrier density and lower resistance than the region 234. The region 234 functioning as the channel formation region is a high-resistance region with a low carrier density because it has a higher oxygen concentration or a lower impurity concentration than the region 243.

A transistor using an oxide semiconductor is likely to have its electrical characteristics changed by impurities and oxygen vacancies in a channel formation region of the oxide semiconductor, which may affect the reliability. Moreover, when the channel formation region of the oxide semiconductor includes oxygen vacancies, the transistor tends to have normally-on characteristics. Thus, oxygen vacancies in the region 234 where a channel is formed are preferably reduced as much as possible.

In order to inhibit a transistor from being normally on, an insulator including a region containing oxygen that is released by heating is provided in contact with the oxide 230, and oxygen contained in the insulator is diffused into the oxide 230 by heat treatment. For example, oxygen is added to the insulator 280, and oxygen contained in the insulator 280 is diffused by heat treatment. This supplies oxygen to the oxide 230 and the oxygen can reduce oxygen vacancies in the oxide 230; thus, the transistor can be inhibited from being normally on.

When the region 243, which is a low-resistance region, contains a metal element, the region 243 preferably contains, in addition to the oxide 230, one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like.

Figure 5B:
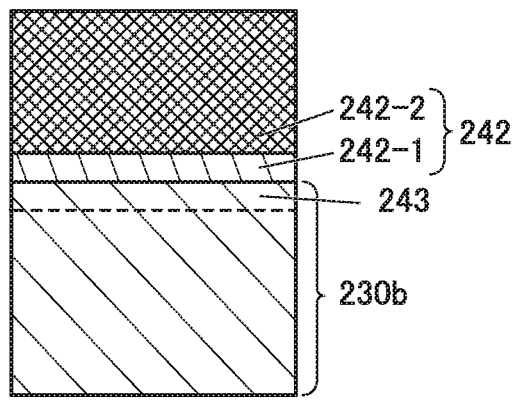

Although the thickness of the region 243 is substantially the same as the thickness of the oxide 230b in FIG. 1(B), the present invention is not limited thereto. For example, the region 243 may be formed in the vicinity of the interface of the oxide 230b with the conductor 242 in the thickness direction of the oxide 230b as shown in FIG. 5(A), or may be formed also in the oxide 230a. FIG. 5(B) shows an example in which the conductor 242 has a stacked-layer structure. The conductor 242 includes a conductor 242-1 in contact with the oxide 230b and a conductor 242-2 over the conductor 242-1. When the conductor 242-1 absorbs oxygen contained in the oxide 230b, the region 243 functioning as a low-resistance region is formed in the oxide 230b. Note that the region 243 is sometimes referred to as a junction layer or an N-type junction layer.

In the oxide 230, the boundaries between the regions are difficult to clearly observe in some cases. The concentration of a metal element and an impurity element such as hydrogen and nitrogen, which is detected in each region, may be not only gradually changed between the regions, but also continuously changed (also referred to as gradation) in each region. That is, the region closer to the channel formation region has a lower concentration of a metal element and an impurity element such as hydrogen and nitrogen.

To selectively reduce the resistance of the oxide 230, the conductor 242 is preferably formed using, for example, a material containing at least one of impurities and metal elements that increase conductivity, such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum. Alternatively, the conductor 242 is formed using a material, a deposition method, or the like that injects impurities such as an element that forms oxygen vacancies and an element trapped by oxygen vacancies into the oxide 230. Examples of the elements include hydrogen, boron, carbon, nitrogen, fluorine, phosphorus, sulfur, chlorine, and a rare gas. Typical examples of the rare gas include helium, neon, argon, krypton, and xenon.

The conductor 242-1 can be formed using a material containing at least one of aluminum, titanium, silicon, tantalum, tungsten, and a compound containing any of them, and the conductor 242-2 can be formed using ruthenium or ruthenium containing aluminum, for example.

An oxide semiconductor can be deposited by a sputtering method or the like and thus can be used for a transistor included in a highly integrated semiconductor device. The transistor using an oxide semiconductor in a channel formation region has an extremely low leakage current (off-state current) in a non-conduction state; thus, a semiconductor device with low power consumption can be provided.

Accordingly, a semiconductor device including a transistor with a high on-state current can be provided. Alternatively, a semiconductor device including a transistor with a low off-state current can be provided. Alternatively, a semiconductor device that has small variation in electrical characteristics, stable electrical characteristics, and improved reliability can be provided.

The structure of the semiconductor device including the transistor 200 of one embodiment of the present invention is described in detail below.

The conductor 203 extends in the channel width direction as shown in FIG. 1(A) and FIG. 1(C) and functions as a wiring that applies a potential to the conductor 205. The conductor 203 is preferably provided to be embedded in the insulator 212.

The conductor 205 is provided to overlap with the oxide 230 and the conductor 260. Moreover, the conductor 205 is preferably provided over and in contact with the conductor 203. Furthermore, the conductor 205 is preferably provided to be embedded in the insulator 214 and the insulator 216.

Here, the conductor 260 sometimes functions as a first gate (also referred to as a top gate) electrode. The conductor 205 sometimes functions as a second gate (also referred to as a bottom gate) electrode. In such cases, Vth of the transistor 200 can be controlled by changing a potential applied to the conductor 205 not in synchronization with but independently of a potential applied to the conductor 260. In particular, Vth of the transistor 200 can be higher than 0 V and the off-state current can be reduced by application of a negative potential to the conductor 205. Thus, a drain current when a potential applied to the conductor 260 is 0 V can be smaller in the case where a negative potential is applied to the conductor 205 than in the case where the negative potential is not applied.

When the conductor 205 is provided over the conductor 203, the distance between the conductor 203 and the conductor 260 having functions of the first gate electrode and the wiring can be set as appropriate. That is, the insulator 214, the insulator 216, and the like are provided between the conductor 203 and the conductor 260, whereby the parasitic capacitance between the conductor 203 and the conductor 260 can be reduced, and the withstand voltage between the conductor 203 and the conductor 260 can be increased.

The reduction in the parasitic capacitance between the conductor 203 and the conductor 260 can improve the switching speed of the transistor 200, so that the transistor can have high frequency characteristics. The increase in the withstand voltage between the conductor 203 and the conductor 260 can improve the reliability of the transistor 200. Therefore, the insulator 214 and the insulator 216 are preferably thick. Note that the extending direction of the conductor 203 is not limited thereto; for example, the conductor 203 may extend in the channel length direction of the transistor 200.

Note that as shown in FIG. 1(A), the conductor 205 is provided to overlap with the oxide 230 and the conductor 260. The conductor 205 is preferably larger than the region 234 of the oxide 230. As shown in FIG. 1(C), it is particularly preferable that the conductor 205 extend to a region outside an end portion of the region 234 of the oxide 230b that intersects with the channel width direction. That is, the conductor 205 and the conductor 260 preferably overlap with each other with the insulators therebetween outside the side surface of the oxide 230b in the channel width direction.

With the above structure, when potentials are applied to the conductor 260 and the conductor 205, an electric field generated from the conductor 260 and an electric field generated from the conductor 205 are connected, thereby covering the channel formation region formed in the oxide 230.

That is, the channel formation region in the region 234 can be electrically surrounded by the electric field of the conductor 260 having a function of the first gate electrode and the electric field of the conductor 205 having a function of the second gate electrode. In this specification, the transistor structure in which the channel formation region is electrically surrounded by the electric fields of the first gate electrode and the second gate electrode is referred to as a surrounded channel (S-channel) structure.

In the conductor 205, a conductor 205a is formed in contact with an inner wall of an opening of the insulator 214 and the insulator 216, and a conductor 205b is formed on the inner side. Here, the top surfaces of the conductor 205a and the conductor 205b can be substantially level with the top surface of the insulator 216. Although the conductor 205a and the conductor 205b are stacked in the transistor 200, the present invention is not limited thereto. The conductor 205 may be a single layer or have a stacked-layer structure of three or more layers, for example. In the case where a component has a stacked-layer structure, the layers may be distinguished by ordinal numbers corresponding to the formation order.

Here, the conductor 205a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (or a conductive material through which the above impurities are less likely to pass). Alternatively, it is preferable to use a conductive material having a function of inhibiting diffusion of oxygen (e.g., at least one of oxygen atoms, oxygen molecules, and the like) (or a conductive material through which the above oxygen is less likely to pass). Note that in this specification, a function of inhibiting diffusion of impurities or oxygen means a function of inhibiting diffusion of any one or all of the above impurities and the above oxygen.

When the conductor 205a has a function of inhibiting diffusion of oxygen, the conductivity of the conductor 205b can be inhibited from being lowered because of oxidation. As a conductive material having a function of inhibiting diffusion of oxygen, for example, tantalum, tantalum nitride, ruthenium, or ruthenium oxide is preferably used. Accordingly, the conductor 205a is a single layer or a stacked layer of the above conductive materials. Thus, impurities such as hydrogen and water can be inhibited from diffusing to the transistor 200 side through the conductor 205.

Moreover, the conductor 205b is preferably formed using a conductive material containing tungsten, copper, or aluminum as its main component. Note that the conductor 205b is illustrated as a single layer but may have a stacked-layer structure, for example, a stacked layer of any of the above conductive materials and titanium or titanium nitride.

The conductor 203 functions as a wiring and thus is preferably a conductor having a higher conductivity than the conductor 205b. For example, a conductive material containing copper or aluminum as its main component can be used. In addition, the conductor 203 may have a stacked-layer structure, for example, a stacked layer of any of the above conductive materials and tantalum, tantalum nitride, titanium, or titanium nitride.

It is particularly preferable to use copper for the conductor 203. Copper is preferably used for a wiring and the like because of its low resistance. However, copper is easily diffused and thus may deteriorate the electrical characteristics of the transistor 200 when diffused into the oxide 230. In view of the above, for example, a material through which copper is less likely to pass, such as silicon nitride, aluminum oxide, or hafnium oxide, is used for the insulator 214, whereby diffusion of copper can be inhibited.

The conductor 205, the insulator 214, and the insulator 216 are not necessarily provided. In that case, part of the conductor 203 can function as the second gate electrode.

The insulator 210 and the insulator 214 preferably function as a barrier insulating film that inhibits impurities such as water and hydrogen from entering the transistor 200 from the substrate side. Thus, the insulator 210 and the insulator 214 are preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (or an insulating material through which the above impurities are less likely to pass). Alternatively, it is preferable to use an insulating material having a function of inhibiting diffusion of oxygen (e.g., at least one of oxygen atoms, oxygen molecules, and the like) (or an insulating material through which the above oxygen is less likely to pass).

For example, it is preferable that aluminum oxide or the like be used for the insulator 210 and that silicon nitride or the like be used for the insulator 214. Accordingly, impurities such as hydrogen and water can be inhibited from diffusing to the transistor 200 side from the substrate side of the insulator 210 and the insulator 214. Alternatively, oxygen contained in the insulator 224 or the like can be inhibited from diffusing to the substrate side of the insulator 210 and the insulator 214.

Furthermore, with the structure in which the conductor 205 is stacked over the conductor 203, the insulator 214 can be provided between the conductor 203 and the conductor 205. Here, even when a metal that is easily diffused, such as copper, is used for the second conductor of the conductor 203, silicon nitride or the like provided as the insulator 214 can inhibit diffusion of the metal to a layer above the insulator 214.

The dielectric constants of the insulator 212, the insulator 216, the insulator 280, and the insulator 281 that function as interlayer films are preferably lower than that of the insulator 210 or the insulator 214. When a material with a low dielectric constant is used for an interlayer film, the parasitic capacitance generated between wirings can be reduced.

For example, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used for the insulator 212, the insulator 216, the insulator 280, and the insulator 281. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulators.

The insulator 220, the insulator 222, the insulator 224, and the insulator 250 each have a function of a gate insulator.

It is preferable that the insulator 222 have a function of inhibiting diffusion of oxygen (e.g., at least one of oxygen atoms, oxygen molecules, and the like) (or that the above oxygen be less likely to pass through the insulator). For example, the insulator 222 preferably has a lower oxygen permeability than the insulator 224.

The insulator 222 preferably has a function of inhibiting diffusion of oxygen or impurities, in which case diffusion of oxygen contained in the oxide 230 to the insulator 220 side is prevented. Furthermore, the conductor 205 can be inhibited from reacting with oxygen contained in the insulator 224 or the oxide 230.

It is particularly preferable to use an insulator containing an oxide of one or both of aluminum and hafnium, which is an insulating material having a function of inhibiting diffusion of impurities, oxygen, and the like (or an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. The insulator 222 formed using such a material functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulators.

For example, a single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

It is preferable that the insulator 220 be thermally stable. For example, silicon oxide and silicon oxynitride, which have thermal stability, are suitable. In addition, a combination of an insulator which is a high-k material and silicon oxide or silicon oxynitride enables the insulator 220 to have a stacked-layer structure that has thermal stability and a high dielectric constant.

Note that the insulator 220, the insulator 222, and the insulator 224 may each have a stacked-layer structure of two or more layers. In that case, without limitation to a stacked-layer structure formed of the same material, a stacked-layer structure formed of different materials may be employed. Alternatively, a structure may be employed in which the insulator 220 is not provided and only the insulator 222 and the insulator 224 are provided.

The oxide 230 includes the oxide 230a, the oxide 230b over the oxide 230a, and the oxide 230c over the oxide 230b. The oxide 230a has a stacked-layer structure of the oxide 230a1 and the oxide 230a2. When the oxide 230a is provided below the oxide 230b, impurities can be inhibited from diffusing into the oxide 230b from the components formed below the oxide 230a. When the oxide 230c is provided over the oxide 230b, impurities can be inhibited from diffusing into the oxide 230b from the components formed above the oxide 230c.

As the oxide 230, a metal oxide that can be represented as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like), an In—Ga oxide, an In—Zn oxide, or the like can be used.

In the case where an In-M-Zn oxide is used as the oxide 230, the oxide 230 preferably has a stacked-layer structure of oxides that differ in the atomic ratio of metal atoms. Specifically, the atomic ratio of the element M to constituent elements in the metal oxide used as the oxide 230a is preferably greater than the atomic ratio of the element M to constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

Although details are described later, when a weak Zn—O bond exists in the oxide 230, the stability of a transistor may be decreased. Thus, the amount of Zn contained in the oxide 230, particularly in the oxide 230b, is preferably small. For example, the atomic ratio of Zn contained in the oxide 230b is set lower than the atomic ratio of In contained in the oxide 230b.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. Accordingly, oxygen extraction from the oxide 230b by the source electrode or the drain electrode can be suppressed. This can inhibit oxygen extraction from the oxide 230b even when heat treatment is performed; hence, the transistor 200 is stable against a thermal budget in the manufacturing process.

In the case where at least part of the oxide 230 contains nitrogen, VoN is formed by entry of nitrogen into oxygen vacancies (sometimes referred to as Vo) generated by oxygen extraction from the oxide 230 at the time of or after the formation of the oxide 230, and the oxygen vacancies may be filled. Oxygen in the metal oxide is substituted with nitrogen; thus, the metal oxide has a bond between a metal (M) and nitrogen (N) (sometimes referred to as an MN bond). Here, M is preferably In, Ga, or Zn. It is probable that VoN and the MN bond in the metal oxide are extremely stable. Thus, release of a metal element such as Zn, Ga, or In from the oxide 230 can be suppressed. A semiconductor device including such a metal oxide has stable electrical characteristics and improved reliability.

The metal oxide containing nitrogen is preferably used as one or more of the oxide 230a1, the oxide 230a2, the oxide 230b, and the oxide 230c, in which case the oxide can hold a negative fixed charge and can shift the threshold value of the transistor 200 in the positive direction.

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like is preferably used as the oxide 230a and the oxide 230c.

As the oxide 230a, a metal oxide having an atomic ratio of [In]:[Ga]:[Zn]=1:3:4 or a neighborhood thereof, a metal oxide having an atomic ratio of [In]:[Ga]:[Zn]=1:3:2 or a neighborhood thereof, a metal oxide having an atomic ratio of [In]:[Ga]:[Zn]=1:1:0.5 or a neighborhood thereof, the metal oxide containing nitrogen, or the like can be used. In this specification, a neighborhood of an atomic ratio includes 50% or higher and 150% or lower, preferably 80% or higher and 120% or lower, further preferably 90% or higher and 110% or lower of the proportion of each atom. In the case where the oxide 230a has a stacked-layer structure including the oxide 230a1 and the oxide 230a2, the atomic ratio of metal elements contained in the oxide 230a1 may be the same as or different from the atomic ratio of metal elements contained in the oxide 230a2. One or both of the oxide 230a1 and the oxide 230a2 preferably contain nitrogen. In the case where both of the oxide 230a1 and the oxide 230a2 contain nitrogen, the nitrogen concentration of the oxide 230a1 may be the same as or different from the nitrogen concentration of the oxide 230a2. For example, it is preferable that a metal oxide having an atomic ratio of [In]:[Ga]:[Zn]=1:3:4 be used as the oxide 230a1 and the oxide 230a2, the oxygen concentration of the oxide 230a1 be higher than that of the oxide 230a2, and the nitrogen concentration of the oxide 230a2 be higher than that of the oxide 230a1.

As the oxide 230b, a metal oxide having an atomic ratio of [In]:[Ga]:[Zn]=4:2:3 or a neighborhood thereof, a metal oxide having an atomic ratio of [In]:[Ga]:[Zn]=1:1:0.5 or a neighborhood thereof, a metal oxide having an atomic ratio of [In]:[Ga]:[Zn]=5:1:7 or a neighborhood thereof, a metal oxide having an atomic ratio of [In]:[Ga]:[Zn]=1:1:1 or a neighborhood thereof, the metal oxide containing nitrogen, or the like can be used.

As the oxide 230c, a metal oxide having an atomic ratio of [In]:[Ga]:[Zn]=4:2:3 or a neighborhood thereof, a metal oxide having an atomic ratio of [In]:[Ga]:[Zn]=1:1:0.5 or a neighborhood thereof, a metal oxide having an atomic ratio of [In]:[Ga]:[Zn]=5:1:7 or a neighborhood thereof, a metal oxide having an atomic ratio of [In]:[Ga]:[Zn]=1:1:1 or a neighborhood thereof, the metal oxide containing nitrogen, or the like can be used. Indium tin oxide containing silicon can also be used as the oxide 230c.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current. Meanwhile, the oxide 230c or the oxide 230a serves as a main carrier path in some cases.

The oxide 230 includes the region 243 and the region 234. At least part of the region 243 includes a region in contact with the conductor 242.

When the transistor 200 is turned on, the region 243a or the region 243b functions as the source region or the drain region. The region 234 functions as a region where a channel is formed. In addition, a region functioning as a junction region may be provided between the region 243 and the region 234.

At least one of the oxide 230a1, the oxide 230a2, the oxide 230b, and the oxide 230c is preferably the layer that holds a fixed charge, and the layer that holds a fixed charge is preferably the oxide containing nitrogen.

That is, by appropriately selecting the areas of the regions, a transistor having electrical characteristics that meet the demand for the circuit design can be easily provided.

A metal oxide functioning as an oxide semiconductor is preferably used as the oxide 230. For example, as a metal oxide to be the region 234, a metal oxide having a band gap of 2 eV or more, preferably 2.5 eV or more, is preferably used. With the use of a metal oxide having such a wide band gap, the off-state current of the transistor can be reduced.

A transistor using an oxide semiconductor has an extremely low leakage current in a non-conduction state; thus, a semiconductor device with low power consumption can be provided. An oxide semiconductor can be deposited by a sputtering method or the like, and thus can be used for a transistor included in a highly integrated semiconductor device.

The conductor 242 (the conductor 242a and the conductor 242b) functioning as the source electrode and the drain electrode is provided over the oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, a ruthenium alloy containing aluminum, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. A ruthenium alloy containing aluminum, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided in contact with the oxide 230, the oxygen concentration in the region 243 sometimes decreases. In addition, a metal compound layer that contains the metal contained in the conductor 242 and the component of the oxide 230 is sometimes formed in the region 243. In such cases, the carrier density of the region 243 increases, and the region 243 becomes a low-resistance region.

The conductor 242 may have a stacked-layer structure. For example, as shown in FIG. 5(B), the conductor 242 may be a stack including the conductor 242-1 that absorbs oxygen contained in the oxide 230 and the conductor 242-2 that is less likely to absorb oxygen than the conductor 242-1. With such a structure, oxygen contained in the oxide 230 is absorbed by the conductor 242-1, and a reduction in the oxygen concentration sometimes leads to the formation of the low-resistance region 243 in the oxide 230 in the vicinity of the conductor 242-1.

The conductor 242-1 can be formed using a material containing at least one of aluminum, titanium, silicon, tantalum, tungsten, and a compound containing any of them, and the conductor 242-2 can be formed using ruthenium or ruthenium containing aluminum, for example.

The insulator 273a and the insulator 273b (the insulator 273) are preferably provided over the conductor 242a and the conductor 242b, respectively.

It is preferable that the insulator 273 have a function of inhibiting diffusion of oxygen (e.g., at least one of oxygen atoms, oxygen molecules, and the like) (or that the above oxygen be less likely to pass through the insulator). For example, a material similar to that for the insulator 222 can be used for the insulator 273. An insulator containing an oxide of one or both of aluminum and hafnium is preferably formed as the insulator 273, for example. Note that as the insulator containing an oxide of one or both of aluminum and hafnium, aluminum oxide, hafnium oxide, an oxide containing aluminum and hafnium (hafnium aluminate), or the like is preferably used. In particular, hafnium aluminate has higher heat resistance than a hafnium oxide film. Therefore, hafnium aluminate is preferable because it is less likely to be crystallized by heat treatment in a later step.

The insulator 273 is preferably formed by an ALD method achieving good coverage.

The use of such an insulator 273 can inhibit oxidation of the conductor 242, which enables the conductor 242 to have a good contact with the oxide 230.

The insulator 250 functions as a gate insulator. The insulator 250 is preferably provided in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. Silicon oxide and silicon oxynitride, which have thermal stability, are particularly preferable.

As in the insulator 224, the concentration of impurities such as water and hydrogen contained in the insulator 250 is preferably lowered. The thickness of the insulator 250 is preferably greater than or equal to 1 nm and less than or equal to 20 nm.

A metal oxide may be provided between the insulator 250 and the conductor 260. The metal oxide preferably inhibits diffusion of oxygen from the insulator 250 to the conductor 260. Provision of the metal oxide that inhibits diffusion of oxygen inhibits diffusion of oxygen from the insulator 250 to the conductor 260. That is, oxidation of the conductor 260 due to oxygen in the insulator 250 can be inhibited.

The metal oxide has a function of part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential that is applied during operation of the transistor can be reduced while the physical thickness of the gate insulator is kept. In addition, the equivalent oxide thickness (EOT) of an insulator functioning as the gate insulator can be reduced.

Specifically, a metal oxide containing one or more kinds selected from hafnium, aluminum, gallium, yttrium, zirconium, tungsten, titanium, tantalum, nickel, germanium, magnesium, and the like can be used.

It is particularly preferable to use an insulator containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide is not an essential component. Design is appropriately set in consideration of required transistor characteristics.

Although the conductor 260 functioning as the first gate electrode has a two-layer structure in FIG. 1, a single-layer structure or a stacked-layer structure of three or more layers may be employed.

Like the conductor 205a, the conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

The conductor 260b is preferably formed using a conductive material containing tungsten, copper, or aluminum as its main component. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

In the case where the conductor 205 extends to a region outside the end portion of the oxide 230 that intersects with the channel width direction as shown in FIG. 1(C), the conductor 260 preferably overlaps with the conductor 205 with the insulator 250 therebetween in the region. That is, a stacked-layer structure of the conductor 205, the insulator 250, and the conductor 260 is preferably formed outside the side surface of the oxide 230.

With the above structure, when potentials are applied to the conductor 260 and the conductor 205, an electric field generated from the conductor 260 and an electric field generated from the conductor 205 are connected, thereby covering the channel formation region formed in the oxide 230.

That is, the channel formation region in the region 234 can be electrically surrounded by the electric field of the conductor 260 having a function of the first gate electrode and the electric field of the conductor 205 having a function of the second gate electrode.

The insulator 274 is preferably in contact with a top surface of the insulator 250 and a top surface and a side surface of the conductor 260.

It is preferable that the insulator 274 have a function of inhibiting diffusion of oxygen (e.g., at least one of oxygen atoms, oxygen molecules, and the like) (or that the above oxygen be less likely to pass through the insulator). For example, the insulator 274 can be formed using a material similar to that for the insulator 222 or the insulator 273. An insulator containing an oxide of one or both of aluminum and hafnium is preferably formed as the insulator 274, for example. As the insulator containing an oxide of one or both of aluminum and hafnium, aluminum oxide, hafnium oxide, an oxide containing aluminum and hafnium (hafnium aluminate), or the like is preferably used. In particular, hafnium aluminate has higher heat resistance than a hafnium oxide film. Therefore, hafnium aluminate is preferable because it is less likely to be crystallized by heat treatment in a later step.

The insulator 274 is preferably formed by an ALD method. An ALD method, which achieves good coverage, can prevent disconnection or the like due to unevenness caused by the conductor 260 and the oxide 230.

The use of such an insulator 274 can inhibit oxidation of the conductor 260.

The insulator 280 is provided over the insulator 224, the oxide 230, the conductor 242, the insulator 273, the insulator 250, the conductor 260, and the insulator 274. The insulator 280 preferably includes a region containing oxygen that is released by heating. For example, the insulator 280 preferably contains silicon oxide, silicon oxynitride, silicon nitride oxide, silicon oxide to which fluorine is added, silicon oxide to which carbon is added, silicon oxide to which carbon and nitrogen are added, porous silicon oxide, or the like. Silicon oxide and silicon oxynitride, which have thermal stability, are particularly preferable. Materials such as silicon oxide, silicon oxynitride, and porous silicon oxide are particularly preferable because a region containing oxygen that is released by heating can be easily formed.

As described above, the insulator 280 preferably includes a region containing oxygen that is released by heating. When the insulator 280 from which oxygen is released by heating is provided in contact with the insulator 224, oxygen in the insulator 280 can be efficiently supplied to the region 234 of the oxide 230 through the insulator 224. Note that the concentration of impurities such as water and hydrogen contained in the insulator 280 is preferably lowered.

The top surface of the insulator 280 may be planarized as shown in FIG. 1(B), FIG. 1(C), and FIG. 1(D). Alternatively, the top surface of the insulator 280 may have an uneven surface along unevenness caused by the oxide 230 and the conductor 260.

It is preferable that the insulator 282 have a function of inhibiting diffusion of oxygen (e.g., at least one of oxygen atoms, oxygen molecules, and the like) (or that the above oxygen be less likely to pass through the insulator). For example, the insulator 282 preferably has a lower oxygen permeability than the insulator 224 or the insulator 280.

The insulator 282 is preferably provided in contact with the top surface of the insulator 280. When the insulator 282 is formed by a sputtering method in an oxygen-containing atmosphere, a region containing oxygen that is released by heating can be provided in the insulator 280. Accordingly, oxygen can be supplied from the region to the oxide 230 through the insulator 224 or the insulator 250. Here, the insulator 282 preferably has a function of inhibiting diffusion of oxygen, in which case diffusion of oxygen contained in the insulator 280 to the insulator 281 side can be inhibited.

For example, a metal oxide containing one or more kinds selected from hafnium, aluminum, gallium, yttrium, zirconium, tungsten, titanium, tantalum, nickel, germanium, magnesium, and the like can be used as the insulator 282. It is particularly preferable to use an insulator containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method can also function as a barrier film against impurities such as hydrogen. For example, when aluminum oxide deposited by a sputtering method is used for the insulator 282, the insulator 282 can supply oxygen to the insulator 280 and inhibit entry of impurities such as hydrogen from above the insulator 282 into the insulator 280 side.

The insulator 281 functioning as an interlayer film is preferably provided over the insulator 282. As in the insulator 224 or the like, the concentration of impurities such as water and hydrogen in the insulator 281 is preferably lowered.

The conductor 240a and the conductor 240b are provided in the openings formed in the insulator 281, the insulator 282, the insulator 280, and the insulator 273. The conductor 240c is provided in the opening formed in the insulator 281, the insulator 282, the insulator 280, and the insulator 274. The conductor 240a and the conductor 240b are provided to face each other with the conductor 260 positioned therebetween. Note that the top surfaces of the conductor 240a, the conductor 240b, and the conductor 240c may be on the same surface as the top surface of the insulator 281.

The first conductor of the conductor 240a is formed in contact with the inner wall of the opening of the insulator 281, the insulator 282, the insulator 280, and the insulator 273a. The conductor 242a is located on at least part of the bottom portion of the opening, and thus the conductor 240a is in contact with the conductor 242a. Similarly, the first conductor of the conductor 240b is formed in contact with the inner wall of the opening of the insulator 281, the insulator 282, the insulator 280, and the insulator 273b. The conductor 242b is located on at least part of the bottom portion of the opening, and thus the conductor 240b is in contact with the conductor 242b. Similarly, the first conductor of the conductor 240c is formed in contact with the inner wall of the opening of the insulator 281, the insulator 282, the insulator 280, and the insulator 274. The conductor 260 is located on at least part of the bottom portion of the opening, and thus the conductor 240c is in contact with the conductor 260.

An insulating barrier or a conductive barrier that inhibits the passage of oxygen, impurities such as hydrogen and water, and the like is preferably provided between the conductor 240 and the inner walls of the openings. In this embodiment, an example in which the insulator 276 is provided as an insulating barrier is described. The insulator 276 is provided at least on parts of the side surface of the insulator 280 and the side surface of the insulator 282, and preferably inhibits diffusion of oxygen, impurities such as hydrogen and water, and the like contained in the insulator 280 into the conductor 240.

The conductor 240 is preferably formed using a conductive material containing tungsten, copper, or aluminum as its main component. The conductor 240 may have a stacked-layer structure.

In the case where the conductor 240 has a stacked-layer structure, a conductive material having a function of inhibiting the passage of impurities such as water and hydrogen is preferably used for a conductor in contact with the conductor 242, the insulator 273, the insulator 280, the insulator 282, and the insulator 281, as in the conductor 205a or the like. For example, tantalum, tantalum nitride, titanium, titanium nitride, ruthenium, ruthenium oxide, or the like is preferably used. The conductive material having a function of inhibiting the passage of impurities such as water and hydrogen may be a single layer or a stacked layer. The use of the conductive material can prevent oxygen added to the insulator 280 from being absorbed by the conductor 240. Moreover, impurities such as hydrogen and water can be inhibited from entering the oxide 230 through the conductor 240 from a layer above the insulator 281.

The conductor 256 functioning as a wiring may be provided in contact with the top surface of the conductor 240. The conductor functioning as a wiring is preferably formed using a conductive material containing tungsten, copper, or aluminum as its main component. The conductor may have a stacked-layer structure, for example, a stacked layer of any of the above conductive materials and titanium or titanium nitride. Like the conductor 203 or the like, the conductor 256 may be formed to be embedded in an opening provided in an insulator.

<Constituent Material of Semiconductor Device>

Constituent materials that can be used for a semiconductor device will be described below.

<<Substrate>>

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. In addition, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is formed over a non-flexible substrate and then the transistor is separated from the non-flexible substrate and transferred to the substrate that is a flexible substrate. In that case, a separation layer is preferably provided between the non-flexible substrate and the transistor. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced. That is, a durable semiconductor device can be provided.

For the substrate that is a flexible substrate, for example, a metal, an alloy, a resin, glass, or fiber thereof can be used. As the substrate, a sheet, a film, a foil, or the like that contains a fiber may be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (nylon, aramid, or the like), polyimide, polycarbonate, and acrylic. In particular, aramid is suitable for the substrate that is a flexible substrate because of its low coefficient of linear expansion.

<<Insulator>>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. By contrast, when a material having a low dielectric constant is used for the insulator functioning as an interlayer film, the parasitic capacitance generated between wirings can be reduced. Accordingly, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure that is thermally stable and has a low dielectric constant can be obtained by combination with a resin, for example. Examples of the resin include polyester, polyolefin, polyamide (nylon, aramid, or the like), polyimide, polycarbonate, and acrylic. Furthermore, a stacked-layer structure that is thermally stable and has a high dielectric constant can be obtained by combination of silicon oxide and silicon oxynitride with an insulator having a high dielectric constant, for example.

When the transistor using an oxide semiconductor is surrounded by an insulator having a function of inhibiting the passage of oxygen and impurities such as hydrogen, the electrical characteristics of the transistor can be stable.

As the insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, the insulator 224 and the insulator 250 functioning as the gate insulator are each preferably an insulator including a region containing oxygen that is released by heating. When a structure is employed in which silicon oxide or silicon oxynitride including a region containing oxygen that is released by heating is in contact with the oxide 230, oxygen vacancies included in the oxide 230 can be filled.

For example, an insulator containing an oxide of one or more kinds of aluminum, hafnium, and gallium can be used as the insulator 222 functioning as part of the gate insulator. In particular, as the insulator containing an oxide of one or both of aluminum and hafnium, aluminum oxide, hafnium oxide, an oxide containing aluminum and hafnium (hafnium aluminate), or the like is preferably used.

For example, silicon oxide or silicon oxynitride, which is thermally stable, is preferably used for the insulator 220. When the gate insulator has a stacked-layer structure of a thermally stable film and a film with a high dielectric constant, the equivalent oxide thickness (EOT) of the gate insulator can be reduced while the physical thickness thereof is kept.

With the above stacked-layer structure, on-state current can be increased without a reduction in the influence of the electric field from the gate electrode. Since the distance between the gate electrode and the region where a channel is formed is kept by the physical thickness of the gate insulator, leakage current between the gate electrode and the channel formation region can be inhibited.

The insulator 212, the insulator 216, the insulator 280, and the insulator 281 preferably include an insulator with a low dielectric constant. For example, the insulator 212, the insulator 216, the insulator 280, and the insulator 281 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 212, the insulator 216, the insulator 280, and the insulator 281 preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can be thermally stable and have a low dielectric constant. Examples of the resin include polyester, polyolefin, polyamide (nylon, aramid, or the like), polyimide, polycarbonate, and acrylic.

As the insulator 210, the insulator 214, the insulator 273, the insulator 274, and the insulator 281, an insulator having a function of inhibiting the passage of oxygen and impurities such as hydrogen is used. For the insulator 210, the insulator 214, the insulator 273, the insulator 274, and the insulator 281, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like is used, for example.

<<Conductor>>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like can be used. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where a channel is formed can be trapped in some cases. Alternatively, hydrogen entering from an external insulator or the like can be trapped in some cases.

For the conductor 260, the conductor 203, the conductor 205, the conductor 242, and the conductor 240, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, a ruthenium alloy containing aluminum, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. A ruthenium alloy containing aluminum, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

<<Metal Oxide>>

As the oxide 230, a metal oxide functioning as an oxide semiconductor is preferably used. A metal oxide that can be used as the oxide 230 of the present invention will be described below.

The metal oxide preferably contains at least indium or zinc. In particular, indium and zinc are preferably contained. Aluminum, gallium, yttrium, tin, or the like is preferably contained in addition to them. One or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. A metal oxide containing nitrogen may be referred to as a metal oxynitride.

[Structure of Metal Oxide]

Oxide semiconductors (metal oxides) are classified into a single-crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

In this specification and the like, CAAC (c-axis aligned crystal) and CAC (Cloud-Aligned Composite) are sometimes stated. Note that CAAC refers to an example of a crystal structure, and CAC refers to an example of a function or a material composition.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

Here, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° in some cases. This peak is assigned to the (009) plane of the $InGaZnO_4$ crystal, which indicates that crystals in the CAAC-OS have c-axis alignment and that the c-axes face in a direction substantially perpendicular to the formation surface or the top surface.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) appears in some cases. This diffraction pattern includes spots derived from the (009) plane of the $InGaZnO_4$ crystal. Thus, the electron diffraction also indicates that crystals included in the CAAC-OS have c-axis alignment and that the c-axes face in a direction substantially perpendicular to the formation surface or the top surface. Meanwhile, a ring-like diffraction pattern is shown when an electron beam with a probe diameter of 300 nm is incident on the same sample in a direction perpendicular to the sample surface. Thus, the electron diffraction also indicates that the a-axes and b-axes of the crystals included in the CAAC-OS do not have regular alignment.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that an indium-gallium-zinc oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained in some cases when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor.

The a-like OS contains a void or a low-density region. That is, the a-like OS has low crystallinity as compared with the nc-OS and the CAAC-OS.

An oxide semiconductor (metal oxide) can have various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Composition of Metal Oxide]

The composition of a CAC (Cloud-Aligned Composite)-OS that can be used for a transistor disclosed in one embodiment of the present invention will be described below.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in a semiconductor layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Transistor Including Metal Oxide]

Next, the case where the above metal oxide is used for a channel formation region of a transistor will be described.

Note that when the above metal oxide is used for a channel formation region of a transistor, the transistor having high field-effect mobility can be achieved. In addition, the transistor having high reliability can be achieved.

Here, an example of the hypothesis about electric conduction of a metal oxide is described.

Electric conduction in a solid is inhibited by a scattering source called a scattering center. For example, it is known that in the case of single crystal silicon, lattice scattering and ionized impurity scattering are main scattering centers. In other words, in the elemental state with few lattice defects and impurities, the carrier mobility is high because there is no factor that inhibits the electric conduction in the solid.

The above presumably applies to a metal oxide. For example, it is probable that a metal oxide containing less oxygen than that in the stoichiometric composition has many oxygen vacancies. Atoms around the oxygen vacancies are located in places shifted from those in the elemental state. This distortion due to the oxygen vacancies might become a scattering center.

Furthermore, a metal oxide containing less oxygen than that in the stoichiometric composition contains excess oxygen, for example. Excess oxygen existing in a liberated state in the metal oxide becomes $O^-$ or $O^{2-}$ by receiving an electron. Excess oxygen that has become $O^-$ or $O^{2-}$ might be a scattering center.

According to the above, it is probable that in the case where the metal oxide has an elemental state containing oxygen in the stoichiometric composition, the carrier mobility is high.

Since crystals of an indium-gallium-zinc oxide (hereinafter, IGZO) that is a kind of metal oxide containing indium, gallium, and zinc tend not to grow particularly in the air and thus, a stable structure is obtained in some cases when IGZO is formed of smaller crystals (e.g., the above-described nanocrystals) rather than larger crystals (here, crystals with a size of several millimeters or several centimeters). This is probably because connection of small crystals, rather than formation of large crystals, leads to a reduction in distortion energy.

Note that in a region where small crystals are connected to each other, defects are formed in some cases to reduce the distortion energy of the region. Thus, when the distortion energy is reduced without formation of a defect in the region, the carrier mobility can be increased.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to disappear and may behave like fixed charges. Thus, a transistor whose channel formation region includes a metal oxide having a high density of trap states has unstable electrical characteristics in some cases.

Accordingly, a reduction in the impurity concentration in the metal oxide is effective in achieving stable electrical characteristics of the transistor. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When silicon or carbon that is a Group 14 element is contained in the metal oxide, defect states are formed in the metal oxide. Thus, the concentration of silicon or carbon in the metal oxide and the concentration of silicon or carbon near an interface with the metal oxide (the concentration measured by secondary ion mass spectrometry (SIMS) are set to lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide measured by SIMS is set to lower than or equal to $1\times10^{18}$ atoms/cm$^3$, preferably lower than or equal to $2\times10^{16}$ atoms/cm$^3$.

When containing nitrogen, the metal oxide sometimes becomes n-type by generation of electrons serving as carriers and an increase in carrier density. That is, nitrogen in the metal oxide might serve as an impurity. As a result, a transistor using a metal oxide containing nitrogen for its channel formation region is likely to have normally-on characteristics. Thus, the amount of nitrogen in the channel formation region in the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Furthermore, hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide that contains hydrogen is likely to have normally-on characteristics.

Therefore, hydrogen in the metal oxide is preferably reduced as much as possible. Specifically, the hydrogen concentration of the metal oxide that is measured by SIMS is set to lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used for a channel formation region of a transistor, stable electrical characteristics can be given.

[Effect of Vacuum Baking]

Here, a weak Zn—O bond included in the metal oxide is described, and an example of a method for reducing the number of oxygen atoms and zinc atoms that form the bond will be described.

In a transistor using a metal oxide, oxygen vacancies are given as an example of a defect that leads to poor electrical characteristics of the transistor. For example, the threshold voltage of a transistor using a metal oxide including oxygen vacancies tends to shift in the negative direction, and thus the transistor tends to have normally-on characteristics. This is because a donor caused by oxygen vacancies in the metal oxide is generated and the carrier concentration increases. The transistor having normally-on characteristics causes various problems in that a malfunction is likely to occur at the time of operation and power consumption is increased at the time of non-operation, for example.

Furthermore, a thermal budget in a step of forming a connection wiring for fabricating a module causes problems such as degradation of the electrical characteristics of the transistor, e.g., a variation in threshold voltage and an increase in parasitic resistance, and an increase in variation in the electrical characteristics due to the degradation of the electrical characteristics. Such problems directly lead to a decrease in manufacturing yield, and thus it is important to consider measures. Furthermore, the electrical characteristics also degrade through a stress test, which can evaluate a change in transistor characteristics due to long-term use (a change over time) in a short time. The degradation of the electrical characteristics is presumably caused by oxygen vacancies in the metal oxide due to high-temperature treatment performed in the manufacturing process or electrical stress applied during the stress test.

In the metal oxide, there is an oxygen atom that has a weak bond to a metal atom and thus is likely to form an oxygen vacancy. In particular, in the case where the metal oxide is an In—Ga—Zn oxide, a zinc atom and an oxygen atom are likely to form a weak bond (also referred to as a weak Zn—O bond). Here, the weak Zn—O bond means a bond generated between a zinc atom and an oxygen atom, which is weak enough to be broken by high-temperature treatment performed in the manufacturing process or electrical stress applied during the stress test. When the weak Zn—O bond exists in the metal oxide, the bond is broken by heat treatment or current stress, so that an oxygen vacancy is formed. The formation of the oxygen vacancy decreases the stability of the transistor, such as resistance to heat treatment or resistance to a stress test.

A bond between an oxygen atom bonded to many zinc atoms and the zinc atoms is a weak Zn—O bond in some cases. A zinc atom is bonded to an oxygen atom more weakly than a gallium atom is. Thus, an oxygen atom bonded to many zinc atoms is likely to form a vacancy. That is, a bond between a zinc atom and an oxygen atom is probably weaker than a bond between an oxygen atom and another metal.

It is probable that the weak Zn—O bond is likely to be formed when impurities exist in the metal oxide. Examples of the impurities in the metal oxide include a water molecule and hydrogen. When a water molecule or hydrogen exists in the metal oxide, a hydrogen atom is sometimes bonded to an oxygen atom in the metal oxide (also referred to as an OH bond). In the case where the In—Ga—Zn oxide is a single crystal, an oxygen atom in the metal oxide is bonded to four metal atoms in the metal oxide. However, an oxygen atom bonded to a hydrogen atom is bonded to two or three metal atoms in some cases. When the number of metal atoms bonded to an oxygen atom decreases, the oxygen atom is likely to form a vacancy. Note that when a zinc atom is bonded to an oxygen atom that forms an OH bond, the bond between the oxygen atom and the zinc atom is probably weak.

A weak Zn—O bond is sometimes formed in a distortion in a region where a plurality of nanocrystals are connected. Although the shape of nanocrystals is basically a hexagon, a pentagonal or heptagonal lattice arrangement, for example, is included in the distortion. A weak Zn—O bond is formed in the distortion presumably because the bond distances between atoms are not uniform in the distortion.

It is probable that a weak Zn—O bond is likely to be formed when the crystallinity of the metal oxide is low. When the crystallinity of the metal oxide is high, a zinc atom in the metal oxide is bonded to four or five oxygen atoms. However, when the crystallinity of the metal oxide becomes lower, the number of oxygen atoms bonded to a zinc atom tends to decrease. When the number of oxygen atoms bonded to a zinc atom decreases, the zinc atom easily forms a vacancy. That is, a bond between a zinc atom and an oxygen atom is presumably weaker than that in a single crystal.

Reducing the number of oxygen atoms and zinc atoms that form the above-described weak Zn—O bonds inhibits formation of oxygen vacancies due to heat treatment or current stress and can improve the stability of a transistor. Note that in the case where only the number of oxygen atoms that form the weak Zn—O bonds is reduced and the number of zinc atoms that form the weak Zn—O bonds is not reduced, a weak Zn—O bond is sometimes formed again when an oxygen atom is supplied to the vicinity of the zinc atoms. Therefore, it is preferable to reduce the number of zinc atoms and oxygen atoms that form the weak Zn—O bonds.

As a method for reducing the number of oxygen atoms and zinc atoms that form the weak Zn—O bonds, a method in which vacuum baking is performed after a metal oxide is formed can be given. The vacuum baking refers to heat treatment performed under a vacuum atmosphere. A vacuum atmosphere is kept by evacuation with a turbo-molecular pump or the like. The pressure in the treatment chamber is lower than or equal to $1 \times 10^{-2}$ Pa, preferably lower than or equal to $1 \times 10^{-3}$ Pa. The substrate temperature in the heat treatment is higher than or equal to 300° C., preferably higher than or equal to 400° C.

Performing the vacuum baking can reduce the number of oxygen atoms and zinc atoms that form the weak Zn—O bonds. Furthermore, since the metal oxide is heated by the vacuum baking, atoms in the metal oxide are rearranged after the number of oxygen atoms and zinc atoms that form the weak Zn—O bonds is reduced, so that the number of oxygen atoms bonded to four metal atoms increases. Accordingly, the number of oxygen atoms and zinc atoms that form the weak Zn—O bonds can be reduced, and a weak Zn—O bond can be inhibited from being formed again.

When impurities exist in the metal oxide, performing the vacuum baking can release water molecules or hydrogen in the metal oxide and reduce the number of OH bonds. When the number of OH bonds in the metal oxide is reduced, the proportion of the oxygen atoms bonded to four metal atoms increases. Furthermore, atoms in the metal oxide are rearranged when water molecules or hydrogen is released, so that the number of oxygen atoms bonded to four metal atoms increases. Thus, a weak Zn—O bond can be inhibited from being formed again.

As described above, when vacuum baking is performed after the metal oxide is formed, the number of oxygen atoms and zinc atoms that form weak Zn—O bonds can be reduced. Thus, the stability of the transistor can be improved through the step. Furthermore, an improvement in the stability of the transistor increases the number of choices of materials and formation methods.

<Modification Example of Semiconductor Device>

An example of a semiconductor device including a transistor of one embodiment of the present invention, which is different from the semiconductor device described above in <Structure example of semiconductor device>, will be described below with reference to FIG. 2 to FIG. 4.

In FIG. 2 to FIG. 4, (A) of each drawing is a top view. Moreover, (B) of each drawing is a cross-sectional view corresponding to a portion indicated by the dashed-dotted line A1-A2 in (A), and is also a cross-sectional view in the channel length direction of the transistor 200. Furthermore, (C) of each drawing is a cross-sectional view corresponding to a portion indicated by the dashed-dotted line A3-A4 in (A), and is also a cross-sectional view in the channel width direction of the transistor 200. In addition, (D) of each drawing is a cross-sectional view corresponding to a portion indicated by the dashed-dotted line A5-A6 in (A), and is also a cross-sectional view in the channel width direction of the transistor 200. Note that for simplification of the drawing, some components are not illustrated in the top view in (A) of each drawing.

Note that in the semiconductor device shown in FIG. 2 to FIG. 4, components having the same functions as the components in the semiconductor device described in <Structure example of semiconductor device> (see FIG. 1) are denoted by the same reference numerals. In this section, the materials described in detail in <Structure example of semiconductor device> can be used as the constituent materials for transistors.

A transistor 200A shown in FIG. 2 is different from the transistor 200 shown in FIG. 1 in that, in a top view, the insulator 273 covers the conductor 242, the oxide 230b, the oxide 230a, and the insulator 224; the side surfaces of the oxide 230c, the insulator 250, and the conductor 260 are substantially aligned with each other; and the insulator 274 covers the top surface and the side surface of the conductor 260, the side surface of the insulator 250, the side surface of the oxide 230c, and the top surface and the side surface of the insulator 273. The insulator 273 has an opening exposing the top surface of the oxide 230b and part of the top surface of the conductor 242, and the end portion of the conductor 242 is positioned closer to the region 234 side than the end portion of the insulator 273 is, as shown in FIG. 2(B). This structure can be obtained in such a manner that the insulator 273 having the opening is formed after the formation of the oxide 230a, the oxide 230b, and the conductor 242; the oxide 230c, the insulator 250, and the conductor 260 are formed after the formation of the insulator 273; and the insulator 274 is formed after the formation of the oxide 230c, the insulator 250, and the conductor 260.

Although FIG. 2(B) shows an example in which the thickness of the region 243 is the same as the thickness of the oxide 230b, the present invention is not limited thereto. As shown in FIG. 5(A) and FIG. 5(B), the region 243 may be formed in the oxide 230b in the vicinity of the conductor 242. Alternatively, the region 243 may be formed not only in the oxide 230b but also in the oxide 230a.

As shown in FIG. 2(B), FIG. 2(C), and FIG. 2(D), the side surface of the oxide 230a, the side surface and part of the top surface of the oxide 230b, and the side surface and part of the top surface of the conductor 242 are covered with the insulator 273 in the transistor 200A, thereby inhibiting outward diffusion of oxygen contained in the oxide 230a and the oxide 230b. In addition, unintended entry of substances, e.g., excess oxygen and impurities such as hydrogen and water, into the oxide 230a, the oxide 230b, and the insulator 224 can be inhibited. Moreover, oxidation of the conductor 242 can be inhibited.

When the top surface and the side surface of the conductor 260, the side surface of the insulator 250, the side surface of the oxide 230c, and the top surface and the side surface of the insulator 273 are covered with the insulator 274, the oxidation of the conductor 260 and unintended entry of substances, e.g., excess oxygen and impurities such as hydrogen and water, into the insulator 250 can be inhibited.

A transistor 200B shown in FIG. 3 is different from the transistor 200A shown in FIG. 2 in that the conductor 242 covers part of the side surfaces of the oxide 230b and the oxide 230a and extends to cover part of the top surface of the insulator 224. The top surface and the side surface of the region 243 in the oxide 230b are covered with the conductor 242; thus, the conductor 242 can have a good contact with the region 243. This structure can be obtained in such a manner that the conductor 242 is formed after the formation of the oxide 230a and the oxide 230b; the insulator 273 having the opening is formed after the formation of the conductor 242; the oxide 230c, the insulator 250, and the conductor 260 are formed after the formation of the insulator 273; and the insulator 274 is formed after the formation of the oxide 230c, the insulator 250, and the conductor 260.

Although FIG. 3(B) shows an example in which the thickness of the region 243 is the same as the thickness of the oxide 230b, the present invention is not limited thereto. As shown in FIG. 5(A) and FIG. 5(B), the region 243 may be formed in the oxide 230b in the vicinity of the conductor 242. Alternatively, the region 243 may be formed not only in the oxide 230b but also in the oxide 230a.

A transistor 200C shown in FIG. 4 is different from the transistor 200B shown in FIG. 3 in that an oxide 230d and an oxide 230e are provided below the conductor 242a and the conductor 242b, respectively; an opening portion of the insulator 273 exposes the entire region 234 of the oxide 230b, part of the insulator 224, and part of the insulator 222 as shown in FIG. 4(A) and FIG. 4(C); one of side end portions of the insulator 273 that face each other is substantially aligned with side end portions of the corresponding conductor 242 and the oxide 230d; and the other is substantially aligned with side end portions of the other corresponding conductor 242 and the oxide 230e as shown in FIG. 4(A) and FIG. 4(B). The oxide 230d or the oxide 230e provided between the oxide 230b and the conductor 242 can reduce the contact resistance between the oxide 230b and the conductor 242; thus, the on-state current of the transistor 200C can be increased. The oxide 230d and the oxide 230e are preferably formed using a metal oxide, further preferably formed using a metal oxide containing nitrogen. As the oxide 230d and the oxide 230e, a metal oxide having an atomic ratio of [In]:[Ga]:[Zn]=4:2:3 or a neighborhood thereof, a metal oxide having an atomic ratio of [In]:[Ga]:[Zn]=1:1:0.5 or a neighborhood thereof, a metal oxide having an atomic ratio of [In]:[Ga]:[Zn]=5:1:7 or a neighborhood thereof, a metal oxide having an atomic ratio of [In]:[Ga]:[Zn]=1:1:1 or a neighborhood thereof, the metal oxide containing nitrogen, or the like can be used. Indium tin oxide containing silicon can also be used as the oxide 230d and the oxide 230e.

Figure 5C:
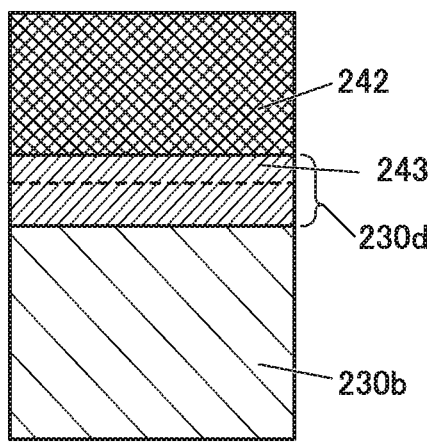
Figure 5D:
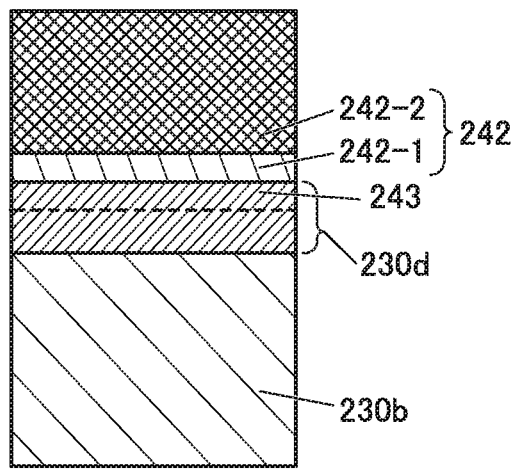
Figure 6A:
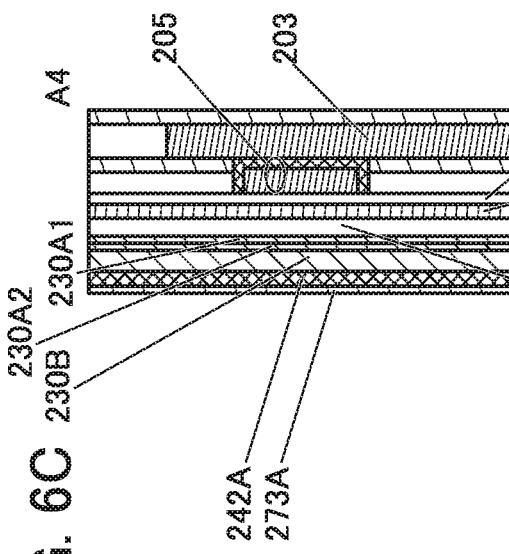
FIGS. 6A-6D A top view and cross-sectional views showing a method for manufacturing a semiconductor device of one embodiment of the present invention.
Figure 6C:
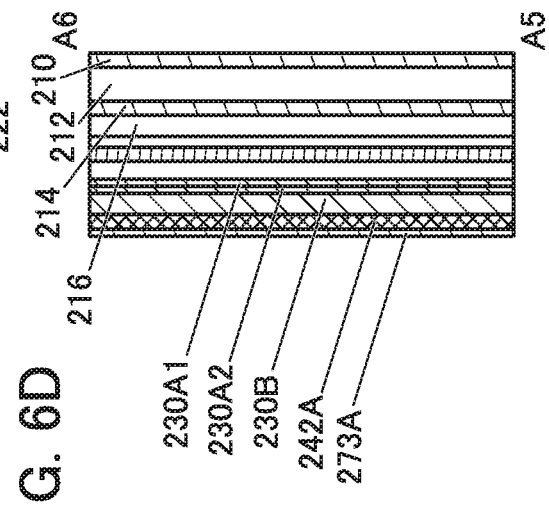
Figure 6B:
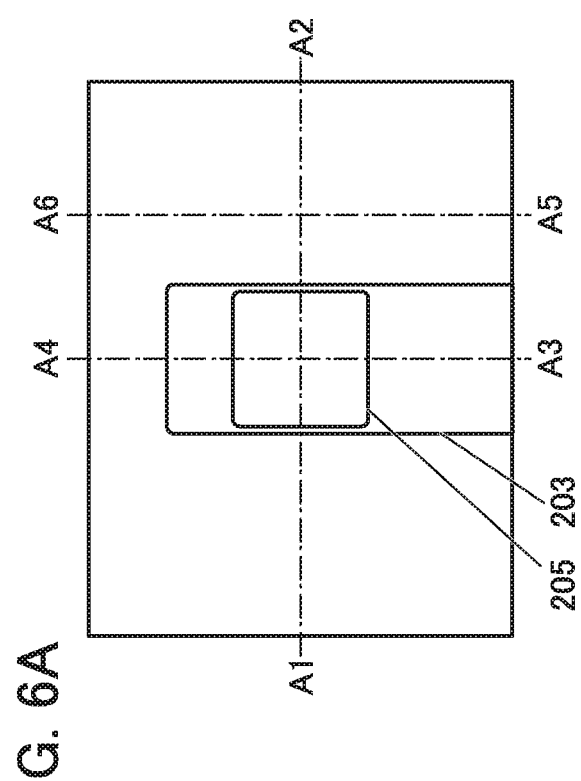
Figure 6D:
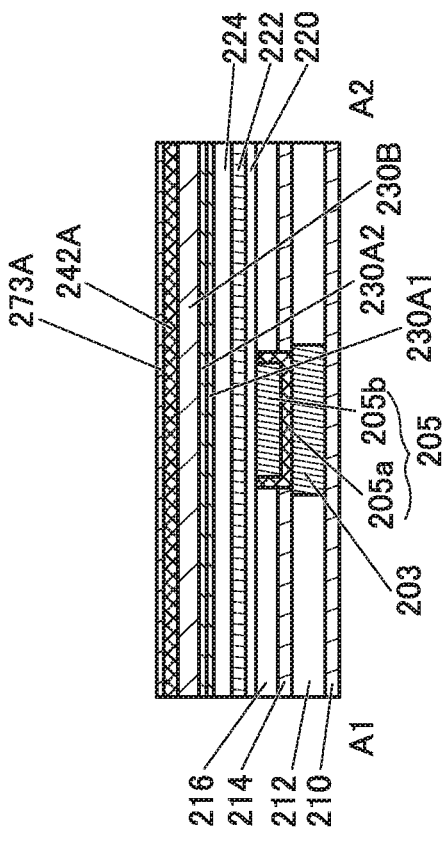
Figure 8C:
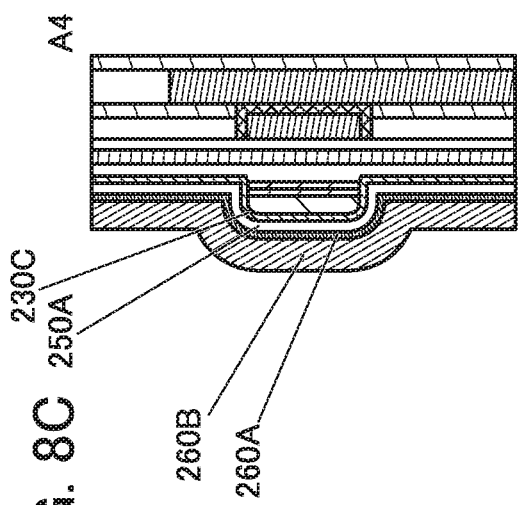
FIGS. 8A-8D A top view and cross-sectional views showing a method for manufacturing a semiconductor device of one embodiment of the present invention.
Figure 8D:
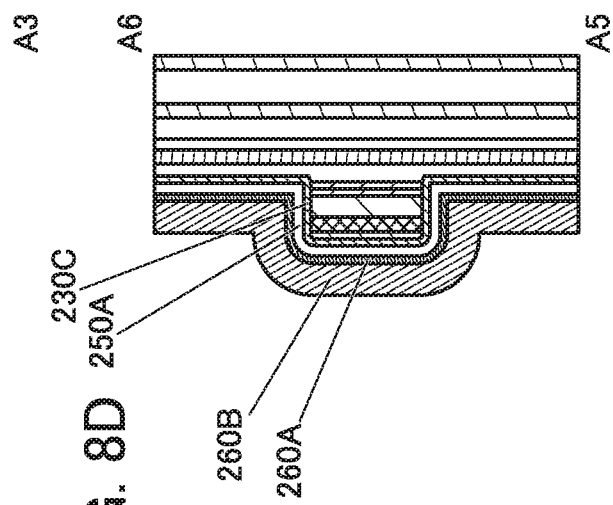
Figure 8A:
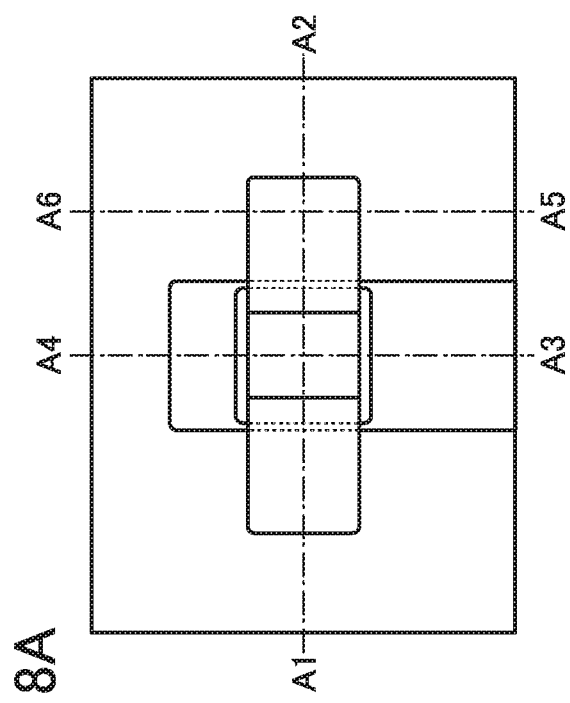
Figure 8B:
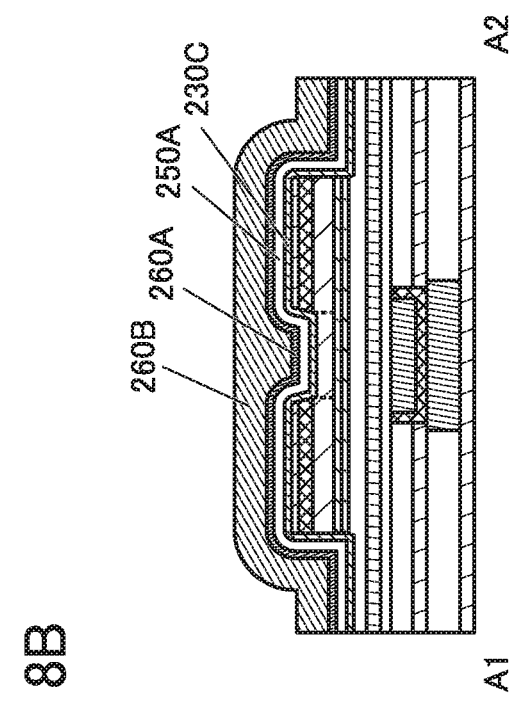
Figure 9A:
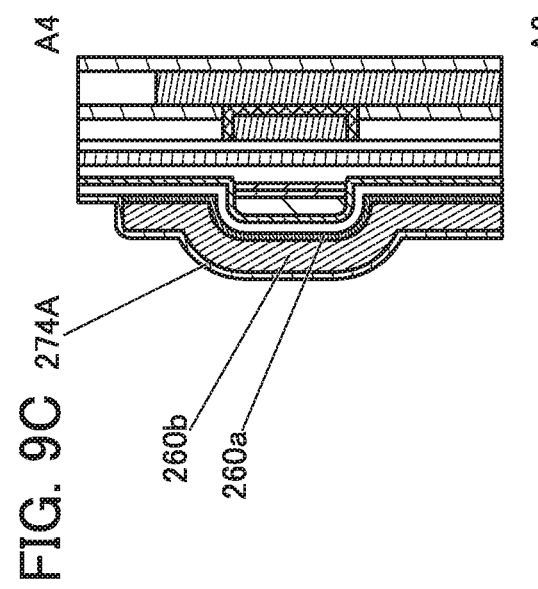
FIGS. 9A-9D A top view and cross-sectional views showing a method for manufacturing a semiconductor device of one embodiment of the present invention.
Figure 9C:
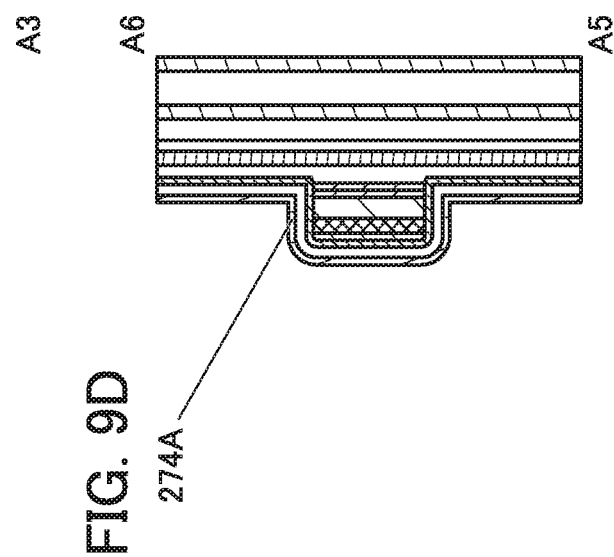
Figure 9B:
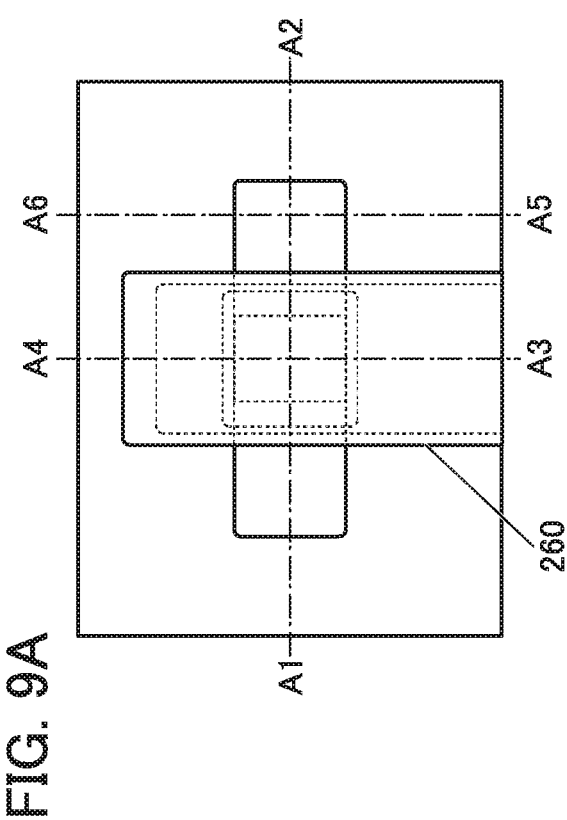
Figure 9D:
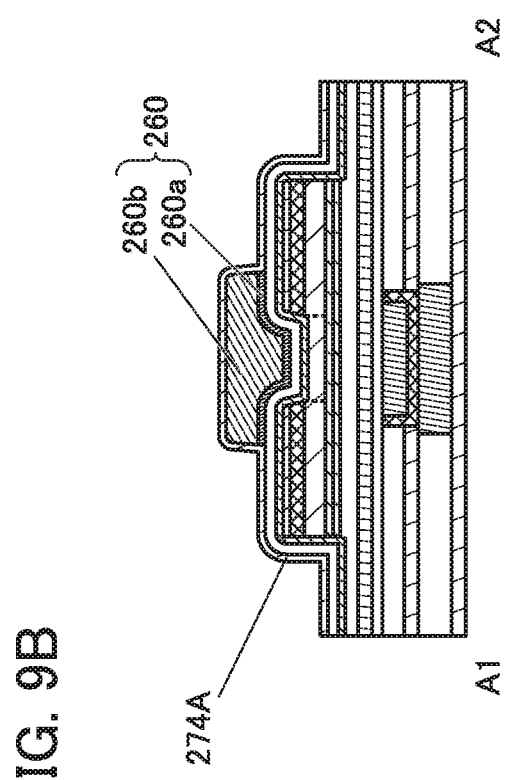
Figure 10A:
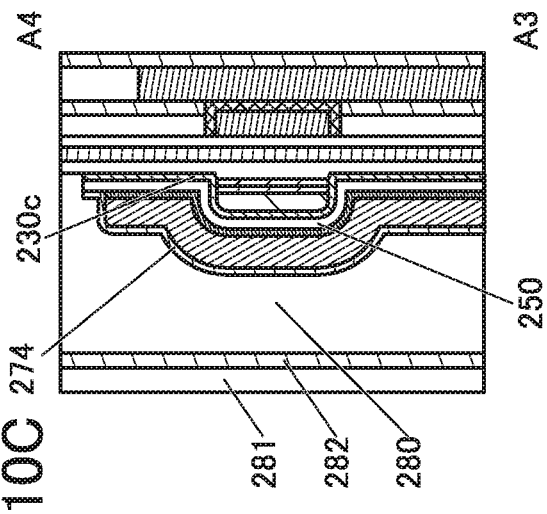
FIGS. 10A-10D A top view and cross-sectional views showing a method for manufacturing a semiconductor device of one embodiment of the present invention.
Figure 10C:
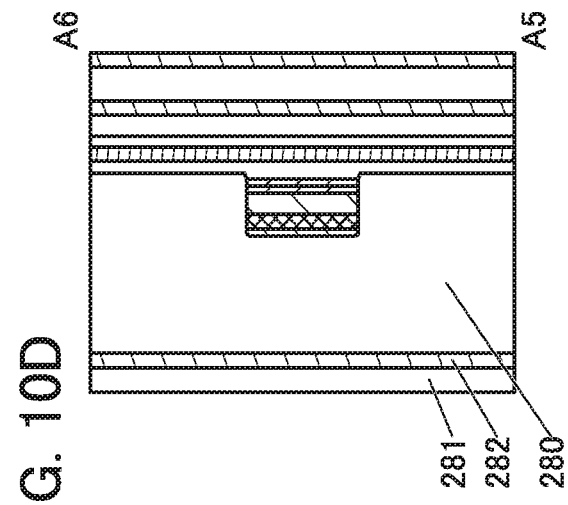
Figure 10B:
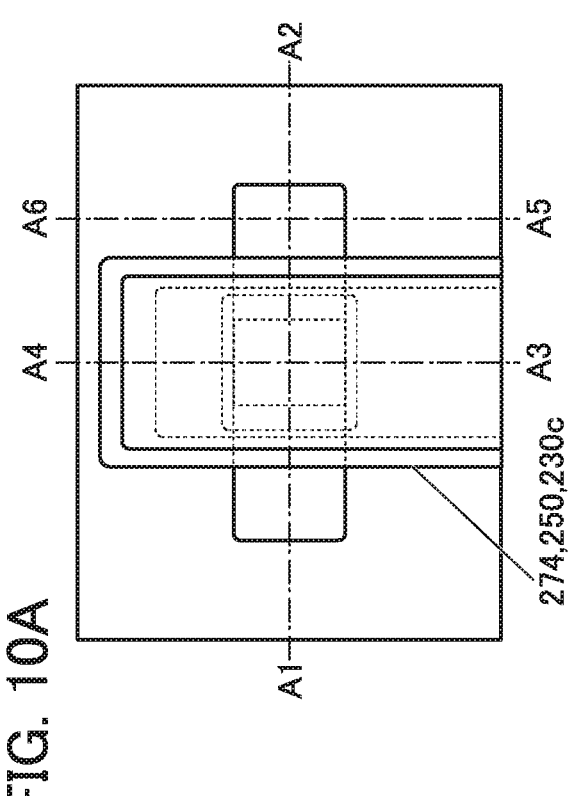
Figure 10D:
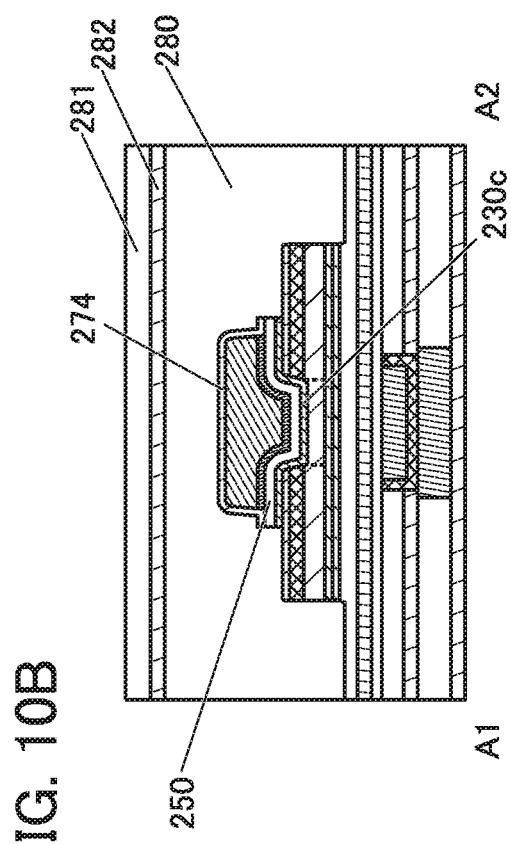

Although FIG. 4(B) shows an example in which the thickness of the region 243 is the same as the total thickness of the oxide 230b and the oxide 230d or the oxide 230e, the present invention is not limited thereto. As shown in FIG. 5(C) and FIG. 5(D), the region 243 may be formed in the oxide 230d or the oxide 230e in the vicinity of the conductor 242. Alternatively, the region 243 may be formed not only in the oxide 230d, the oxide 230e, or the oxide 230b but also in the oxide 230a.

<Manufacturing Method of Semiconductor Device>

Next, a method for manufacturing a semiconductor device including the transistor 200 shown in FIG. 1 will be described with reference to FIG. 6 to FIG. 10. In FIG. 6 to FIG. 10, (A) of each drawing is a top view. Moreover, (B) of each drawing is a cross-sectional view corresponding to a portion indicated by the dashed-dotted line A1-A2 in (A), and is also a cross-sectional view in the channel length direction of the transistor 200. Furthermore, (C) of each drawing is a cross-sectional view corresponding to a portion indicated by the dashed-dotted line A3-A4 in (A), and is also a cross-sectional view in the channel width direction of the transistor 200. In addition, (D) of each drawing is a cross-sectional view corresponding to a portion indicated by the dashed-dotted line A5-A6 in (A), and is also a cross-sectional view in the channel width direction of the transistor 200. Note that for simplification of the drawing, some components are not illustrated in the top view in (A) of each drawing.

First, a substrate (not illustrated) is prepared, and the insulator 210 is formed over the substrate. The insulator 210 can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, such plasma damage is not caused in the case of a thermal CVD method that does not use plasma, and thus the yield of a semiconductor device can be increased. In addition, a thermal CVD method does not cause plasma damage during film formation, so that a film with few defects can be obtained.

An ALD method is also a deposition method that causes less plasma damage to an object. An ALD method also does not cause plasma damage during film formation, so that a film with few defects can be obtained. Note that a precursor used in an ALD method sometimes contains impurities such as carbon. Thus, a film provided by an ALD method sometimes contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable good step coverage almost regardless of the shape of an object. In particular, an ALD method enables excellent step coverage and excellent thickness uniformity, and thus is suitable for the case of covering a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with a flow rate ratio of the source gases. For example, by a CVD method and an ALD method, a film with a certain composition can be formed depending on the flow rate ratio of the source gases. Moreover, with a CVD method and an ALD method, by changing the flow rate ratio of the source gases during the film formation, a film whose composition is continuously changed can be formed, for example. In the case where the film is formed while changing the flow rate ratio of the source gases, as compared with the case where the film is formed using a plurality of deposition chambers, time taken for the film formation can be shortened because time taken for transfer and pressure adjustment is omitted. Thus, productivity of semiconductor devices can be improved in some cases.

In this embodiment, for the insulator 210, aluminum oxide is deposited by a sputtering method. The insulator 210 may have a multilayer structure. For example, a structure may be employed in which aluminum oxide is deposited by a sputtering method and another aluminum oxide is deposited over the aluminum oxide by an ALD method. Alternatively, a structure may be employed in which aluminum oxide is deposited by an ALD method and another aluminum oxide is deposited over the aluminum oxide by a sputtering method.

Next, the insulator 212 is deposited over the insulator 210. The insulator 212 can be deposited by a sputtering method, a CVD method, an MBE method, a PLD method, an ALD method, or the like. In this embodiment, for the insulator 212, silicon oxide is deposited by a CVD method.

Next, an opening reaching the insulator 210 is formed in the insulator 212. Examples of the opening include a groove and a slit. A region where the opening is formed may be referred to as an opening portion. A wet etching method may be used for the formation of the opening; however, a dry etching method is preferable for microfabrication. As the insulator 210, an insulator functioning as an etching stopper film in forming the opening by etching the insulator 212 is preferably selected. For example, in the case where a silicon oxide film is used as the insulator 212 in which the opening is to be formed, a silicon nitride film, an aluminum oxide film, or a hafnium oxide film is preferably used as the insulator 210, which is an insulating film functioning as an etching stopper film.

After the formation of the opening, a conductive film is formed. The conductive film preferably includes a conductor having a function of inhibiting the passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film can be formed by a sputtering method, a CVD method, an MBE method, a PLD method, an ALD method, or the like.

In this embodiment, for the conductive film, tungsten, aluminum, or copper is deposited over tantalum nitride or a stacked film in which titanium nitride is formed over tantalum nitride, by a sputtering method. Even when a metal that is easily diffused, such as copper, is used for a layer over the conductive film, the use of such a metal nitride as part of the conductive film can inhibit diffusion of the metal to the outside of the conductor 203.

Next, part of the conductive film is removed by CMP treatment, so that the insulator 212 is exposed. As a result, the conductor 203 having a flat top surface can be formed only in the opening portion (see FIG. 6). Note that the insulator 212 is partly removed by the CMP treatment in some cases.

Next, the insulator 214 is formed over the insulator 212 and the conductor 203. The insulator 214 can be formed by a sputtering method, a CVD method, an MBE method, a PLD method, an ALD method, or the like. In this embodiment, for the insulator 214, silicon nitride is deposited by a CVD method. As described here, an insulator through which copper is less likely to pass, such as silicon nitride, is used as the insulator 214; accordingly, even when a metal that is easily diffused, such as copper, is used for part of the conductor 203, the metal can be inhibited from being diffused into a layer above the insulator 214.

Next, the insulator 216 is formed over the insulator 214. The insulator 216 can be formed by a sputtering method, a CVD method, an MBE method, a PLD method, an ALD method, or the like. In this embodiment, for the insulator 216, silicon oxide is deposited by a CVD method.

Next, an opening reaching the conductor 203 is formed in the insulator 214 and the insulator 216. A wet etching method may be used for the formation of the opening; however, a dry etching method is preferable for microfabrication.

After the formation of the opening, a conductive film to be the conductor 205a is formed. The conductive film preferably includes a conductive material having a function of inhibiting the passage of oxygen. For example, tantalum nitride, tungsten nitride, or titanium nitride can be used. Alternatively, a stacked-layer film of the conductive material and tantalum, tungsten, titanium, molybdenum, aluminum, copper, or a molybdenum-tungsten alloy can be used. The conductive film to be the conductor 205a can be formed by a sputtering method, a CVD method, an MBE method, a PLD method, an ALD method, or the like.

In this embodiment, for the conductive film to be the conductor 205a, tantalum nitride is deposited by a sputtering method.

Next, a conductive film to be the conductor 205b is formed over the conductive film to be the conductor 205a. The conductive film can be formed by a sputtering method, a CVD method, an MBE method, a PLD method, an ALD method, or the like.

In this embodiment, for the conductive film to be the conductor 205b, titanium nitride is deposited by a CVD method and tungsten is deposited over the titanium nitride by a CVD method.

Next, parts of the conductive film to be the conductor 205a and the conductive film to be the conductor 205b are removed by CMP treatment, so that the insulator 216 is exposed. As a result, the conductive films to be the conductor 205a and the conductor 205b remain only in the opening portion. Thus, the conductor 205 including the conductor 205a and the conductor 205b, which has a flat top surface can be formed (see FIG. 6). Note that the insulator 216 is partly removed by the CMP treatment in some cases.

Next, the insulator 220 is formed over the insulator 216 and the conductor 205. The insulator 220 can be formed by a sputtering method, a CVD method, an MBE method, a PLD method, an ALD method, or the like. In this embodiment, for the insulator 220, silicon oxide is deposited by a CVD method.

Next, the insulator 222 is formed over the insulator 220. An insulator containing an oxide of one or both of aluminum and hafnium is preferably formed as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from being diffused into the transistor 200 through the insulator 222, and generation of oxygen vacancies in the oxide 230 can be inhibited.

The insulator 222 can be formed by a sputtering method, a CVD method, an MBE method, a PLD method, an ALD method, or the like.

Next, the insulator 224 is formed over the insulator 222. The insulator 224 can be formed by a sputtering method, a CVD method, an MBE method, a PLD method, an ALD method, or the like. In this embodiment, for the insulator 224, silicon oxide is deposited by a CVD method.

Subsequently, heat treatment is preferably performed. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in a nitrogen or inert gas atmosphere, and then another heat treatment is performed in an atmosphere containing an oxidizing gas at 10 ppm or more, 1% or more, or 10% or more in order to compensate for released oxygen.

In this embodiment, heat treatment is performed in a nitrogen atmosphere at 400° C. for one hour after the formation of the insulator 224. Through the above heat treatment, impurities such as hydrogen and water contained in the insulator 224 can be removed, for example.

The heat treatment can also be performed after the formation of the insulator 220 and after the formation of the insulator 222. Although the conditions for the above-described heat treatment can be used for the heat treatment, the heat treatment after the formation of the insulator 220 is preferably performed in a nitrogen-containing atmosphere.

Here, in order that a region containing oxygen that is released by heating can be formed in the insulator 224, oxygen may be supplied to the insulator 224 by one or more methods selected from an ion implantation method, an ion doping method, plasma treatment, and a plasma immersion ion implantation method. In that case, an ion implantation method by which an ionized source gas is subjected to mass separation and then added is preferably used, in which case oxygen can be supplied to the insulator 224 with high controllability.

Note that instead of the above-described method, plasma treatment with oxygen may be performed under a reduced pressure. The plasma treatment with oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment with an inert gas is performed with this apparatus, plasma treatment with oxygen may be performed to compensate for released oxygen. Note that impurities such as hydrogen and water contained in the insulator 224 can be removed by selecting the conditions for the plasma treatment appropriately. In that case, the heat treatment is not necessarily performed.

Next, an oxide film 230A1 to be the oxide 230*a*1, an oxide film 230A2 to be the oxide 230*a*2, and an oxide film 230B to be the oxide 230*b* are formed in this order over the insulator 224 (see FIG. 6). Note that the oxide films are preferably formed successively without exposure to an air atmosphere. By the film formation without exposure to the air, impurities or moisture from the air atmosphere can be prevented from being attached to the top surfaces of the oxide film 230A1, the oxide film 230A2, and the oxide film 230B, so that the vicinities of an interface between the oxide film 230A1 and the oxide film 230A2 and an interface between the oxide film 230A2 and the oxide film 230B can be kept clean.

The oxide film 230A1, the oxide film 230A2, and the oxide film 230B can be formed by a sputtering method, a CVD method, an MBE method, a PLD method, an ALD method, or the like.

The oxide film 230A1, the oxide film 230A2, and the oxide film 230B are preferably formed by a sputtering method, and oxygen or a mixed gas of oxygen and a rare gas is used as a sputtering gas. Increasing the proportion of oxygen contained in the sputtering gas can increase the amount of oxygen in the oxide film to be formed and can improve the crystallinity of the oxide film. In addition, when the film is formed while the substrate is heated, the crystallinity of the oxide film can be improved.

In addition, in the case where the oxide film 230A1, the oxide film 230A2, and the oxide film 230B are formed by a sputtering method, the above-described metal oxide target can be used. However, in the case where the metal oxide is formed with a sputtering apparatus, for example, a film having an atomic ratio deviated from the atomic ratio of the target is formed. In particular, [Zn] in the film might be smaller than [Zn] in the target depending on the substrate temperature in film formation.

Moreover, increasing the purity of a sputtering gas is preferable. For example, as an oxygen gas or a rare gas used as a sputtering gas, a gas that is highly purified to have a dew point of −60° C. or lower, preferably −100° C. or lower is used. When the highly purified sputtering gas is used for film formation, entry of moisture or the like into the oxide 230 can be prevented as much as possible.

Furthermore, in the case where the oxide film 230A1, the oxide film 230A2, and the oxide film 230B are formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of about $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

In particular, when the oxide film 230A1 is formed, part of oxygen contained in the sputtering gas is supplied to the insulator 224 in some cases. Thus, the proportion of oxygen contained in the sputtering gas for the oxide film 230A1 is preferably 70% or higher, further preferably 80% or higher, and still further preferably 100%.

When the oxide film 230A2 is formed using a sputtering gas containing nitrogen, the oxide film 230A2 can be an oxide film containing nitrogen. The proportion of nitrogen contained in the sputtering gas for the oxide film 230A2 is higher than or equal to 5% and lower than or equal to 50%, preferably higher than or equal to 5% and lower than or equal to 30%, further preferably higher than or equal to 10% and lower than or equal to 20%.

In the case where the oxide film 230B is formed by a sputtering method and the proportion of oxygen contained in the sputtering gas is 10% or higher, preferably 30% or higher during the film formation, the oxide film 230B can be the above-described CAAC-OS film.

In this embodiment, the oxide film 230A1 is formed by a sputtering method using a target with In:Ga:Zn=1:3:4 [atomic ratio], a target with In:Ga:Zn=1:1:0.5 [atomic ratio], or a target with In:Ga:Zn=1:3:2 [atomic ratio]. The oxide film 230A2 is formed by a sputtering method using a target with In:Ga:Zn=1:3:4 [atomic ratio], a target with In:Ga:Zn=1:1:0.5 [atomic ratio], or a target with In:Ga:Zn=1:3:2 [atomic ratio] in a nitrogen-containing atmosphere. The oxide film 230B is formed by a sputtering method using a target with In:Ga:Zn=4:2:4.1 [atomic ratio]. Note that each of the oxide films is preferably formed to have characteristics required for the oxide 230 by appropriate selection of deposition conditions and an atomic ratio.

Next, heat treatment may be performed. For the heat treatment, the conditions for the above-described heat treatment can be used. Through the heat treatment, impurities such as hydrogen and water contained in the oxide film 230A1, the oxide film 230A2, and the oxide film 230B can be removed, for example. In this embodiment, treatment is performed in a nitrogen atmosphere at 400° C. for one hour, and successively another treatment is performed in an oxygen atmosphere at 400° C. for one hour.

Next, a conductive film 242A is formed over the oxide film 230B. For the conductive film 242A, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, ruthenium containing aluminum, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. The conductive film 242A may have a stacked-layer structure of two or more layers; tantalum, titanium, tungsten, tantalum nitride, or titanium nitride may be stacked over ruthenium containing aluminum, or ruthenium or ruthenium containing aluminum may be stacked over aluminum. Note that the conductive film 242A can be formed by a sputtering method, a CVD method, an MBE method, a PLD method, an ALD method, or the like.

Next, an insulating film 273A is formed over the conductive film 242A (see FIG. 6). An insulator containing an oxide of one or both of aluminum and hafnium is preferably formed as the insulating film 273A. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. The insulating film 273A having a barrier property against hydrogen and water can inhibit oxidation of the conductive film 242A.

The insulating film 273A can be formed by a sputtering method, a CVD method, an MBE method, a PLD method, an ALD method, or the like.

Next, parts of the oxide film 230A1, the oxide film 230A2, the oxide film 230B, the conductive film 242A, and the insulating film 273A are selectively removed by a lithography method, whereby the island-shaped oxide 230a1 and oxide 230a2 (oxide 230a) and oxide 230b, the conductor 242a and the conductor 242b over the oxide 230b, and the insulator 273a and the insulator 273b over the conductor 242a and the conductor 242b, respectively, are formed (see FIG. 7). In this processing, a conductor positioned between the conductor 242a and the conductor 242b and an insulator positioned between the insulator 273a and the insulator 273b may be removed after the oxide film 230A1, the oxide film 230A2, the oxide film 230B, the conductive film 242A, and the insulating film 273A are processed into island shapes, or the oxide film 230A1, the oxide film 230A2, the oxide film 230B, the conductive film 242A, and the insulating film 273A may be processed into island shapes after the conductor positioned between the conductor 242a and the conductor 242b and the insulator positioned between the insulator 273a and the insulator 273b are removed. The oxide film 230A1, the oxide film 230A2, the oxide film 230B, the conductive film 242A, and the insulating film 273A can be selectively removed by a dry etching method or a wet etching method. The processing by a dry etching method is suitable for microfabrication. Note that the insulator 224 is partly removed by the processing in some cases.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light such as KrF excimer laser light, ArF excimer laser light, or EUV (Extreme Ultraviolet) light. Alternatively, a liquid immersion technique may be employed in which a portion between a substrate and a projection lens is filled with liquid (e.g., water) to perform light exposure. Furthermore, an electron beam or an ion beam may be used instead of the above-described light. Note that the above mask for the exposure of the resist to light is unnecessary in the case of using an electron beam or an ion beam because direct writing is performed on the resist. Note that the resist mask can be removed by, for example, dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed in the following manner: an insulating film or a conductive film that is the hard mask material is formed over the constituent material, a resist mask is formed thereover, and then the hard mask material is etched. The constituent material may be etched after removal of the resist mask or while the resist mask remains. In the latter case, the resist mask sometimes disappears during the etching. The hard mask may be removed by etching after the constituent material is etched. The hard mask does not need to be removed in the case where the hard mask material does not affect the following process or can be utilized in the following process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Here, the oxide $230a$ (the oxide $230a1$ and the oxide $230a2$) and the oxide $230b$ are formed to at least partly overlap with the conductor $205$. It is preferable that side surfaces of the oxide $230a$ and the oxide $230b$ be substantially perpendicular to a top surface of the insulator $222$. When the side surfaces of the oxide $230a$ and the oxide $230b$ are substantially perpendicular to the top surface of the insulator $222$, the plurality of transistors $200$ can be provided in a smaller area and at a higher density. Note that a structure may be employed in which an angle formed by the side surfaces of the oxide $230a$ and the oxide $230b$ and the top surface of the insulator $222$ is an acute angle. In that case, the angle formed by the side surfaces of the oxide $230a$ and the oxide $230b$ and the top surface of the insulator $222$ is preferably larger.

There is a curved surface between the side surfaces of the oxide $230a$, the oxide $230b$, the conductor $242$, and the insulator $273$ and the top surface of the insulator $273$. That is, end portions of the side surfaces and an end portion of the top surface are preferably curved (such a shape is hereinafter also referred to as a rounded shape). The radius of curvature of the curved surface at an end portion of the insulator $273$ is greater than or equal to 3 nm and less than or equal to 10 nm, preferably greater than or equal to 5 nm and less than or equal to 6 nm, for example. When the end portions are not angular, the coverage with films deposited in a later step can be improved. In that case, the curved surface may also be formed on the side surfaces of the conductor $242$ and the oxide $230b$.

In some cases, the treatment such as dry etching causes the attachment or diffusion of impurities due to an etching gas or the like to the side surfaces, the top surfaces, or the inside of the oxide $230a$, the oxide $230b$, the conductor $242$, and the like. Examples of the impurities include fluorine and chlorine.

In order to remove the above impurities or the like, cleaning is preferably performed. Examples of the cleaning method include wet cleaning using a cleaning solution, plasma treatment using plasma, and cleaning by heat treatment, and any of these cleanings may be performed in appropriate combination.

As the wet cleaning, cleaning treatment may be performed using an aqueous solution obtained by diluting an oxalic acid, a phosphoric acid, hydrogen peroxide water, a hydrofluoric acid, or the like with pure water or carbonated water. Alternatively, ultrasonic cleaning using pure water or carbonated water may be performed. In this embodiment, the ultrasonic cleaning using pure water or carbonated water is performed.

Subsequently, heat treatment may be performed. For the heat treatment, the conditions for the above-described heat treatment can be used. Note that in the case where the heat treatment might cause oxidation of the conductor $242$, the heat treatment is preferably performed in an atmosphere containing no oxygen. In the case where the conductor $242$ contains an oxidation-resistant material, the heat treatment may be performed in an oxygen-containing atmosphere.

Through the heat treatment, impurities such as hydrogen and water contained in the oxide $230a$ and the oxide $230b$ can be removed. Furthermore, damages that have been caused in the oxide $230a$ or the oxide $230b$ by the dry etching in the above processing can be recovered. In the case where the heat treatment is performed in an oxygen-containing atmosphere, oxygen can be added to the oxide $230a$ and the oxide $230b$.

Through the heat treatment, the metal element is diffused from the conductor $242$ into the oxide $230$; thus, the metal element can be added to the oxide $230$. Moreover, oxygen in the oxide $230$ in the vicinity of the interface with the conductor $242$ may be absorbed by the conductor $242$. As a result, the oxide $230$ in the vicinity of the interface with the conductor $242$ becomes a metal compound and the resistance thereof is reduced. At this time, part of the oxide $230$ may be alloyed with the metal element. When part of the oxide $230$ is alloyed with the metal element, the metal element added to the oxide $230$ is brought into a relatively stable state; therefore, a highly reliable semiconductor device can be provided. Note that in FIG. 7(B), the region $243a$ and the region $243b$ are shown by dotted lines as examples of the above-described low-resistance region of the oxide $230$.

The region $243$ (the region $243a$ and the region $243b$) is provided to spread in the depth direction of the oxide $230b$ in the shown example; however, the present invention is not limited thereto. In the depth direction, the region $243$ may be formed only in the vicinity of the conductor $242$ or may be formed in the oxide $230a$. The region $243$ is formed only in a region overlapping with the conductor $242$ in the horizontal direction in the shown example; however, the present invention is not limited thereto. The region $243$ may be formed in a region spreading from the conductor $242$ in the horizontal direction.

In the case where hydrogen in the oxide $230$ is diffused into the region $243$ and enters an oxygen vacancy in the region $243$, the hydrogen becomes relatively stable. Hydrogen in an oxygen vacancy in the region $234$ is released from the oxygen vacancy by heat treatment at higher than or equal to 250° C. and diffused into the region $243$, enters an oxygen vacancy in the region $243$, and becomes relatively stable.

Thus, by the heat treatment, the resistance of the region 243 is further reduced, and the region 234 is highly purified (reduction of impurities such as water and hydrogen) and the resistance of the region 234 is further increased.

Alternatively, heat treatment may be performed in a nitrogen or inert gas atmosphere, and then another heat treatment may be performed in an atmosphere containing an oxidizing gas at 10 ppm or more, 1% or more, or 10% or more. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C.

Next, an oxide film 230C is formed over the insulator 224, the oxide 230a, the oxide 230b, the conductor 242, and the insulator 273 (see FIG. 8).

The oxide film 230C can be formed by a sputtering method, a CVD method, an MBE method, a PLD method, an ALD method, or the like. The oxide film 230C is formed by a method similar to that for the oxide film 230A or the oxide film 230B in accordance with characteristics required for the oxide 230c. For example, as for the oxide film 230A, the proportion of oxygen contained in the sputtering gas for the oxide film 230A is higher than or equal to 70%, preferably higher than or equal to 80%, further preferably 100%. In this embodiment, the oxide film 230C is formed by a sputtering method using a target with In:Ga:Zn=4:2:4.1 [atomic ratio] or a target with In:Ga:Zn=5:1:7 [atomic ratio].

Then, an insulating film 250A is formed over the oxide film 230C (see FIG. 8).

The insulating film 250A can be formed by a sputtering method, a CVD method, an MBE method, a PLD method, an ALD method, or the like. For the insulating film 250A, silicon oxynitride is preferably deposited by a CVD method. Note that the film formation temperature at the time of the formation of the insulating film 250A is preferably higher than or equal to 350° C. and lower than 450° C., particularly preferably approximately 400° C. When the insulating film 250A is formed at 400° C., an insulator having few impurities can be formed.

Before the insulating film 250A is formed, heat treatment is preferably performed in the deposition apparatus for the insulating film 250A. Here, as the heat treatment, the above-described vacuum baking is preferably performed. The heat treatment performed in this manner can remove zinc atoms and oxygen atoms that form weak Zn—O bonds in the oxide 230, thereby improving the reliability of the transistor 200. In addition, when the heat treatment and film formation are successively performed in the same deposition apparatus without exposure to the outside air, the oxide 230 can be covered with the insulating film 250A without entry of impurities such as water. Furthermore, when heat treatment and deposition treatment are performed in different chambers of a multi-chamber deposition apparatus, the insulating film 250A can be formed without being influenced by impurities such as water and zinc released by the heat treatment.

Furthermore, heat treatment may be performed after the formation of the insulating film 250A. For the heat treatment, the conditions for the above-described heat treatment can be used. The heat treatment can reduce the moisture concentration and the hydrogen concentration in the insulating film 250A.

Then, a conductive film 260A and a conductive film 260B are sequentially formed (see FIG. 8). The conductive film 260A and the conductive film 260B can be formed by a sputtering method, a CVD method, an MBE method, a PLD method, an ALD method, or the like. Titanium nitride may be deposited for the conductive film 260A, and tungsten may be deposited for the conductive film 260B, for example.

For the conductive film 260A, a metal nitride is preferably formed by a CVD method or a sputtering method. With the use of a metal nitride for the conductive film 260A, the conductivity of the conductive film 260B can be prevented from being lowered because of oxidation due to oxygen contained in the insulating film 250A.

Furthermore, when a low-resistance metal film is stacked as the conductive film 260B, a transistor with a low driving voltage can be provided.

Subsequently, heat treatment can be performed. For the heat treatment, the conditions for the above-described heat treatment can be used. Note that the heat treatment is not necessarily performed in some cases. Through this heat treatment, a low-resistance region is sometimes formed in the oxide 230b.

Next, parts of the conductive film 260A and the conductive film 260B are selectively removed by a photolithography method, so that the conductor 260a and the conductor 260b are formed (see FIG. 9). The conductive film 260A and the conductive film 260B can be etched by a dry etching method or a wet etching method. A dry etching method is suitable for microfabrication.

Next, an insulating film 274A is formed to cover the insulator 250 and the conductor 260 (the conductor 260a and the conductor 260b) (see FIG. 9). The insulating film 274A can be formed by a sputtering method, a CVD method, an MBE method, a PLD method, an ALD method, or the like. The insulating film 274A is preferably formed by an ALD method. An ALD method, which achieves good coverage, can prevent disconnection or the like due to unevenness caused by the oxide 230, the conductor 260, and the like.

The insulating film 274A preferably functions as an insulating barrier, and an insulator containing an oxide of one or both of aluminum and hafnium is preferably formed. Note that as the insulator containing an oxide of one or both of aluminum and hafnium, aluminum oxide, hafnium oxide, an oxide containing aluminum and hafnium (hafnium aluminate), or the like is preferably used. The insulating film 274A having a barrier property can inhibit entry of oxygen from above the insulating film 274A into the conductor 260.

Next, parts of the insulating film 274A, the insulating film 250A, and the oxide film 230C are selectively removed by a photolithography method, whereby the insulator 274, the insulator 250, and the oxide 230c are formed (see FIG. 10). The insulating film 274A, the insulating film 250A, and the oxide film 230C can be etched by a dry etching method or a wet etching method. The processing by a dry etching method is suitable for microfabrication.

Next, the insulator 280 is formed over the insulator 224, the oxide 230, the conductor 242, the insulator 273, the insulator 250, the conductor 260, and the insulator 274 (see FIG. 10). The insulator 280 preferably includes an insulator with a low dielectric constant. For example, the insulator 280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide, silicon oxynitride, silicon nitride oxide, or porous silicon oxide is preferably used for the insulator 280, in which case a region containing oxygen that is released by heating can be easily formed in the insulator 280 in a later step. Furthermore, silicon oxide and silicon oxynitride, which have thermal stability, are preferable. The insulator 280 can be formed by a sputtering method, a CVD method, an MBE method, a PLD method, an ALD method, or the like. Alternatively, the insulator 280 can be formed by a spin coating method, a dipping method, a droplet discharging method (e.g., an ink-jet method), a printing method (e.g., screen printing or offset printing), a doctor knife method, a roll coater method, a curtain coater method, or the like. In this embodiment, silicon oxynitride is deposited as the insulator 280 by a CVD method.

Note that the insulator 280 is preferably formed to have a flat top surface. For example, the insulator 280 may have a flat top surface right after the formation. Alternatively, for example, the insulator 280 may have flatness by removing an insulator or the like from the top surface after the formation so that the top surface becomes parallel to a reference surface such as a rear surface of the substrate. Such treatment is referred to as planarization treatment. Examples of the planarization treatment include CMP treatment and dry etching treatment. In this embodiment, CMP treatment is used as the planarization treatment. Note that the insulator 280 does not necessarily have a flat top surface.

Next, the insulator 282 is formed over the insulator 280 (see FIG. 10). The insulator 282 is preferably formed by a sputtering method in an oxygen-containing atmosphere. For the insulator 282, an insulating material through which impurities such as water and hydrogen are less likely to pass is preferably used. For the insulator 282, an oxide of one or both of aluminum and hafnium that has a barrier property is preferably used, for example. In this embodiment, as the insulator 282, an aluminum oxide film is formed by a sputtering method in an oxygen-containing atmosphere.

The insulator 282 is formed by a sputtering method in an oxygen-containing atmosphere, whereby oxygen can be introduced into the insulator 280 during the formation. Although oxygen is added as an oxygen radical here, for example, the state of oxygen at the time of being added is not limited thereto. Oxygen may be added in the state of an oxygen atom, an oxygen ion, or the like. Heat treatment in a later step can diffuse oxygen such that oxygen can be supplied to the oxide 230 effectively.

Note that the insulator 282 is preferably formed while the substrate is heated. The substrate heating is preferably performed at higher than 100° C. and lower than or equal to 300° C. The substrate heating is further preferably performed at higher than or equal to 120° C. and lower than or equal to 250° C. When the substrate temperature is higher than 100° C., water in the oxide 230 can be removed. Furthermore, water can be prevented from adsorbing on the surface of the formed film. Moreover, when the insulator 282 is formed while the substrate is heated in this manner, oxygen can be diffused into the insulator 224, the insulator 250, and the oxide 230 from the insulator 280 during the formation.

When the transistor 200 is interposed between the insulator 282 and the insulator 222, a large amount of oxygen can be contained in the insulator 280, the insulator 224, the insulator 250, and the oxide 230 without outward diffusion of oxygen. Moreover, impurities such as water and hydrogen can be prevented from entering from above the insulator 282 and from below the insulator 222; thus, the impurity concentration in the insulator 280, the insulator 224, and the oxide 230 can be lowered.

Subsequently, heat treatment is performed. The heat treatment is performed at higher than or equal to 250° C. and lower than or equal to 650° C., preferably higher than or equal to 300° C. and lower than or equal to 500° C. The heat treatment is performed in an oxygen atmosphere. Alternatively, the heat treatment is performed in an inert gas atmosphere or an atmosphere containing an oxidizing gas at 10 ppm or more, 1% or more, or 10% or more. Here, as the inert gas, for example, a nitrogen gas or a rare gas can be used. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for released oxygen. In this embodiment, the heat treatment is performed in an oxygen gas atmosphere at 400° C. for one hour.

Next, the insulator 281 is formed over the insulator 282. The insulator 281 can be formed by a sputtering method, a CVD method, an MBE method, a PLD method, an ALD method, or the like. Alternatively, a spin coating method, a dipping method, a droplet discharging method (e.g., an ink-jet method), a printing method (e.g., screen printing or offset printing), a doctor knife method, a roll coater method, a curtain coater method, or the like can be used. In this embodiment, for the insulator 281, silicon oxynitride is used.

Next, openings reaching the conductor 242 are formed in the insulator 281, the insulator 282, the insulator 280, and the insulator 273, and an opening reaching the conductor 260 is formed in the insulator 281, the insulator 282, the insulator 280, and the insulator 274. The openings are formed by a lithography method.

Next, the insulator 276 functioning as an insulating barrier may be formed on the inner walls of the openings. The insulator 276 can be formed in such a manner that an insulating film is formed in the openings and on the top surface of the insulator 281 and then etch-back processing is performed by anisotropic etching to remove the insulating film on the bottom of the openings and the insulating film on the insulator 281. Next, conductive films to be the first conductor of the conductor 240 and the second conductor of the conductor 240 are formed. The conductive films can be formed by a sputtering method, a CVD method, an MBE method, a PLD method, an ALD method, or the like.

Next, parts of the conductive films to be the conductor 240*a*, the conductor 240*b*, and the conductor 240*c* are removed by CMP treatment, so that the insulator 281 is exposed. As a result, the conductive films remain only in the openings, so that the conductor 240*a*, the conductor 240*b*, and the conductor 240*c* having flat top surfaces can be formed (see FIG. 1). Note that the insulator 281 is partly removed by the CMP treatment in some cases.

Then, the conductor 256 that is electrically connected to the conductor 240 and functions as a wiring may be provided.

Through the above process, the semiconductor device including the transistor 200 shown in FIG. 1 can be manufactured. As shown in FIG. 6 to FIG. 10, with the use of the method for manufacturing the semiconductor device described in this embodiment, the transistor 200 having favorable electrical characteristics and high reliability can be formed.

According to one embodiment of the present invention, a highly reliable semiconductor device can be provided. According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with a low off-state current can be provided. According to one embodiment of the present invention, a semiconductor device with a high on-state current can be provided. According to one embodiment of the present invention, a semiconductor device with reduced power consumption can be provided. According to one embodiment of the present invention, a semiconductor device with high productivity can be provided.

The structure, composition, method, and the like described above in this embodiment can be used in appropriate combination with the structures, compositions, methods, and the like described in the other embodiments and examples.

Embodiment 2

In this embodiment, one embodiment of a semiconductor device functioning as a memory device 1 will be described with reference to FIG. 11.

<Memory Device 1>

Figure 11A:
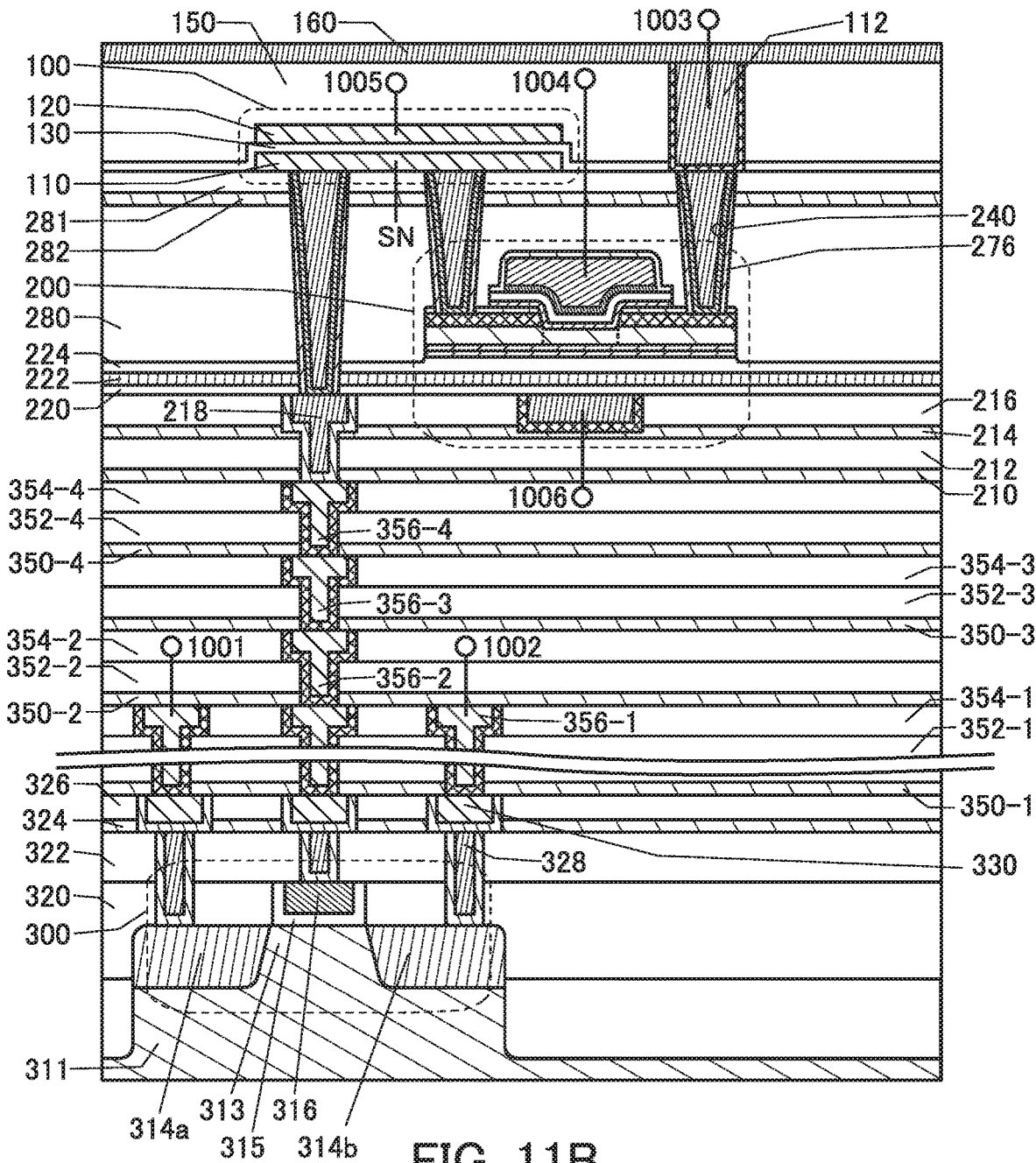
FIGS. 11A-11B A cross-sectional view showing a structure of a memory device of one embodiment of the present invention.
Figure 11B:
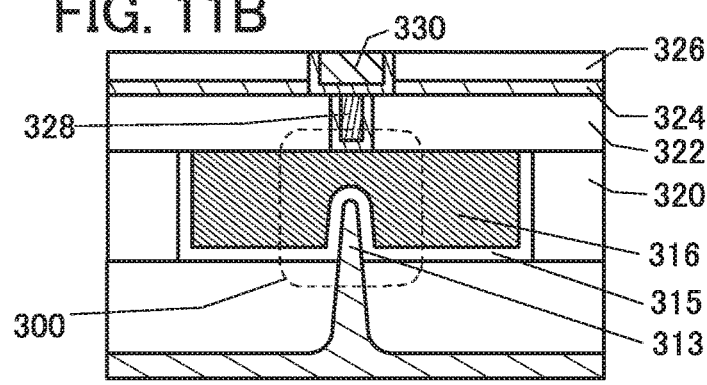

A memory device shown in FIG. 11(A) includes a transistor 300, the transistor 200, and a capacitor 100. FIG. 11(A) is a cross-sectional view of the transistor 200 and the transistor 300 in the channel length direction. FIG. 11(B) shows a cross-sectional view of the vicinity of the transistor 300 in the channel width direction of the transistor 300. Note that the memory device including the transistor 300, the transistor 200, and the capacitor 100 will be described below.

The transistor 200 is a transistor in which a channel is formed in a semiconductor layer including an oxide semiconductor. Since the off-state current of the transistor 200 is low, a memory device including the transistor 200 can retain stored data for a long time. In other words, such a memory device does not require refresh operation or has an extremely low frequency of the refresh operation, which leads to a sufficient reduction in power consumption of the memory device.

In the memory device shown in FIG. 11(A), a wiring 1001 is electrically connected to a source of the transistor 300, and a wiring 1002 is electrically connected to a drain of the transistor 300. A wiring 1003 is electrically connected to one of the source and the drain of the transistor 200, a wiring 1004 is electrically connected to a top gate of the transistor 200, and a wiring 1006 is electrically connected to a bottom gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The memory device shown in FIG. 11(A) has a feature that the gate potential of the transistor 300 can be retained and thus enables writing, retaining, and reading of data as follows.

Writing and retaining of data are described. First, the potential of the wiring 1004 is set to a potential at which the transistor 200 is brought into a conduction state, so that the transistor 200 is brought into a conduction state. Accordingly, the potential of the wiring 1003 is supplied to a node SN to which the gate of the transistor 300 and one electrode of the capacitor 100 are electrically connected. That is, a predetermined charge is supplied to the gate of the transistor 300 (writing). Here, one of two kinds of charges providing different potential levels (hereinafter, referred to as a Low-level charge and a High-level charge) is supplied. After that, the potential of the wiring 1004 is set to a potential at which the transistor 200 is brought into a non-conduction state, so that the transistor 200 is brought into a non-conduction state. Thus, the charge is retained in the node SN (retaining).

In the case where the off-state current of the transistor 200 is low, the charge in the node SN is retained for a long time.

Next, reading of data is described. An appropriate potential (reading potential) is supplied to the wiring 1005 while a predetermined potential (constant potential) is supplied to the wiring 1001, whereby the wiring 1002 has a potential corresponding to the amount of charge retained in the node SN. This is because when the transistor 300 is of an n-channel type, an apparent threshold voltage $V_{th\_H}$ at the time when the High-level charge is supplied to the gate of the transistor 300 is lower than an apparent threshold voltage $V_{th\_L}$ at the time when the Low-level charge is supplied to the gate of the transistor 300. Here, an apparent threshold voltage refers to the potential of the wiring 1005 which is needed to bring the transistor 300 into a conduction state. Thus, the potential of the wiring 1005 is set to a potential $V_0$ which is between $V_{th\_H}$ and $V_{th\_L}$, whereby the charge supplied to the node SN can be determined. For example, in the case where the High-level charge is supplied to the node SN in writing and the potential of the wiring 1005 is $V_0$ ($>V_{th\_H}$), the transistor 300 is brought into a conduction state. Meanwhile, in the case where the Low-level charge is supplied to the node SN, the transistor 300 remains in a non-conduction state even when the potential of the wiring 1005 is $V_0$ ($<V_{th\_L}$). Thus, the data retained in the node SN can be read by determining the potential of the wiring 1002.

Note that in the case where memory cells are arranged in an array, data of a desired memory cell needs to be read at the time of reading. For example, in the case where a memory cell array has a NOR-type structure, only data of a desired memory cell can be read by bringing the transistors 300 of memory cells from which data is not read into a non-conduction state. In that case, a potential at which the transistor 300 is brought into a non-conduction state regardless of the charge supplied to the node SN, that is, a potential lower than $V_{th\_H}$, is supplied to the wiring 1005 connected to the memory cells from which data is not read. Alternatively, in the case where a memory cell array has a NAND-type structure, for example, only data of a desired memory cell can be read by bringing the transistors 300 of memory cells from which data is not read into a conduction state. In that case, a potential at which the transistor 300 is brought into a conduction state regardless of the charge supplied to the node SN, that is, a potential higher than $V_{th\_L}$, is supplied to the wiring 1005 connected to the memory cells from which data is not read.

<Structure of Memory Device 1>

The memory device of one embodiment of the present invention includes the transistor 300, the transistor 200, and the capacitor 100 as shown in FIG. 11(A). The transistor 200 is provided above the transistor 300. The capacitor 100 is provided above the transistor 300 and the transistor 200.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As shown in FIG. 11(B), in the transistor 300, a top surface and a side surface in the channel width direction of the semiconductor region 313 are covered with the conductor 316 with the insulator 315 therebetween. When the transistor 300 is such a Fin-type transistor, the effective channel width is increased, whereby the on-state characteristics of the transistor 300 can be improved. In addition, since contribution of an electric field of a gate electrode can be increased, the off-state characteristics of the transistor 300 can be improved.

The transistor 300 is either a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is adjusted by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing the element that imparts n-type conductivity, such as arsenic or phosphorus, or the element that imparts p-type conductivity, such as boron, or using a conductive material such as a metal material, an alloy material, or a metal oxide material.

Note that the work function depends on a material of the conductor; thus, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use a stacked layer of metal materials such as tungsten and aluminum for the conductor, and it is particularly preferable to use tungsten in terms of heat resistance.

Note that the transistor 300 shown in FIG. 11 is only an example and the structure is not limited thereto; a transistor appropriate for a circuit configuration or a driving method can be used.

An insulator 320, an insulator 322, an insulator 324, and an insulator 326 are stacked sequentially to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for eliminating a level difference caused by the transistor 300 or the like underlying the insulator 322. For example, a top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 200 is provided.

For the film having a barrier property against hydrogen, silicon nitride formed by a CVD method can be used, for example. The diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 or less times the dielectric constant of the insulator 324, further preferably 0.6 or less times the dielectric constant of the insulator 324. When a material with a low permittivity is used for an interlayer film, the parasitic capacitance generated between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

As a material of each of the plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

One or more wiring layers may be provided over the insulator 326 and the conductor 330. For example, in FIG. 11(A), an insulator 350 (an insulator 350-1, an insulator 350-2, an insulator 350-3, and an insulator 350-4), an insulator 352 (an insulator 352-1, an insulator 352-2, an insulator 352-3, and an insulator 352-4), and an insulator 354 (an insulator 354-1, an insulator 354-2, an insulator 354-3, and an insulator 354-4) are stacked sequentially. A conductor 356 (a conductor 356-1, a conductor 356-2, a conductor 356-3, and a conductor 356-4) is formed in the insulator 350, the insulator 352, and the insulator 354. The conductor 356 has a function of a plug or a wiring. Note that the conductor 356 can be formed using a material similar to those of the conductor 328 and the conductor 330.

Like the insulator 324, the insulator 350 is preferably formed using an insulator having a barrier property against hydrogen, for example. A material similar to that for the insulator 326 can be used for the insulator 352 and the insulator 354. Furthermore, the conductor 356 preferably contains a conductor having a barrier property against hydrogen. In particular, the conductor having a barrier property against hydrogen is formed in an opening portion of the insulator 350 having a barrier property against hydrogen. In such a structure, the transistor 300 and the transistor 200 can be separated by a barrier layer, so that the diffusion of hydrogen from the transistor 300 to the transistor 200 can be prevented.

Note that as the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is ensured. In that case, a structure is preferable in which the tantalum nitride layer having a barrier property against hydrogen is in contact with the insulator 350 having a barrier property against hydrogen.

FIG. 11(A) shows an example in which four wiring layers each including the conductor 356 are stacked; however, the memory device of this embodiment is not limited thereto. Three or less, or five or more wiring layers each including the conductor 356 may be provided.

The insulator 210, the insulator 212, the insulator 214, and the insulator 216 are stacked sequentially over the insulator 354. A substance having a barrier property against oxygen or hydrogen is preferably used for any of the insulator 210, the insulator 212, the insulator 214, and the insulator 216.

A conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the capacitor 100 and the transistor 300. The conductor 218 can be provided using a material similar to those of the conductor 328 and the conductor 330.

In particular, the conductor 218 in a region in contact with the insulator 210 and the insulator 214 is preferably a conductor having a barrier property against oxygen, hydrogen, and water. In such a structure, the transistor 300 and the transistor 200 can be separated by a layer having a barrier property against oxygen, hydrogen, and water; thus, the diffusion of hydrogen from the transistor 300 to the transistor 200 can be prevented.

The transistor 200 is provided above the insulator 216. Note that the structure of the transistor included in the semiconductor device described in the above embodiment can be used as the structure of the transistor 200. The transistor 200 shown in FIG. 11(A) is an example and the structure is not limited thereto; a transistor appropriate for a circuit configuration or a driving method is used. For example, the transistor 200A shown in FIG. 2, the transistor 200B shown in FIG. 3, the transistor 200C shown in FIG. 4, or the like can be used.

The insulator 280, the insulator 282, and the insulator 281 are provided over the transistor 200.

The conductor 240 and the like are embedded in the insulator 220, the insulator 222, the insulator 224, the insulator 280, the insulator 282, and the insulator 281.

The conductor 240 functions as a plug or a wiring that is electrically connected to the capacitor 100, the transistor 200, or the transistor 300. The conductor 240 can be provided using a material similar to that of the conductor 328 or the conductor 330.

In addition, the capacitor 100 is provided above the transistor 200. The capacitor 100 includes a conductor 110, a conductor 120, and an insulator 130.

The conductor 110 has a function of one electrode of the capacitor 100.

The conductor 110 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 110 has a single-layer structure in FIG. 11(A); however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

The conductor 120 functioning as the other electrode of the capacitor 100 is provided to overlap with the conductor 110 with the insulator 130 positioned therebetween. Note that the conductor 120 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material can be used.

An insulator 150 is provided over the conductor 120 and the insulator 130. The insulator 150 can be provided using a material similar to that of the insulator 320. The insulator 150 may function as a planarization film that covers an uneven shape thereunder.

A conductor 112 electrically connected to the conductor 240 is embedded in the insulator 150 and the insulator 130. A conductor 160 may be provided over the conductor 112 and the insulator 150.

With the use of the structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with reduced power consumption can be provided. Alternatively, a semiconductor device using a transistor including an oxide semiconductor can be miniaturized or highly integrated.

The structure, composition, method, and the like described above in this embodiment can be used in appropriate combination with the structures, compositions, methods, and the like described in the other embodiments and examples.

Embodiment 3

In this embodiment, one embodiment of a semiconductor device that functions as a memory device and is different from one in the above embodiment is described with reference to FIG. 12 and FIG. 13. FIG. 12 and FIG. 13 show a memory device of one embodiment of the present invention that includes a transistor using an oxide as a semiconductor (hereinafter, referred to as an OS transistor in some cases) and a capacitor (hereinafter, such a memory device is also referred to as an OS memory device in some cases). The OS memory device includes at least a capacitor and an OS transistor that controls charging and discharging of the capacitor. Since the OS transistor has an extremely low off-state current, the OS memory device has excellent retention characteristics and thus can function as a nonvolatile memory.

<Structure Example of Memory Device 2>

Figure 12A:
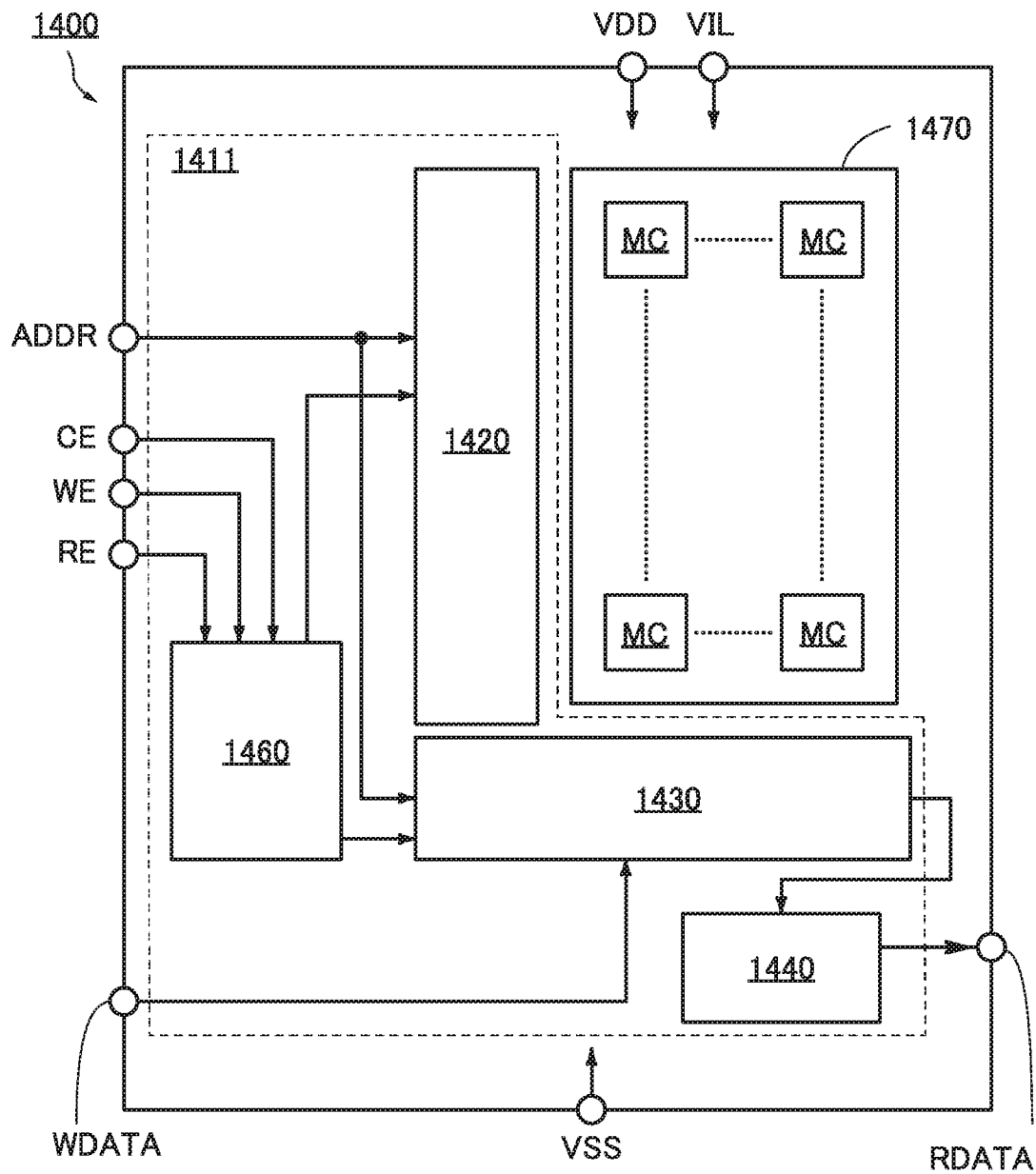
FIGS. 12A-12B A block diagram showing a structure example of a memory device of one embodiment of the present invention.

FIG. 12(A) shows a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, and a write circuit. The precharge circuit has a function of precharging wirings. The sense amplifier has a function of amplifying a data signal read from a memory cell. Note that the wirings are connected to memory cells included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of wirings that connect the memory cell array 1470 to the row circuit 1420 depends on the structure of the memory cell MC, the number of memory cells MC in one column, and the like. The number of wirings that connect the memory cell array 1470 to the column circuit 1430 depends on the structure of the memory cell MC, the number of memory cells MC in one row, and the like.

Figure 12B:
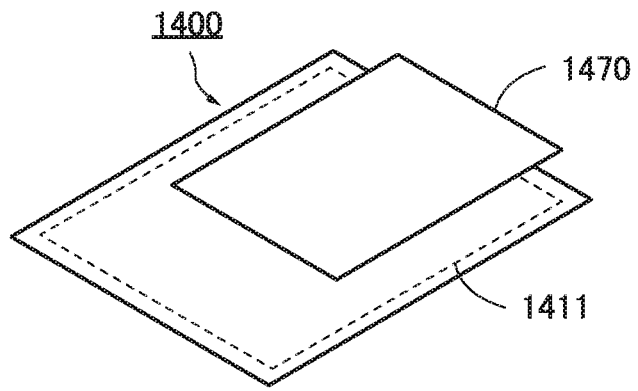

Note that FIG. 12(A) shows an example in which the peripheral circuit 1411 and the memory cell array 1470 are formed on the same plane; however, this embodiment is not limited thereto. For example, as shown in FIG. 12(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 13 shows configuration examples of memory cells that can be used as the memory cells MC.

[DOSRAM]

Figure 13A:
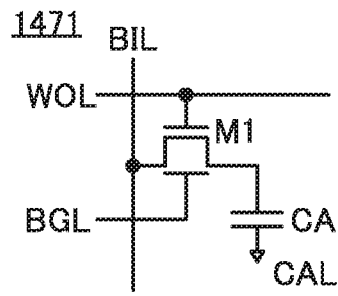
FIGS. 13A-13H Circuit diagrams showing configuration examples of a memory device of one embodiment of the present invention.
Figure 13B:
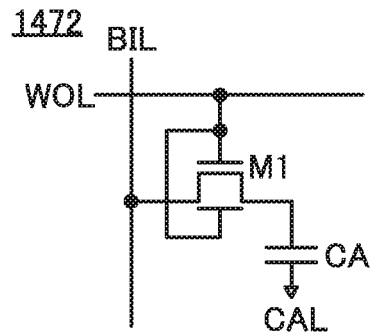
Figure 13C:
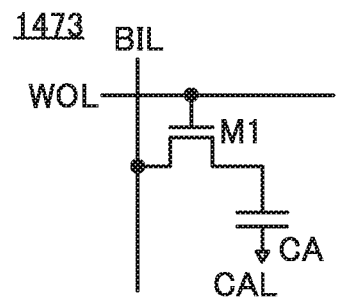
Figure 13D:
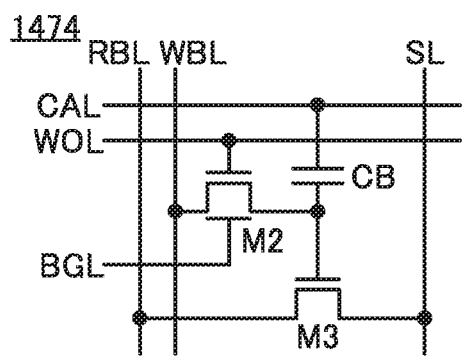
Figure 13E:
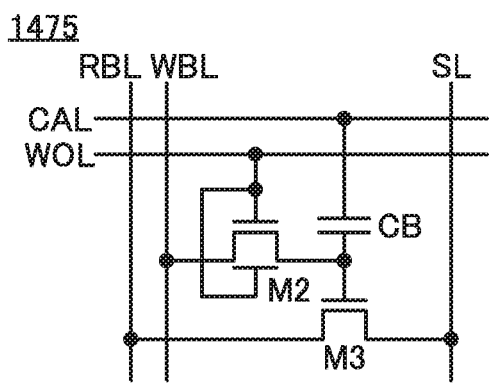
Figure 13F:
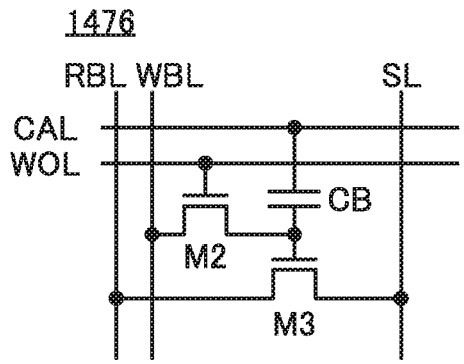
Figure 13G:
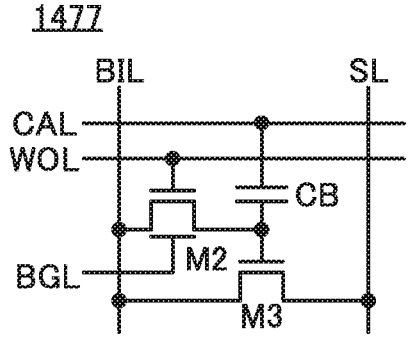

FIG. 13(A) to FIG. 13(C) show circuit configuration examples of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 shown in FIG. 13(A) includes a transistor M1 and a capacitor CA. Note that the transistor M1 includes a gate (also referred to as a front gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. By application of a given potential to the wiring BGL, the threshold voltage of the transistor M1 can be increased or decreased.

The memory cell MC is not limited to the memory cell 1471, and its circuit configuration can be changed. For example, as in a memory cell 1472 shown in FIG. 13(B), the back gate of the transistor M1 may be connected to the wiring WOL instead of the wiring BGL in the memory cell MC. Alternatively, for example, the memory cell MC may be a memory cell including a single-gate transistor, that is, the transistor M1 without a back gate, as in a memory cell 1473 shown in FIG. 13(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time; thus, the frequency of the refresh of the memory cell can be decreased. In addition, refresh operation of the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIG. 13(D) to FIG. 13(H) each show a circuit configuration example of a gain-cell memory cell including two transistors and one capacitor. A memory cell 1474 shown in FIG. 13(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, a gate of the transistor M2 is connected to the wiring WOL, and a back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and its circuit configuration can be changed as appropriate. For example, as in a memory cell 1475 shown in FIG. 13(E), the back gate of the transistor M2 may be connected to the wiring WOL instead of the wiring BGL in the memory cell MC. Alternatively, for example, the memory cell MC may be a memory cell including a single-gate transistor, that is, the transistor M2 without a back gate, as in a memory cell 1476 shown in FIG. 13(F). Alternatively, for example, in the memory cell MC, the wiring WBL and the wiring RBL may be combined into one wiring BIL, as in a memory cell 1477 shown in FIG. 13(G).

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Thus, with the use of the transistor M2, written data can be retained for a long time; thus, the frequency of the refresh of the memory cell can be decreased. In addition, refresh operation of the memory cell can be omitted. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistors M2 and M3, the circuit of the memory cell array 1470 can be formed using only n-channel transistors.

Figure 13H:
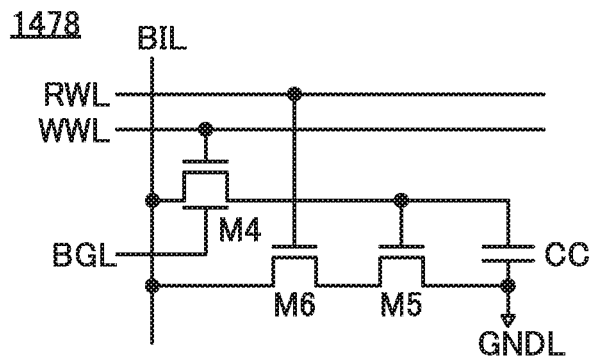

FIG. 13(H) shows an example of a gain-cell memory cell including three transistors and one capacitor. A memory cell 1478 shown in FIG. 13(H) includes transistors M4 to M6 and a capacitor CC. The capacitor CC is provided as appropriate. The memory cell 1478 is electrically connected to wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate, and the back gate is electrically connected to the wiring BGL. Note that the back gate and the gate of the transistor M4 may be electrically connected to each other. Alternatively, the back gate is not necessarily provided in the transistor M4.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the configurations of the peripheral circuit 1411, the memory cell array 1470, and the like described in this embodiment are not limited to the above. The positions and functions of these circuits, wirings connected to the circuits, circuit elements, and the like can be changed, deleted, or added as needed.

The structure described in this embodiment can be used in appropriate combination with the structures described in the other embodiments and examples.

Embodiment 4

In this embodiment, an example of a chip 1200 on which the semiconductor device of the present invention is mounted will be described with reference to FIG. 14. A plurality of circuits (systems) are mounted on the chip 1200. The technique for integrating a plurality of circuits (systems) on one chip is referred to as system on chip (SoC) in some cases.

Figure 14A:
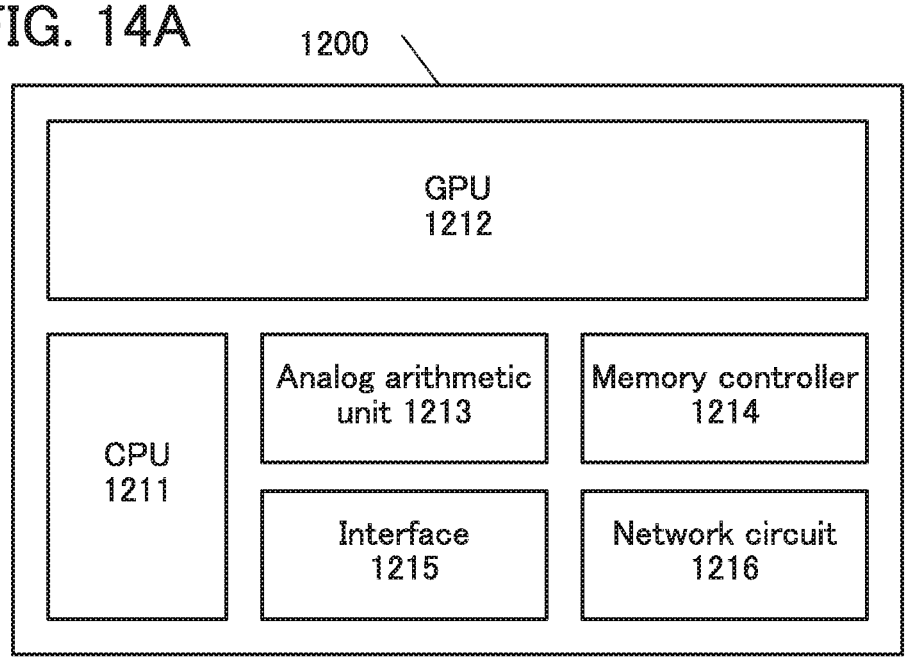
FIGS. 14A-14B Diagrams showing a semiconductor device of one embodiment of the present invention.

As shown in FIG. 14(A), the chip 1200 includes a CPU (Central Processing Unit) 1211, a GPU (Graphics Processing Unit) 1212, one or more analog arithmetic units 1213, one or more memory controllers 1214, one or more interfaces 1215, one or more network circuits 1216, and the like.

Figure 14B:
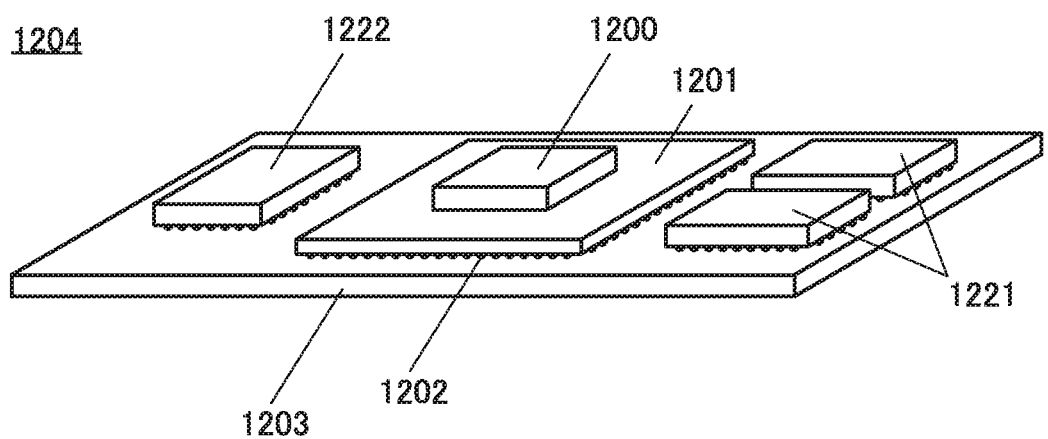

A bump (not illustrated) is provided on the chip 1200, and as shown in FIG. 14(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a large amount of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit to be connected to an external device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network) and may also include a circuit for network security.

The circuits (systems) can be formed in the chip 1200 in the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can implement the arithmetic operation in a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

This embodiment can be implemented in appropriate combination with any of the structures described in the other embodiments, examples, and the like.

Embodiment 5

In this embodiment, application examples of the memory device using the semiconductor device described in the above embodiment will be described. The semiconductor device described in the above embodiment can be used for, for example, memory devices of a variety of electronic devices (e.g., information terminals, computers, smart-phones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is used for a variety of removable memory devices such as memory cards (e.g., SD cards), USB memories, and SSDs (solid state drives). FIG. 15 schematically shows some structure examples of removable memory devices. The semiconductor device described in the above embodiment is processed into a packaged memory chip and used in a variety of storage devices and removable memories, for example.

FIG. 15(A) is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

FIG. 15(B) is an external schematic view of an SD card, and FIG. 15(C) is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on a rear surface side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between a host device and the SD card 1110. The semiconductor device described in the above embodiment can be incorporated in the memory chip 1114 or the like on the substrate 1113.

FIG. 15(D) is an external schematic view of an SSD, and FIG. 15(E) is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on a rear surface side of the substrate 1153, the capacity of the SSD 1150 can be increased. The semiconductor device described in the above embodiment can be incorporated in the memory chip 1154 or the like on the substrate 1153.

This embodiment can be implemented in appropriate combination with any of the structures described in the other embodiments, examples, and the like.

Embodiment 6

The semiconductor device of one embodiment of the present invention can be used for processors such as CPUs and GPUs or chips. FIG. 16 shows specific examples of electronic devices including a processor such as a CPU or a GPU or a chip of one embodiment of the present invention.
<Electronic Device and System>

The GPU or the chip of one embodiment of the present invention can be incorporated into a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radioactive rays, flow rate, humidity, gradient, oscillation, smell, or infrared rays).

The electronic device of one embodiment of the present invention can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium. FIG. 16 shows examples of electronic devices.

[Mobile Phone]

FIG. 16(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal 1]

FIG. 16(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, a smartphone and a desktop information terminal are illustrated as examples of the electronic devices in FIGS. 16(A) and 16(B); alternatively, an information terminal other than a smartphone and a desktop information terminal can be used. Examples of an information terminal other than a smartphone and a desktop information terminal include a PDA (Personal Digital Assistant), a laptop information terminal, and a workstation.

[Household Appliance]

FIG. 16(C) shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of automatically adjusting the temperature to be appropriate for the foods stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 16(D) shows a portable game machine 5200 as an example of a game machine. The portable game machine includes a housing 5201, a display portion 5202, a button 5203, and the like.

With the use of the GPU or the chip of one embodiment of the present invention in the portable game machine 5200, the portable game machine 5200 with low power consumption can be obtained. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, the progress of a game, the actions and words of game characters, and expressions of a phenomenon and the like in the game are programed in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 16(D), the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 16(E1) shows an automobile 5700 as an example of a moving vehicle, and FIG. 16(E2) is a diagram showing the periphery of a windshield inside the automobile. FIG. 16(E1) illustrates a display panel 5701, a display panel 5702, and a display panel 5703 that are attached to a dashboard and a display panel 5704 that is attached to a pillar.

The display panel 5701 to the display panel 5703 can provide various kinds of information such as a speedometer, a tachometer, a mileage, a fuel meter, a gearshift indicator, and air-condition setting. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area which a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

Although an automobile is described above as an example of a moving vehicle, a moving vehicle is not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 16(F) schematically shows data transmission in a broadcasting system. Specifically, FIG. 16(F) shows a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 16(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 16(F) and may be satellite broadcasting using an artificial satellite, data broadcasting using an optical line, or the like.

The above-described broadcasting system may utilize artificial intelligence by using the chip of one embodiment of the present invention. When the broadcast data is transmitted from the broadcast station 5680 to the TV 5600 of each household, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for example, can also be performed. For another example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, application examples of artificial intelligence, its effects, and the like described in this embodiment can be combined as appropriate with the description of another electronic device.

This embodiment can be implemented in appropriate combination with any of the structures described in the other embodiments, examples, and the like.

Example 1

<Evaluation 1 of Id-Vg Characteristics by Calculation with Device Simulator>

The electrical characteristics of a transistor in the case where a negative fixed charge exists in a metal oxide were evaluated below.

Figure 17A:
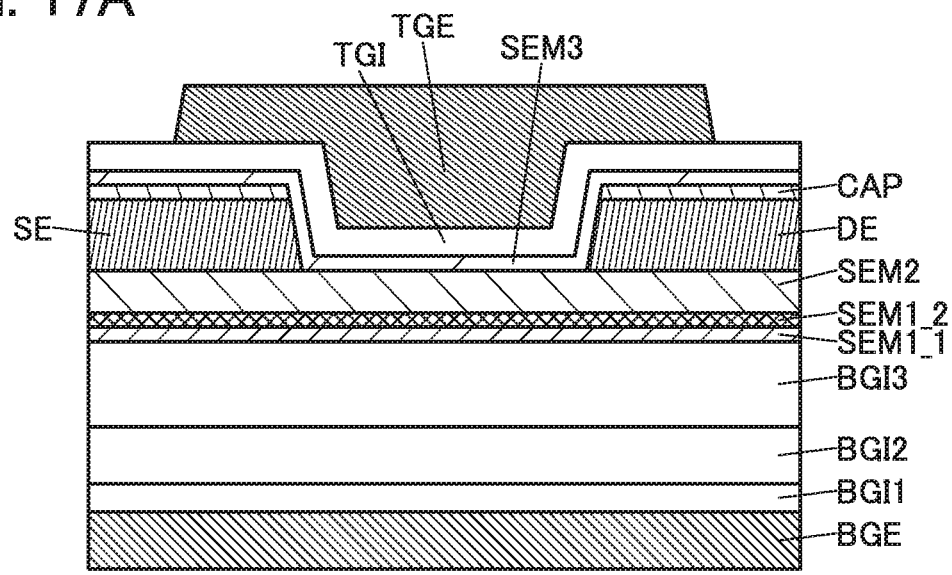
FIGS. 17A-17B Cross-sectional views of semiconductor devices of Example of the present invention.
Figure 17B:
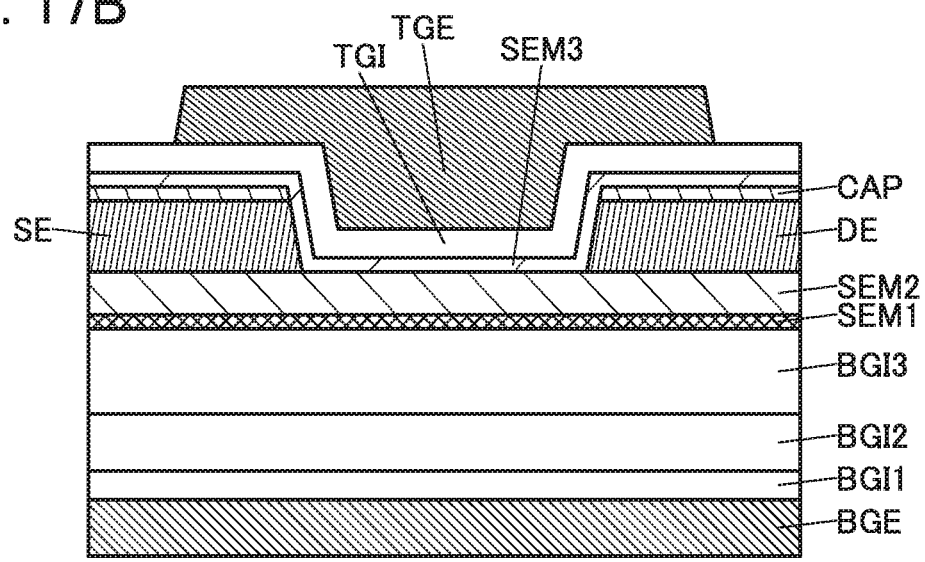

FIG. 17 shows cross-sectional views of transistor structures assumed in calculation with a device simulator. In FIG. 17, a conductor BGE is a back gate electrode and corresponds to the conductor 205 of the transistor 200 shown in FIG. 1. An insulator BGI1, an insulator BGI2, and an insulator BGI3 are back gate insulating films and correspond to the insulator 220, the insulator 222, and the insulator 224, respectively, of the transistor 200 shown in FIG. 1. In FIG. 17(A), a semiconductor SEM1_1, a semiconductor SEM1_2, a semiconductor SEM2, and a semiconductor SEM3 are active layers and correspond to the oxide 230a1, the oxide 230a2, the oxide 230b, and the oxide 230c, respectively, of the transistor 200 shown in FIG. 1. FIG. 17(B) shows the case where a semiconductor SEM1, the semiconductor SEM2, and the semiconductor SEM3 are active layers and the semiconductor SEM1_1 in FIG. 17(A) is not provided. In other words, FIG. 17(B) corresponds to the case where the oxide 230a of the transistor 200 shown in FIG. 1 is a single layer. A conductor SE is a source electrode and corresponds to one of the conductor 242a and the conductor 242b of the transistor 200 shown in FIG. 1. A conductor DE is a drain electrode and corresponds to the other of the conductor 242a and the conductor 242b of the transistor 200 shown in FIG. 1. An insulator CAP is a barrier film and corresponds to the insulator 273 of the transistor 200 shown in FIG. 1. An insulator TGI is a top gate insulating film and corresponds to the insulator 250 of the transistor 200 shown in FIG. 1. A conductor TGE is a top gate electrode and corresponds to the conductor 260 of the transistor 200 shown in FIG. 1.

The Id-Vg characteristics were calculated with a device simulator on the assumption of the transistor structures shown in FIG. 17. A device simulator Atlas produced by Silvaco, Inc. was used as the device simulator. Table 1 and Table 2 show values of parameters assumed in the calculation with the device simulator for the transistors shown in FIG. 17(A) and FIG. 17(B).

TABLE 1

| Structure | | | | |
|---|---|---|---|---|
| | Channel length L | | 100 | nm |
| | Channel width W | | 100 | nm |
| SEM1_1 | IGZO(134) | Electron affinity | 4.5 | eV |
| SEM1_2 | | Band gap | 3.4 | eV |
| | | Electron mobility | 0.1 | cm²/V-s |
| | | Hole mobility | 0.01 | cm²/V-s |
| | | Thickness (SEM1_1) | 5 | nm |
| | | Thickness (SEM1_2) | 5 | nm |
| SEM2 | IGZO(423) | Electron affinity | 4.8 | eV |
| SEM3 | | Band gap | 2.9 | eV |
| | | Electron mobility | 20 | cm²/V-s |
| | | Hole mobility | 0.01 | cm²/V-s |
| | | Thickness (SEM2) | 15 | nm |
| | | Thickness (SEM3) | 5 | nm |
| SEM | | Dielectric constant | 15 | |
| | | Effective density of states Nc of conduction band | $5 \times 10^{18}$ | cm⁻³ |
| | | Effective density of states Nv of valence band | $5 \times 10^{18}$ | cm⁻³ |
| TGE | | Work function | 5.0 | eV |
| | | Thickness | 50 | nm |
| TGI | | Dielectric constant | 4.1 | |
| | | Thickness | 10 | nm |
| CAP | | Dielectric constant | 8.3 | |
| | | Thickness | 5 | nm |
| SE, DE | | Work function | 4.8 | eV |
| | | Thickness | 25 | nm |
| BGI3 | | Dielectric constant | 4.1 | |
| | | Thickness | 30 | nm |
| BGI2 | | Dielectric constant | 16.4 | |
| | | Thickness | 20 | nm |
| BGI1 | | Dielectric constant | 4.1 | |
| | | Thickness | 10 | nm |
| BGE | | Work function | 5.0 | eV |
| | | Thickness | 20 | nm |

TABLE 2

| Structure | | | | |
|---|---|---|---|---|
| | Channel length L | | 100 | nm |
| | Channel width W | | 100 | nm |
| SEM1 | IGZO(134) | Electron affinity | 4.5 | eV |
| | | Band gap | 3.4 | eV |
| | | Electron mobility | 0.1 | cm²/V-s |
| | | Hole mobility | 0.01 | cm²/V-s |
| | | Thickness | 5 | nm |
| SEM2 | IGZO(423) | Electron affinity | 4.8 | eV |
| SEM3 | | Band gap | 2.9 | eV |
| | | Electron mobility | 20 | cm²/V-s |
| | | Hole mobility | 0.01 | cm²/V-s |
| | | Thickness (SEM2) | 15 | nm |
| | | Thickness (SEM3) | 5 | nm |
| SEM | | Dielectric constant | 15 | |
| | | Effective density of states Nc of conduction band | $5 \times 10^{18}$ | cm⁻³ |
| | | Effective density of states Nv of valence band | $5 \times 10^{18}$ | cm⁻³ |
| TGE | | Work function | 5.0 | eV |
| | | Thickness | 50 | nm |
| TGI | | Dielectric constant | 4.1 | |
| | | Thickness | 10 | nm |
| CAP | | Dielectric constant | 8.3 | |
| | | Thickness | 5 | nm |
| SE, DE | | Work function | 4.8 | eV |
| | | Thickness | 25 | nm |
| BGI3 | | Dielectric constant | 4.1 | |
| | | Thickness | 30 | nm |
| BGI2 | | Dielectric constant | 16.4 | |
| | | Thickness | 20 | nm |
| BGI1 | | Dielectric constant | 4.1 | |
| | | Thickness | 10 | nm |
| BGE | | Work function | 5.0 | eV |
| | | Thickness | 20 | nm |

IGZO(134) shown in Table 1 and Table 2 is assumed to be an In—Ga—Zn oxide with a composition of In:Ga:Zn=1:3:4. IGZO(423) shown in Table 1 and Table 2 is assumed to be an In—Ga—Zn oxide with a composition of In:Ga:Zn=4:2:3. The parameters of SEM shown in Table 1 are common parameters to the semiconductor SEM1_1, the semiconductor SEM1_2, the semiconductor SEM2, and the semiconductor SEM3. The parameters of SEM shown in Table 2 are common parameters to the semiconductor SEM1, the semiconductor SEM2, and the semiconductor SEM3.

The calculation was performed with varying negative fixed charge densities in the semiconductor SEM1_2. Table 3 shows the negative fixed charge densities in the semiconductor SEM1_2 assumed in this calculation. Here, eight conditions (condition 1 to condition 8) were assumed. Note that in this calculation, the negative fixed charge densities were set to be uniformly distributed in the semiconductor SEM1_2.

TABLE 3

| | Negative fixed charge density (cm⁻³) in semiconductor SEM1_2 |
|---|---|
| Condition 1 | 0 |
| Condition 2 | $3.5 \times 10^{17}$ |
| Condition 3 | $5.3 \times 10^{17}$ |
| Condition 4 | $8.9 \times 10^{17}$ |
| Condition 5 | $1.8 \times 10^{18}$ |
| Condition 6 | $3.5 \times 10^{18}$ |
| Condition 7 | $5.3 \times 10^{18}$ |
| Condition 8 | $7.1 \times 10^{18}$ |

Figure 18A:
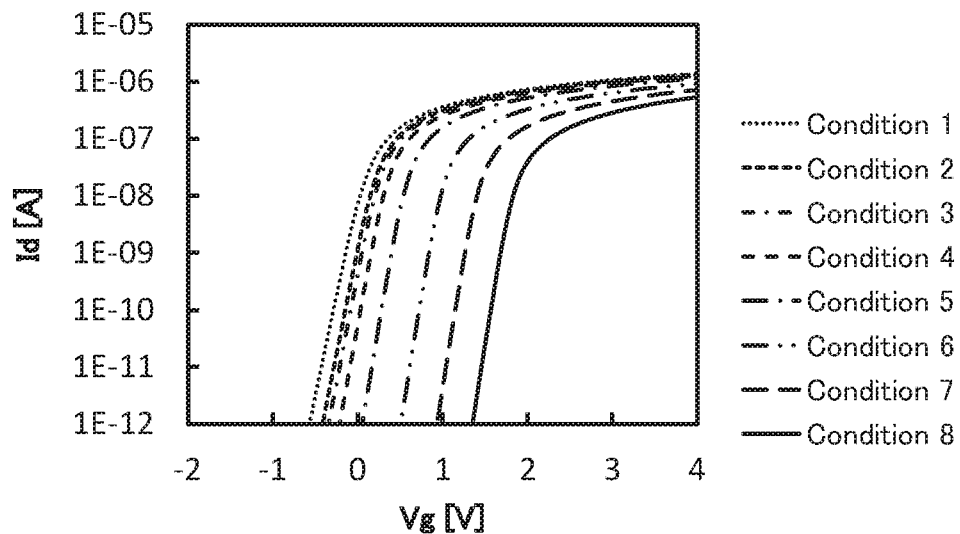
FIGS. 18A-18B Diagrams showing calculation results of Example of the present invention.

FIG. 18(A) shows the Id-Vg characteristics of the transistor shown in FIG. 17(A) at a drain voltage Vd of 0.1 V and a back gate voltage Vbg of 0 V and with varying negative fixed charge densities in the semiconductor SEM1_2. Legends in FIG. 18(A) show the Id-Vg characteristics calculated under the condition 1 to the condition 8 shown in Table 3.

FIG. 18(A) reveals that the negative fixed charge existing in the semiconductor SEM1_2 shifts the Id-Vg characteristics in the positive direction. The Id-Vg characteristics further shift in the positive direction with an increase in the negative fixed charge density in the semiconductor SEM1_2.

Next, the calculation was performed with varying negative fixed charge densities in the semiconductor SEM1 of the transistor shown in FIG. 17(B). Table 4 shows the negative fixed charge densities in the semiconductor SEM1 assumed in this calculation. Here, the eight conditions (condition 1 to condition 8) were assumed. Note that in this calculation, the negative fixed charge densities were set to be uniformly distributed in the semiconductor SEM1.

TABLE 4

| | Negative fixed charge density ($cm^{-3}$) in semiconductor SEM1 |
|---|---|
| Condition 1 | 0 |
| Condition 2 | $3.5 \times 10^{17}$ |
| Condition 3 | $5.3 \times 10^{17}$ |
| Condition 4 | $8.9 \times 10^{17}$ |
| Condition 5 | $1.8 \times 10^{18}$ |
| Condition 6 | $3.5 \times 10^{18}$ |
| Condition 7 | $5.3 \times 10^{18}$ |
| Condition 8 | $7.1 \times 10^{18}$ |

Figure 18B:
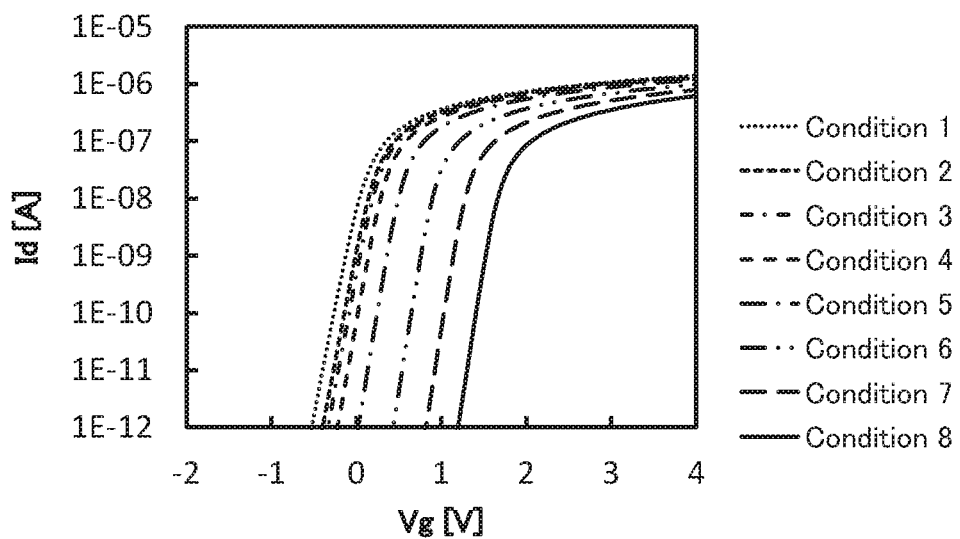

FIG. 18(B) shows the Id-Vg characteristics at a drain voltage Vd of 0.1 V and a back gate voltage Vbg of 0 V and with varying negative fixed charge densities in the semiconductor SEM1. Legends in FIG. 18(B) show the Id-Vg characteristics calculated under the condition 1 to the condition 8 shown in Table 4.

FIG. 18(B) reveals that the negative fixed charge existing in the semiconductor SEM1 shifts the Id-Vg characteristics in the positive direction. The Id-Vg characteristics further shift in the positive direction with an increase in the negative fixed charge density in the semiconductor SEM1.

Example 2

<Evaluation 2 of Id-Vg Characteristics by Calculation with Device Simulator>

The electrical characteristics of a transistor, which is different from that in Example 1, in the case where a negative fixed charge exists in a metal oxide were evaluated below.

Figure 19:
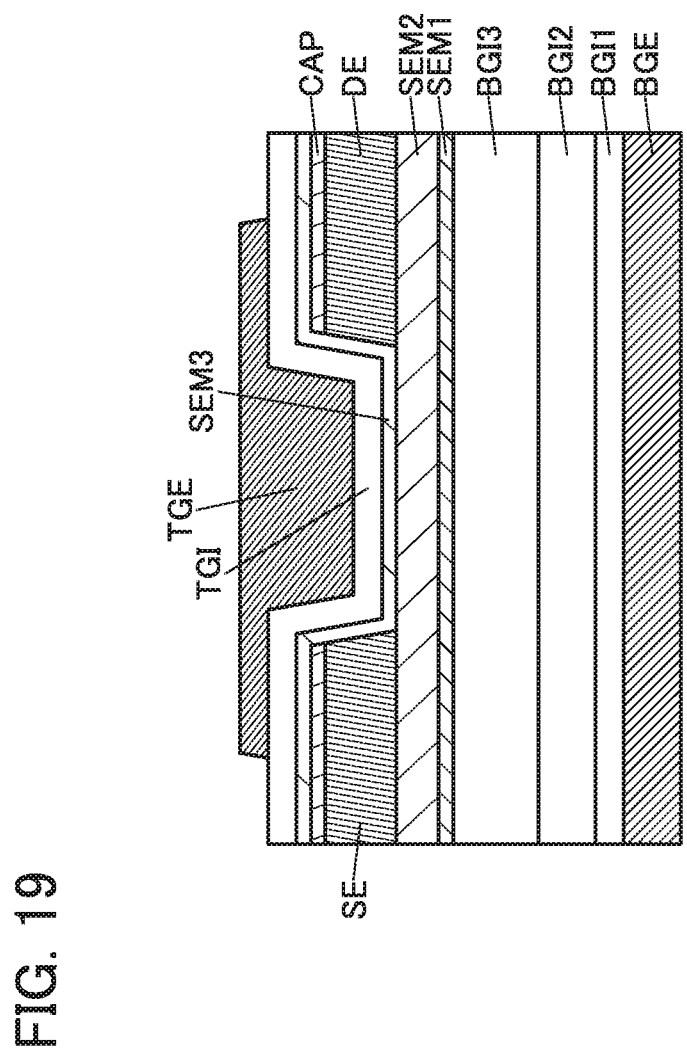
FIG. 19 A cross-sectional view of a semiconductor device of Example of the present invention.

FIG. 19 shows a cross-sectional view of a transistor structure assumed in calculation with a device simulator. In FIG. 19, the conductor BGE is the back gate electrode and corresponds to the conductor 205 of the transistor 200 shown in FIG. 1. The insulator BGI1, the insulator BGI2, and the insulator BGI3 are the back gate insulating films and correspond to the insulator 220, the insulator 222, and the insulator 224, respectively, of the transistor 200 shown in FIG. 1. The semiconductor SEM1, the semiconductor SEM2, and the semiconductor SEM3 are the active layers and correspond to the oxide 230a, the oxide 230b, and the oxide 230c, respectively, of the transistor 200 shown in FIG. 1. The conductor SE is the source electrode and corresponds to one of the conductor 242a and the conductor 242b of the transistor 200 shown in FIG. 1. The conductor DE is the drain electrode and corresponds to the other of the conductor 242a and the conductor 242b of the transistor 200 shown in FIG. 1. The insulator CAP is the barrier film and corresponds to the insulator 273 of the transistor 200 shown in FIG. 1. The insulator TGI is the top gate insulating film and corresponds to the insulator 250 of the transistor 200 shown in FIG. 1. The conductor TGE is the top gate electrode and corresponds to the conductor 260 of the transistor 200 shown in FIG. 1.

The Id-Vg characteristics were calculated with a device simulator on the assumption of the transistor structure shown in FIG. 19. The device simulator Atlas produced by Silvaco, Inc. was used as the device simulator. Table 5 shows values of parameters assumed in the calculation with the device simulator.

TABLE 5

| Structure | | Channel length L | 100 nm |
|---|---|---|---|
| | | Channel width W | 100 nm |
| SEM1 | IGZO(134) | Electron affinity | 4.5 eV |
| | | Band gap | 3.4 eV |
| | | Electron mobility | 0.1 $cm^2$/V-s |
| | | Hole mobility | 0.01 $cm^2$/V-s |
| | | Thickness | 5 nm |
| SEM2 | IGZO(423) | Electron affinity | 4.8 eV |
| SEM3 | | Band gap | 2.9 eV |
| | | Electron mobility | 20 $cm^2$/V-s |
| | | Hole mobility | 0.01 $cm^2$/V-s |
| | | Thickness (SEM2) | 15 nm |
| | | Thickness (SEM3) | 5 nm |
| SEM | | Dielectric constant | 15 |
| | | Effective density of states Nc of conduction band | $5 \times 10^{18}$ $cm^{-3}$ |
| | | Effective density of states Nv of valence band | $5 \times 10^{18}$ $cm^{-3}$ |
| TGE | | Work function | 5.0 eV |
| | | Thickness | 40 nm |
| TGI | | Dielectric constant | 4.1 |
| | | Thickness | 10 nm |
| CAP | | Dielectric constant | 8.3 |
| | | Thickness | 5 nm |
| SE, DE | | Work function | 4.8 eV |
| | | Thickness | 25 nm |
| BGI3 | | Dielectric constant | 4.1 |
| | | Thickness | 30 nm |
| BGI2 | | Dielectric constant | 16.4 |
| | | Thickness | 20 nm |
| BGI1 | | Dielectric constant | 4.1 |
| | | Thickness | 10 nm |
| BGE | | Work function | 5.0 eV |
| | | Thickness | 20 nm |

IGZO(134) shown in Table 5 is assumed to be an In—Ga—Zn oxide with a composition of In:Ga:Zn=1:3:4. IGZO (423) shown in Table 5 is assumed to be an In—Ga—Zn oxide with a composition of In:Ga:Zn=4:2:3. The parameters of SEM shown in Table 5 are common parameters to the semiconductor SEM1, the semiconductor SEM2, and the semiconductor SEM3.

The calculation was performed with varying negative fixed charge densities in the semiconductor SEM2 and the semiconductor SEM3. Table 6 shows the negative fixed charge densities in the semiconductor SEM2 and the semiconductor SEM3 assumed in this calculation. Here, eight conditions (condition 1 to condition 8) were assumed. Note that in this calculation, the negative fixed charge densities were set to be uniformly distributed in the semiconductor SEM2 and the semiconductor SEM3.

TABLE 6

| | Negative fixed charge density ($cm^{-3}$) in semiconductor SEM2 and semiconductor SEM3 |
|---|---|
| Condition 1 | 0 |
| Condition 2 | $1.8 \times 10^{16}$ |
| Condition 3 | $1.8 \times 10^{17}$ |
| Condition 4 | $3.5 \times 10^{17}$ |
| Condition 5 | $7.1 \times 10^{17}$ |
| Condition 6 | $1.1 \times 10^{18}$ |
| Condition 7 | $1.4 \times 10^{18}$ |
| Condition 8 | $1.8 \times 10^{18}$ |

Figure 20:
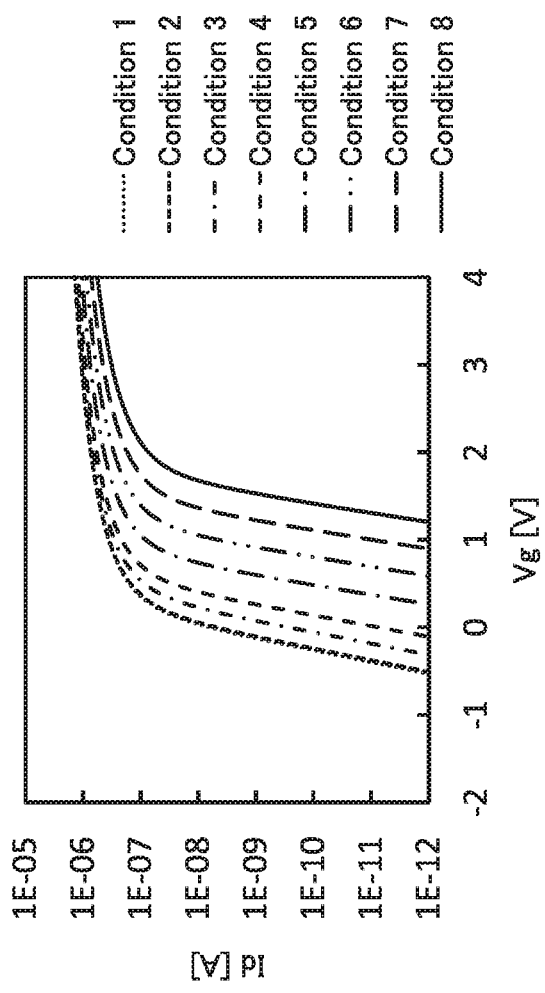
FIG. 20 A diagram showing calculation results of Example of the present invention.

FIG. 20 shows the Id-Vg characteristics at a drain voltage Vd of 0.1 V and a back gate voltage Vbg of 0 V and with varying negative fixed charge densities in the semiconductor SEM2 and the semiconductor SEM3. Legends in FIG. 20 show the Id-Vg characteristics calculated under the condition 1 to the condition 8 shown in Table 6.

FIG. 20 reveals that the negative fixed charges existing in the semiconductor SEM2 and the semiconductor SEM3 shift the Id-Vg characteristics in the positive direction. The Id-Vg characteristics further shift in the positive direction with increases in the negative fixed charge densities in the semiconductor SEM2 and the semiconductor SEM3.

REFERENCE NUMERALS 200, 200A, 200B, and 200C: transistor; 203, 205, 205a, 205b, 218, 240, 240a, 240b, 240c, 242, 242-1, 242-2, 242a, 242b, 256, 260, 260a, and 260b: conductor; 242A, 260A, and 260B: conductive film; 210, 212, 214, 216, 220, 222, 224, 250, 273, 273a, 273b, 274, 276, 280, 281, and 282: insulator; 250A, 273A, and 274A: insulating film; 230, 230a, 230a1, 230a2, 230b, 230c, 230d, and 230e: oxide; 230A, 230A1, 230A2, 230B, and 230C: oxide film; 234, 243, 243a, and 243b: region

The invention claimed is:
1. A semiconductor device comprising:
a first insulator;
a first oxide over the first insulator;
a second oxide over the first oxide;
a first conductor and a second conductor apart from each other over the second oxide;
a third oxide over the second oxide, the first conductor, and the second conductor;
a second insulating film over the third oxide; and
a third conductor over the second oxide with the third oxide and the second insulating film positioned therebetween,
wherein the first oxide comprises a first layer and a second layer,
wherein the second layer comprises a metal element and nitrogen, and
wherein the metal element is bonded to nitrogen.
2. The semiconductor device according to claim 1, wherein the second layer is a layer holding a fixed charge.
3. The semiconductor device according to claim 1, wherein a percentage of the number of nitrogen atoms in the second layer is lower than 0.1 atomic %.
4. The semiconductor device according to claim 1, wherein the first layer has a higher oxygen concentration than the second layer, and
wherein the second layer has a higher nitrogen concentration than the first layer.
5. The semiconductor device according to claim 3, wherein the percentage of the number of the nitrogen atoms in the second layer is higher than or equal to 0.02 atomic %.
6. The semiconductor device according to claim 1, wherein the first oxide, the second oxide, and the third oxide comprise In, an element M, and Zn, and
wherein the element M comprises any one of Al, Ga, Y, and Sn.
7. The semiconductor device according to claim 1, wherein the metal element is one selected from In, an element M, and Zn, and
wherein the element M comprises any one of Al, Ga, Y, and Sn.

* * * * *